US010747010B2

(12) United States Patent
Cappelli et al.

(10) Patent No.: US 10,747,010 B2
(45) Date of Patent: Aug. 18, 2020

(54) BEAM SPLITTING PRISM SYSTEMS

(71) Applicant: ASML Holding N.V., Veldhoven (NL)

(72) Inventors: Douglas C. Cappelli, Norwalk, CT (US); Stanislav Smirnov, Danbury, CT (US); Richard Carl Zimmerman, Brookfield, CT (US); Joshua Adams, Wilton, CT (US); Alexander Kenneth Raub, Danbury, CT (US); Yevgeniy Konstantinovich Shmarev, Lagrangeville, NY (US)

(73) Assignee: ASML Holding N.V., Veldhoven (NL)

( * ) Notice: Subject to any disclaimer, the term of this patent is extended or adjusted under 35 U.S.C. 154(b) by 0 days.

(21) Appl. No.: 16/217,424

(22) Filed: Dec. 12, 2018

(65) Prior Publication Data

US 2019/0179162 A1     Jun. 13, 2019

Related U.S. Application Data

(60) Provisional application No. 62/597,971, filed on Dec. 13, 2017.

(51) Int. Cl.
*G01N 21/956* (2006.01)
*G03F 7/20* (2006.01)
(Continued)

(52) U.S. Cl.
CPC ....... *G02B 27/285* (2013.01); *G01N 21/4738* (2013.01); *G01N 21/956* (2013.01);
(Continued)

(58) Field of Classification Search
CPC ............. G03F 7/70608; G03F 7/70641; G03F 7/70316; G03F 7/7085
(Continued)

(56) References Cited

U.S. PATENT DOCUMENTS 4,787,747 A    11/1988  Sommargren et al.
4,905,311 A *   2/1990  Hino ................... G01B 11/306
                                                    250/225

(Continued)

FOREIGN PATENT DOCUMENTS

EP    0 256 685 A2    2/1988
EP    1 022 590 A1    7/2000
(Continued)

OTHER PUBLICATIONS

International Search Report and Written Opinion of the International Searching Authority directed to related International Patent Application No. PCT/EP2018/083393, dated Mar. 1, 2019; 12 pages.

*Primary Examiner* — Hung Nguyen
(74) *Attorney, Agent, or Firm* — Sterne, Kessler, Goldstein & Fox P.L.L.C.

(57) ABSTRACT

According to one embodiment, a prism system is provided. The prism system includes a polarizing beam splitter (PBS) surface. The PBS surface is configured to generate first and second sub-beams having corresponding first and second polarization information from a received beam, the second polarization information being different than the first polarization information. A first optical path of the first sub-beam within the prism system has substantially same length as a second optical path of the second sub-beam within the prism system. Additionally or alternatively, the first sub-beam achieves a predetermined polarization extinction ratio.

16 Claims, 37 Drawing Sheets

(51) Int. Cl.
*G02B 27/28* (2006.01)
*G01N 21/47* (2006.01)

(52) U.S. Cl.
CPC ......... *G02B 27/283* (2013.01); *G03F 7/7085* (2013.01); *G03F 7/70316* (2013.01); *G03F 7/70608* (2013.01); *G03F 7/70616* (2013.01); *G03F 7/70633* (2013.01); *G03F 7/70641* (2013.01); *G01N 2201/0638* (2013.01); *G01N 2201/0683* (2013.01)

(58) Field of Classification Search
USPC ...................................... 355/53, 67
See application file for complete search history.

(56) References Cited

U.S. PATENT DOCUMENTS

| | | | |
|---|---|---|---|
| 5,585,922 A * | 12/1996 | Sueyoshi | ............ G01B 9/0207 356/487 |
| 5,663,793 A | 9/1997 | De Groot | |
| 6,163,379 A | 12/2000 | De Groot | |
| 6,201,609 B1 | 3/2001 | Hill et al. | |
| 6,876,451 B1 | 4/2005 | Carlson | |
| 7,692,792 B2 | 4/2010 | Kiers et al. | |
| 2002/0012168 A1 | 1/2002 | Li | |
| 2003/0011781 A1 | 1/2003 | Carlson | |
| 2003/0030818 A1 | 2/2003 | Hill et al. | |
| 2003/0095265 A1 | 5/2003 | Hill | |
| 2003/0186136 A1 | 10/2003 | Hill | |
| 2006/0001887 A1 | 1/2006 | Ranalli | |
| 2012/0194824 A1 | 8/2012 | De Groot et al. | |

FOREIGN PATENT DOCUMENTS

| | | |
|---|---|---|
| EP | 1 628 164 A2 | 2/2006 |
| EP | 1 870 696 A1 | 12/2007 |
| JP | S63-53731 A | 3/1988 |
| JP | 2017-049486 A | 3/2017 |
| TW | 2008-007180 A | 2/2008 |

\* cited by examiner

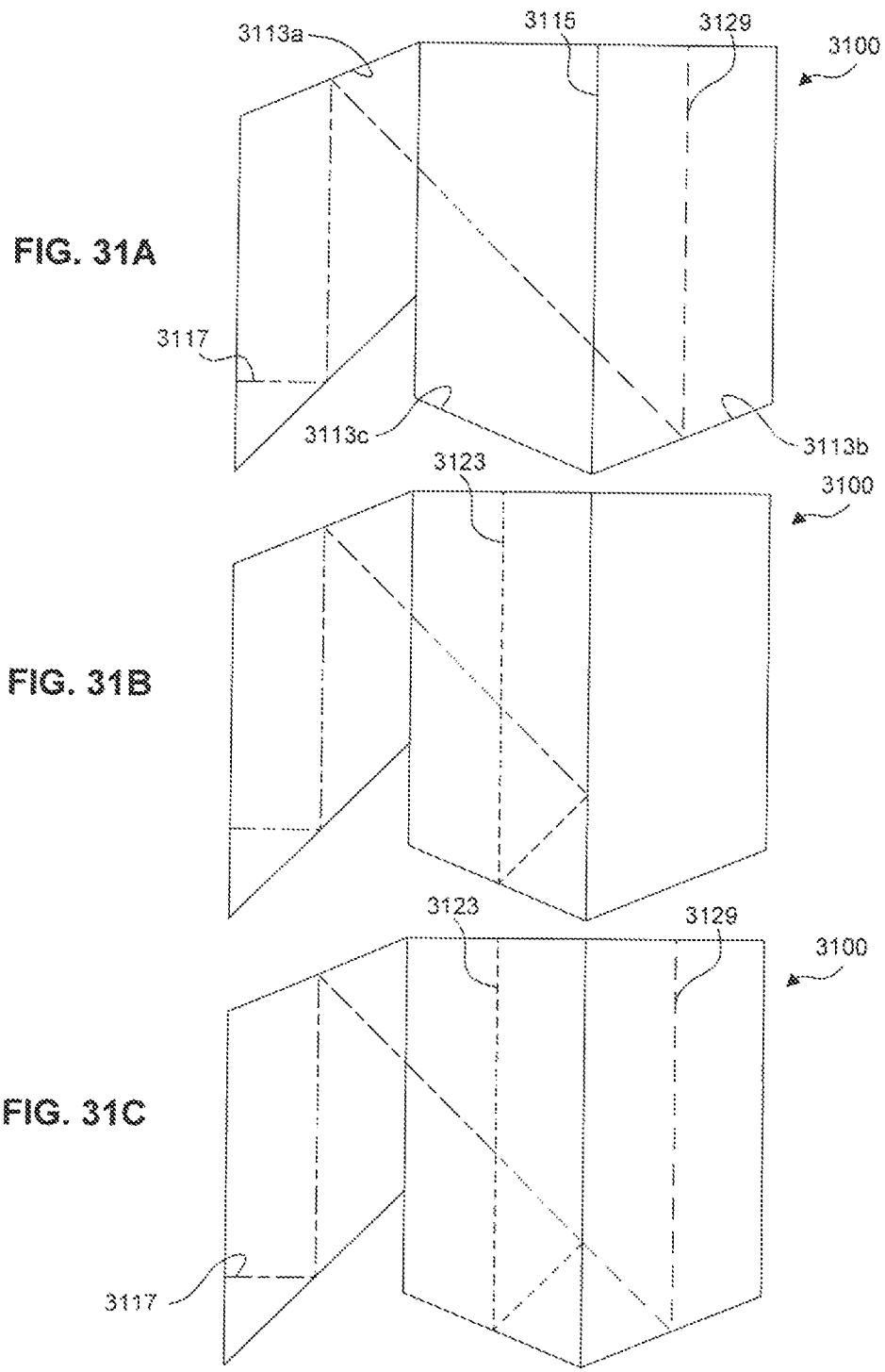

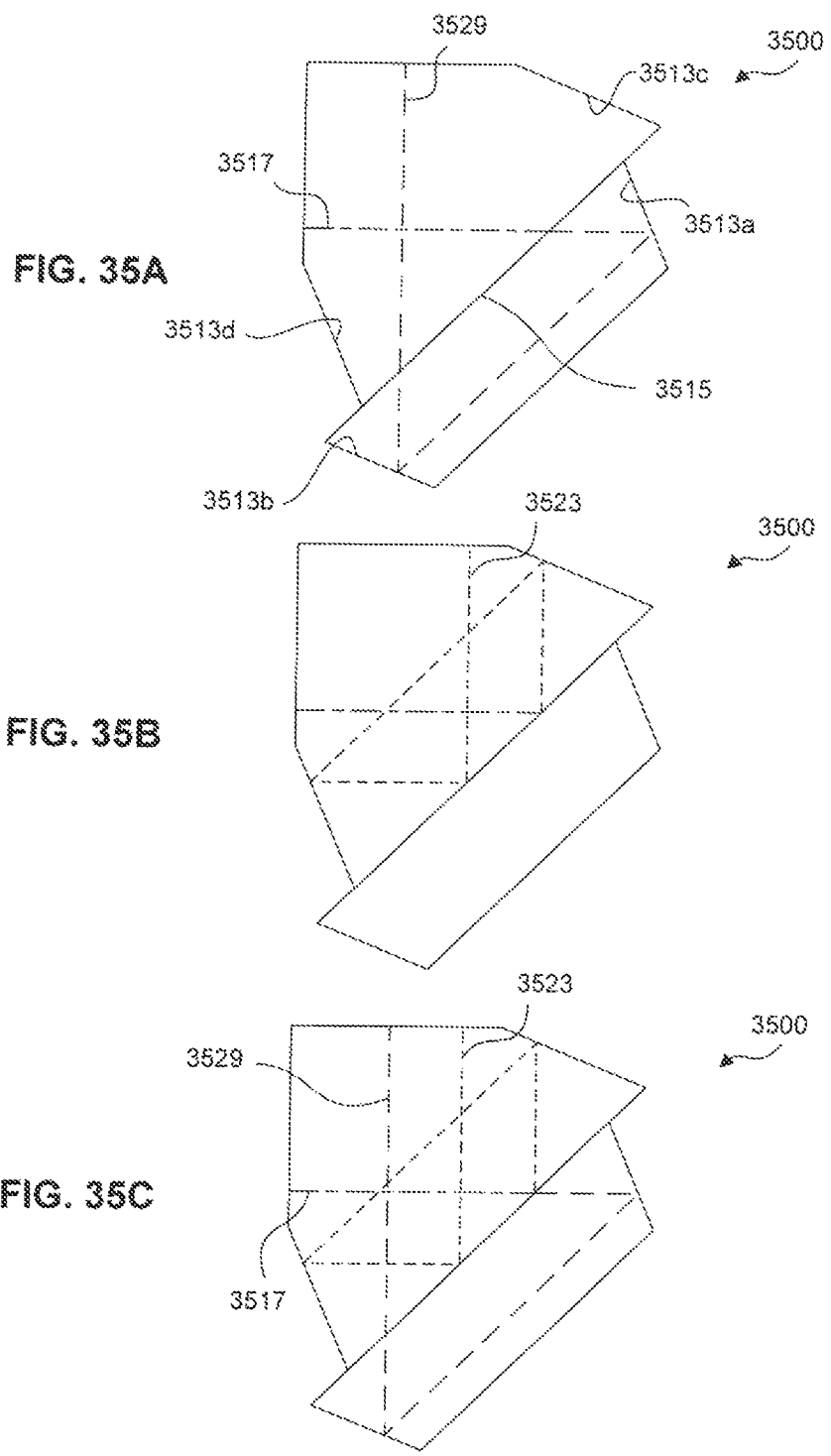

BEAM SPLITTING PRISM SYSTEMS

This application claims benefit of U.S. provisional application 62/597,971, filed Dec. 13, 2017, which is incorporated herein in its entirety by reference.

FIELD

Embodiments of the present invention to prism systems that may be used, for example, in a lithographic apparatus

BACKGROUND

A lithographic apparatus is a machine that applies a desired pattern onto a substrate, usually onto a target portion of the substrate. A lithographic apparatus may be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, parameters of the patterned substrate are measured. Parameters may include, for example, the overlay error between successive layers formed in or on the patterned substrate and critical linewidth of developed photosensitive resist. This measurement may be performed on a product substrate and/or on a dedicated metrology target. There are various techniques for making measurements of the microscopic structures formed in lithographic processes, including the use of scanning electron microscopes and various specialized tools. A fast and non-invasive form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Spectroscopic scatterometers direct a broadband radiation beam onto the substrate and measure the spectrum (intensity as a function of wavelength) of the radiation scattered into a particular narrow angular range. By contrast, angularly resolved scatterometers use a monochromatic radiation beam and measure the intensity of the scattered radiation as a function of angle.

Such optical scatterometers may be used to measure parameters, such as critical dimensions of developed photosensitive resist or overlay error (OV) between two layers formed in or on the patterned substrate. Properties of the substrate can be determined by comparing the properties of an illumination beam before and after the beam has been reflected or scattered by the substrate.

SUMMARY

In some embodiments of this disclosure, prism systems are provided that can be configured to receive an incoming radiation beam and separate the radiation beam into two separate polarized radiation beams. The resulting polarized radiation beams can leave the prism system adjacent to each other and travel the same or substantially the same direction, e.g., perpendicular to the orientation of the input radiation beam. Also, the two output polarized radiation beams can travel the same or substantially the same optical path distances within the prism system. According to some examples of this disclosure, the two output polarized radiation beams can be focused on a single detector. In some embodiments of this disclosure, the prism systems can prevent "ghost" reflections off of the prism systems from overlapping with primary beams on a detector.

According to an embodiment, an apparatus is provided. The apparatus includes a prism system including a polarizing beam splitter (PBS) surface. The PBS surface is configured to generate first and second sub-beams having corresponding first and second polarization information from a received beam, the second polarization information being different than the first polarization information. A first optical path of the first sub-beam within the prism system has substantially same length as a second optical path of the second sub-beam within the prism system. Additionally or alternatively, the first sub-beam achieves a predetermined polarization extinction ratio.

In another embodiment, a lithographic apparatus is provided. The lithographic apparatus includes a first illumination optical system configured to illuminate a pattern. The lithographic apparatus further includes a projection optical system configured to project an image of the pattern onto a substrate. The lithographic apparatus further includes a scatterometer configured to determine a parameter of the lithographic apparatus. The scatterometer includes a second illumination optical system configured to deliver at least one beam of radiation, an objective optical system configured to focus the at least one beam onto the substrate, a detector configured to detect a reflected radiation beam from the substrate, and an apparatus. The apparatus includes a prism system including a polarizing beam splitter (PBS) surface. The PBS surface is configured to generate first and second sub-beams having corresponding first and second polarization information from received the at least one beam of radiation or the reflected radiation beam, the second polarization information being different than the first polarization information. A first optical path of the first sub-beam within the prism system has substantially same length as a second optical path of the second sub-beam within the prism system. Additionally or alternatively, the first sub-beam achieves a predetermined polarization extinction ratio.

Yet in another embodiment, a method includes receiving, by a prism system comprising a plurality of optical elements including a polarizing beam splitter (PBS) surface, a radiation beam. The method further includes generating first and second sub-beams having corresponding first and second polarization information from the received radiation beam, the second polarization information being different than the first polarization information. A first optical path of the first sub-beam within the prism system has substantially same length as a second optical path of the second sub-beam within the prism system. Additionally or alternatively, the first sub-beam achieves a predetermined polarization extinction ratio.

In another embodiment, a prism system is provided. The prism system includes a first optical element having first, second, and third surfaces, the second surface of the first optical element having a polarizing beam splitter surface. The prism system further includes a second optical element coupled to the first optical element. The prism system also includes a third optical element coupled to the first optical element, the third optical element comprising a quarter-wave plate (QWP).

In another embodiment, a lithographic apparatus is provided. The lithographic apparatus includes a first illumination optical system configured to illuminate a pattern. The lithographic apparatus further includes a projection optical system configured to project an image of the pattern onto a substrate. The lithographic apparatus further includes a scatterometer configured to determine a parameter of the lithographic apparatus. The scatterometer includes a second illumination optical system configured to deliver at least one beam of radiation, an objective optical system configured to focus the at least one beam onto the substrate, a detector configured to detect a reflected radiation beam from the substrate, and a prism system. The prism system further includes a second optical element coupled to the first optical element. The prism system also includes a third optical element coupled to the first optical element, the third optical element comprising a quarter-wave plate (QWP).

Further features and advantages of the disclosure, as well as the structure and operation of various embodiments of the disclosure, are described in detail below with reference to the accompanying drawings. It is noted that the disclosure is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

The accompanying drawings, which are incorporated herein and form part of the specification, illustrate the present disclosure and, together with the description, further serve to explain the principles of the disclosure and to enable a person skilled in the relevant art(s) to make and use the invention.

FIGS. 10A-10C, 11A-11C, 12A-12C, 13A-13C, 14A-14C, 15A-15C, 16A-16C, 17A-17C, 18A-18C, 19A-19C, 20A-20C, 21A-21C, 22A-22C, 23A-23C, 24A-24C, 25A-25C, 26A-26C, 27A-27C, 28A-28C, 29A-29C, 30A-30C, 31A-31C, 32A-32C, 33A-33C, 34A-34C, 35A-35C, 36A-36C, and 37A-37C illustrate exemplary prism systems and paths of radiation beams, according to various exemplary embodiments.

Figure 1A:
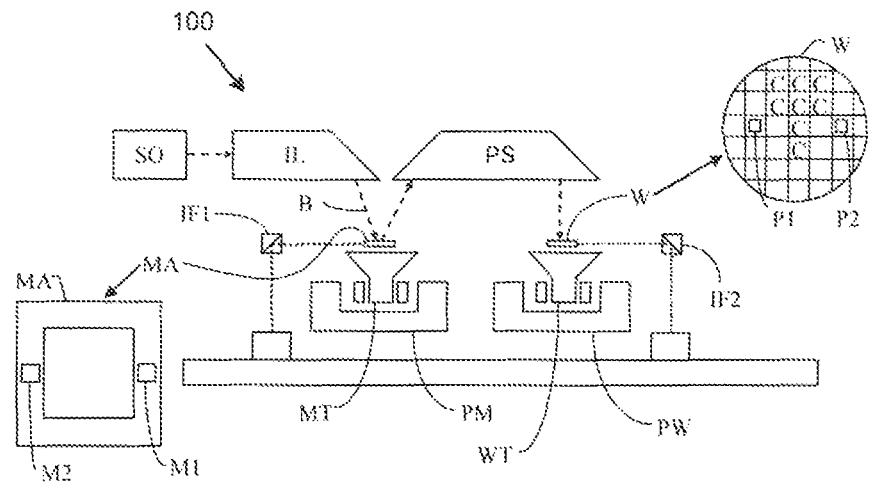
FIG. 1A is a schematic illustration of a reflective lithographic apparatus according to an exemplary embodiment.

Further features and advantages will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this disclosure. The disclosed embodiment(s) merely exemplify the disclosure. The scope of the disclosure is not limited to the disclosed embodiment(s). The disclosure is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Spatially relative terms, such as "beneath," "below," "lower," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about"

can indicate a value of a given quantity that varies within, for example, 10-30% of the value (e.g., ±10%, ±20%, or ±30% of the value).

Embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present disclosure may be implemented.

Example Reflective and Transmissive Lithographic Systems

Figure 1B:
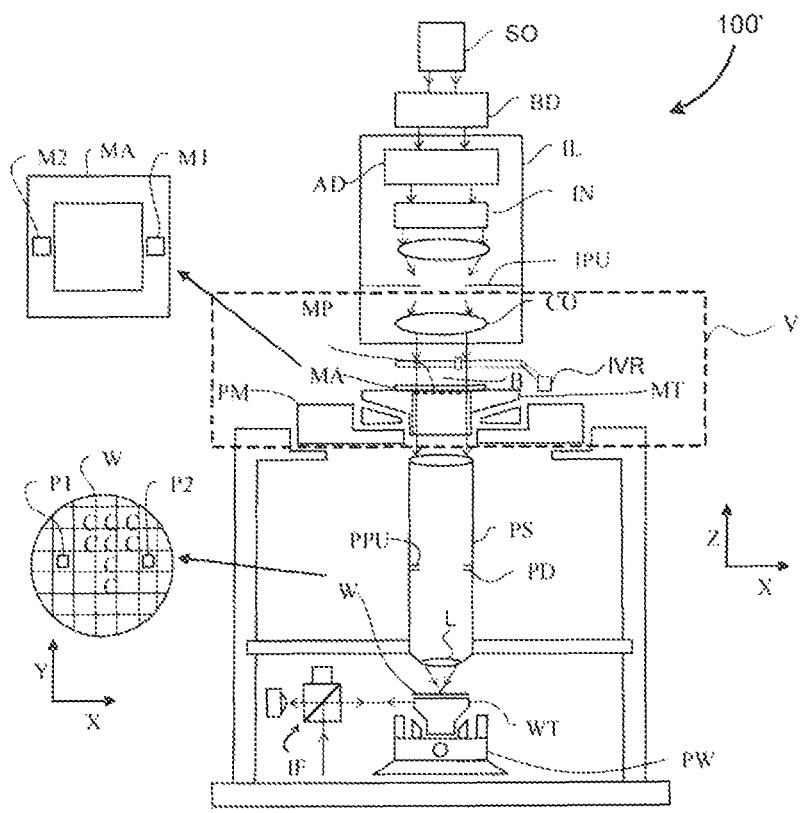
FIG. 1B is a schematic illustration of a transmissive lithographic apparatus according to an exemplary embodiment.

FIGS. 1A and 1B are schematic illustrations of a lithographic apparatus 100 and lithographic apparatus 100', respectively, in which embodiments of the present invention may be implemented. Lithographic apparatus 100 and lithographic apparatus 100' each include the following: an illumination system (illuminator) IL configured to condition a radiation beam B (for example, deep ultra violet or extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL may include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT may use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B which is reflected by a matrix of small mirrors.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' can be of a type having two (dual stage) or more substrate tables WT (and/or two or more mask tables). In such "multiple stage" machines, the additional substrate tables WT can be used in parallel, or preparatory steps can be carried out on one or more tables while one or more other substrate tables WT are being used for exposure. In some situations, the additional table may not be a substrate table WT.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIGS. 1A and 1B, the illuminator IL receives a radiation beam from a radiation source SO. The source SO and the lithographic apparatus 100, 100' can be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO can be an integral part of the lithographic apparatus 100, 100'—for example when the source SO is a mercury lamp. The source SO and the illuminator IL, together with the beam delivery system BD, if required, can be referred to as a radiation system.

The illuminator IL can include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 1B), such as an integrator IN and a condenser CO. The illuminator IL can be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil PPU conjugate to an illumination system pupil IPU. Portions of radiation emanate from the intensity distribution at the illumination system pupil IPU and traverse a mask pattern without being affected by diffraction at a mask pattern and create an image of the intensity distribution at the illumination system pupil IPU.

With the aid of the second positioner PW and position sensor IF (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 1B) can be used to accurately position the mask MA with respect to the path of the radiation beam B (for example, after mechanical retrieval from a mask library or during a scan).

In general, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the mask table MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

Mask table MT and patterning device MA can be in a vacuum chamber, where an in-vacuum robot IVR can be used to move patterning devices such as a mask in and out of vacuum chamber. Alternatively, when mask table MT and patterning device MA are outside of the vacuum chamber, an out-of-vacuum robot can be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 100 and 100' can be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT can be determined by the (de-)magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array.

Combinations and/or variations on the described modes of use or entirely different modes of use can also be employed.

In a further embodiment, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figure 2:
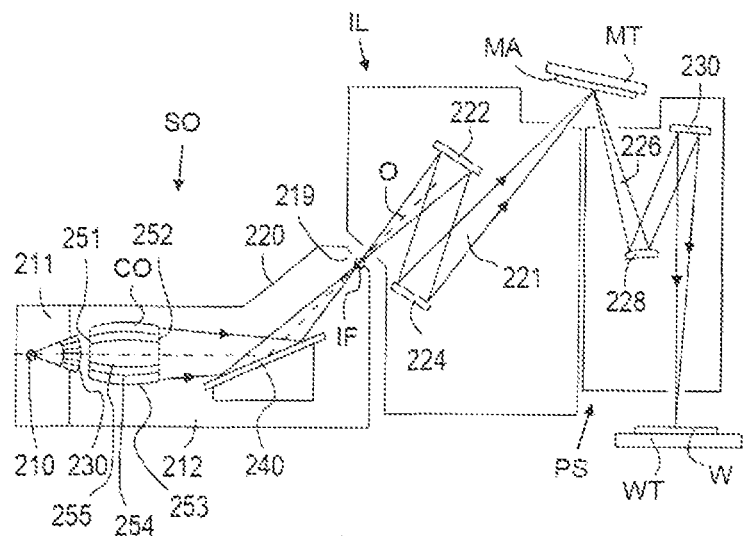
FIG. 2 is a more detailed schematic illustration of the reflective lithographic apparatus, according to an exemplary embodiment.

FIG. 2 shows the lithographic apparatus 100 in more detail, including the source collector apparatus SO, the illumination system IL, and the projection system PS. The source collector apparatus SO is constructed and arranged such that a vacuum environment can be maintained in an enclosing structure 220 of the source collector apparatus SO.

An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure.

The collector chamber 212 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which may include a facetted field mirror device 222 and a facetted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 230 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the FIG. 2, for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is preferably used in combination with a discharge produced plasma source, often called a DPP source.

Example Lithographic Cell

Figure 3:
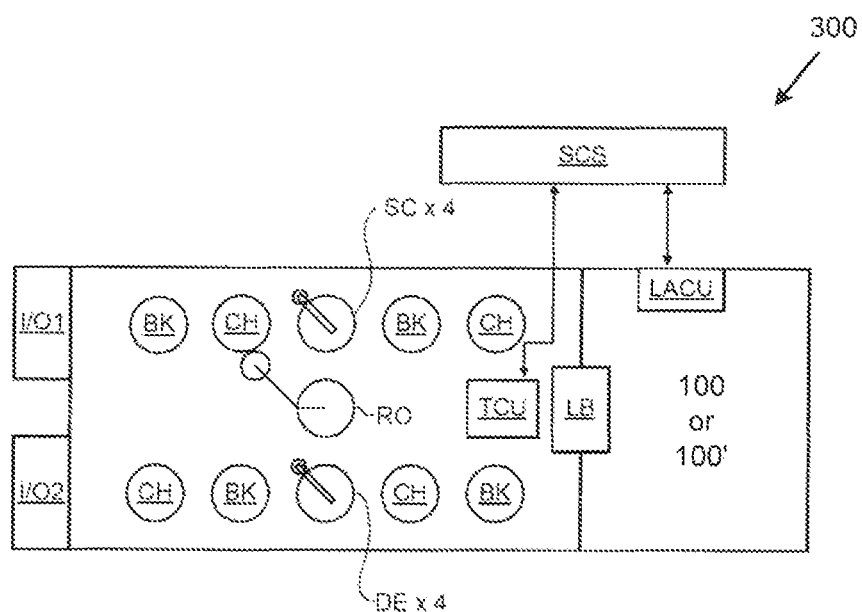
FIG. 3 is a schematic illustration of a lithographic cell, according to an exemplary embodiment.

FIG. 3 shows a lithographic cell 300, also sometimes referred to a lithocell or cluster. Lithographic apparatus 100 or 100' may form part of lithographic cell 300. Lithographic cell 300 may also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

Example Scatterometers

In order to ensure that the substrates that are exposed by a lithographic apparatus, such as lithographic apparatus 100 and/or 100' are exposed correctly and consistently, it is desirable to inspect exposed substrates to measure properties such as overlay errors between subsequent layers, line thicknesses, critical dimensions (CD), etc. If errors are detected, adjustments may be made to exposures of subsequent substrates, especially if the inspection can be done soon and fast enough that other substrates of the same batch are still to be exposed. Also, already exposed substrates may be stripped and reworked—to improve yield—or discarded, thereby avoiding performing exposures on substrates that are known to be faulty. In a case where only some target portions of a substrate are faulty, further exposures can be performed only on those target portions which are good.

An inspection apparatus may be used to determine the properties of the substrates, and in particular, how the properties of different substrates or different layers of the same substrate vary from layer to layer. The inspection apparatus may be integrated into a lithographic apparatus, such as lithographic apparatus 100 and/or 100' or lithocell 300 or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Figure 4:
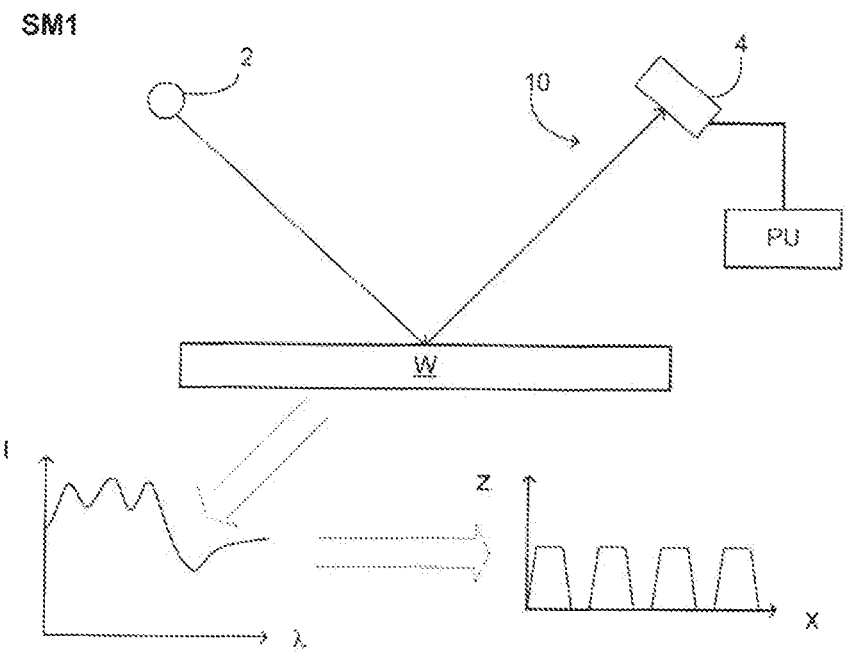
FIGS. 4 and 5 are schematic illustrations of scatterometers, according to various exemplary embodiments.

FIG. 4 depicts a scatterometer SM1 which may be used in the present invention. Scatterometer SM1 may be integrated into a lithographic apparatus, such as lithographic apparatus 100 and/or 100' or lithocell 300 or may be a stand-alone device. It comprises a broadband (white light) radiation projector 2 which projects radiation onto a substrate W. The reflected radiation is passed to a spectrometer detector 4, which measures a spectrum 10 (intensity as a function of wavelength) of the specular reflected radiation. From this data, the structure or profile giving rise to the detected spectrum may be reconstructed by processing unit PU, e.g., by Rigorous Coupled Wave Analysis and non-linear regression or by comparison with a library of simulated spectra as shown at the bottom of FIG. 4. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 5:
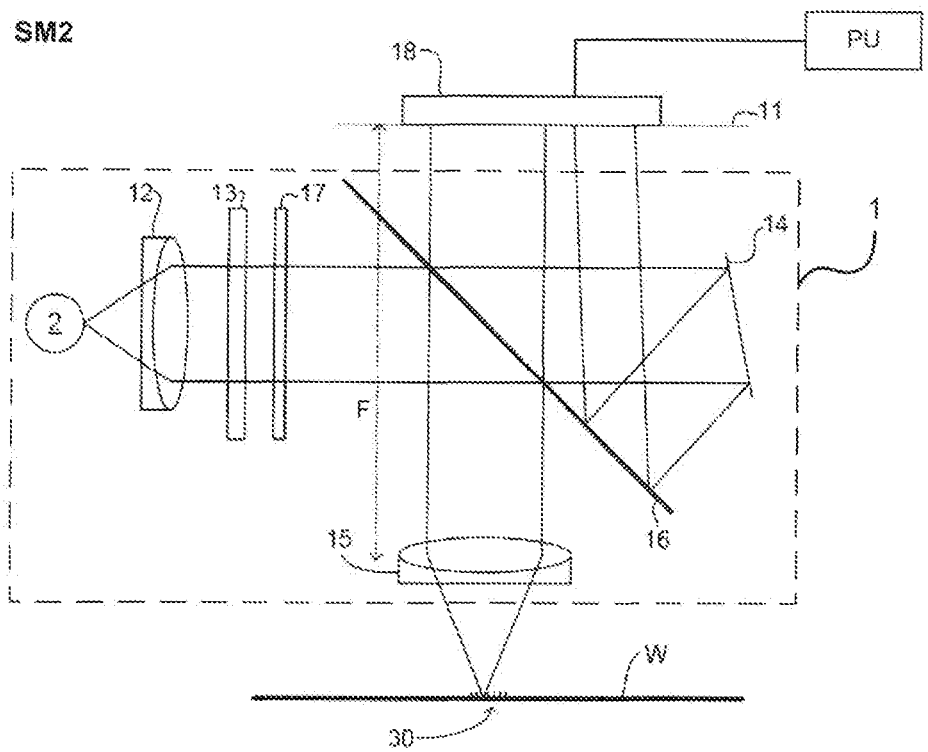

Another scatterometer SM2 that may be used with the present invention is shown in FIG. 5. Scatterometer SM2 may be integrated into a lithographic apparatus, such as lithographic apparatus 100 and/or 100' or lithocell 300 or may be a stand-alone device. Scatterometer SM2 may include an optical system 1 having a radiation source 2, a lens system 12, a filter 13 (e.g., interference filter), a reflecting device 14 (e.g., reference mirror), a lens system 15 (e.g., a microscopic objective lens system, also referred herein as objective lens system), a partially reflected surface 16 (e.g., a beam splitter), and a polarizer 17. Scatterometer SM2 may further include a detector 18 and a processing unit PU.

In one exemplary operation, the radiation emitted by radiation source 2 is collimated using lens system 12 and transmitted through interference filter 13 and polarizer 17, is reflected by partially reflected surface 16 and is focused onto substrate W via microscope objective lens system 15. The reflected radiation then transmits through partially reflecting surface 16 into a detector 18 in order to have the scatter spectrum detected. The detector may be located in the back-projected pupil plane 11, which is at the focal length of the objective lens system 15, however the pupil plane may instead be re-imaged with auxiliary optics (not shown) onto the detector. The pupil plane is the plane in which the radial position of radiation defines the angle of incidence and the angular position defines azimuth angle of the radiation. In one example, the detector is a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam may be used, for example, to measure the intensity of the incident radiation. To do this, when the radiation beam is incident on beam splitter 16 part of it is transmitted through the beam splitter as a reference beam towards reference mirror 14. The reference beam is then projected onto a different part of the same detector 18 or alternatively on to a different detector (not shown).

Interference filter 13 may include a set of interference filters, which may be available to select a wavelength of interest in the range of, say, 405-790 nm or even lower, such as 200-300 nm. The interference filter may be tunable rather than comprising a set of different filters. A grating could be used instead of interference filters.

Detector 18 may measure the intensity of scattered light at a single wavelength (or narrow wavelength range), the intensity separately at multiple wavelengths or integrated over a wavelength range. Furthermore, detector 18 may separately measure the intensity of transverse magnetic- and transverse electric-polarized light and/or the phase difference between the transverse magnetic- and transverse electric-polarized light.

Using a broadband light source (i.e., one with a wide range of light frequencies or wavelengths—and therefore of colors) for a radiation source 2 may give a large etendue, allowing the mixing of multiple wavelengths. The plurality of wavelengths in the broadband preferably each may have a bandwidth of $\Delta\lambda$ and a spacing of at least 2 $\Delta\lambda$ (i.e., twice the bandwidth). Several "sources" of radiation can be different portions of an extended radiation source which have been split using fiber bundles. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness. This is described in more detail in EP1,628,164A, which is incorporated by reference herein in its entirety.

The target 30 on substrate W may be a 1-D grating, which is printed such that after development, the bars are formed of solid resist lines. The target 30 may be a 2-D grating, which is printed such that after development, the grating is formed of solid resist pillars or vias in the resist. The bars, pillars or vias may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the 1-D grating, such as line widths and shapes, or parameters of the 2-D grating, such as pillar or via widths or lengths or shapes, may be input to the reconstruction process, performed by processing unit PU, from knowledge of the printing step and/or other scatterometry processes.

As described above, the target can be on the surface of the substrate. This target will often take the shape of a series of lines in a grating or substantially rectangular structures in a 2-D array. The purpose of rigorous optical diffraction theories in metrology is effectively the calculation of a diffraction spectrum that is reflected from the target. In other words, target shape information is obtained for CD (critical dimension) uniformity and overlay metrology. Overlay metrology is a measuring system in which the overlay of two targets is measured in order to determine whether two layers on a substrate are aligned or not. CD uniformity is simply a measurement of the uniformity of the grating on the spectrum to determine how the exposure system of the lithographic apparatus is functioning. Specifically, CD, or critical dimension, is the width of the object that is "written" on the substrate and is the limit at which a lithographic apparatus is physically able to write on a substrate.

Exemplary Prism Systems

Figure 6:
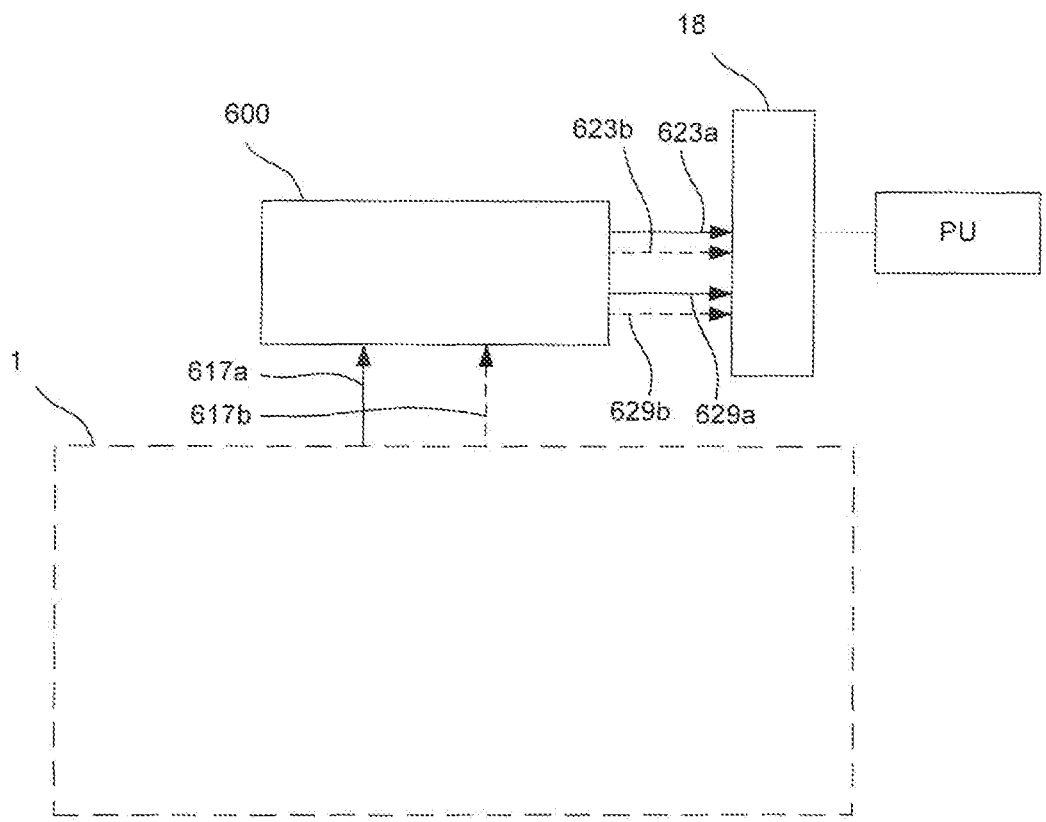
FIG. 6 is a schematic illustration of an exemplary prism system used in an exemplary scatterometer, according to various exemplary embodiments.

FIG. 6 is a schematic illustration of exemplary prism systems used in an exemplary scatterometer, according to some embodiments of this disclosure. It is noted that although prism system 600 is shown to be used with an scatterometer, the embodiments of this disclosure are not limited to this example and the prism systems of the embodiments of this disclosure can be used with other optical systems, such as, but not limited to, lithographic apparatus 100 and/or 100', lithocell 300, scatterometer SM1, scatterometer SM2, and/or other optical systems.

FIG. 6 is a schematic illustration of a part of an exemplary scatterometer that includes prism system 600. For example, FIG. 6 illustrates optical system 1 of scatterometer SM2 of FIG. 5, detector 18 of scatterometer SM2 of FIG. 5, processing unit PU of scatterometer SM2 of FIG. 5, and prism system 600. According to some examples, prism system 600 is configured to receive reference radiation beam 617a and scattered and/or reflected radiation beam 617b.

According to some embodiments, prism system 600 can be configured to generate sub-beams 623a and 629a from reference radiation beam 617a. Additionally, prism system 600 can be configured to generate sub-beams 623b and 629b from scattered and/or reflected radiation beam 617b. Detector 18 can receive sub-beams 623a, 623b, 629a, and 629b and can measure the intensity of reference and/or scattered light within sub-beams 623a, 623b, 629a, and 629b, according to some embodiments. Detector 18 and processing unit PU can be configured to measure one or more parameter of substrate W and/or optical systems (such as a lithographic apparatus) used to generate substrate W.

According to some examples, reference radiation beam 617a and scattered and/or reflected radiation beam 617b can include unpolarized radiation beams as inputs to prism system 600. Prism system 600 can be configured to split the input beams into their horizontal (H) and vertical (V) polarization components and output resulting sub-beam travelling, for example, parallel and adjacent to each other. Prism systems of the embodiments of this disclosure can be configured to image H and V polarized beams onto a single detector (e.g., a sensor) at a common focal plane. For example, detector 18 can be a single detector that receives the H and V polarized beams. In one example, sub-beams 623a and 623b can have horizontal (H) polarization information and P polarization orientation. And for example, sub-beams 629a and 629b can have vertical (V) polarization information and P polarization orientation.

According to some exemplary embodiments, prism system 600 can include a polarizing beam splitter surface, one or more quarter-wave plates (QWP), and one or more mirror surfaces. The QWP can include QWP polymer stack or a QWP coating applied to a mirror surface, according to some examples.

Alternatively, prism system 600 can be designed such that prism system 600 does not include the QWP, according to some embodiments. In some examples, prism system 600 can be designed to use total internal reflection (TIR) within prism system 600 with or without a mirror surface.

Prism system 600 can be designed such that sub-beams 623a and 629a (and sub-beams 623b and 629b) travel the same or substantially the same optical paths through prism system 600, according to some exemplary embodiments. In the context of this invention, the term "substantially the same optical paths" means that the path difference is so small that the sub-beams are focused at the following detector within depth of focus for images formed by the sub-beams after propagation through the prism system 600. The depth of focus can be a function of, for example, light wavelength, sub-beam numerical aperture and/or aberrations. In other words, prism system 600 can be designed such that the optical paths for sub-beams 623a and 629a (and the optical paths for sub-beams 623b and 629b) through prism system 600 have the same or substantially the same length, according to some exemplary embodiments. Additionally or alternatively, and as discussed in more detail below, prism system 600 can be designed such that the output surface(s), the input surface, and/or other surfaces of prism system 600 are tilted. These tilts can prevent or minimize "ghost" reflections off of these surfaces from overlapping with primary beams on a detector (such as detector 18), according to some examples. In additional or alternative embodiments, one of the sub-beams 613a or 619a (and one of the sub-beams 613b or 619b) can transmit through or be reflected from the polarizing beam splitter surface twice to achieve a predetermined polarization extinction ratio (PER). The polarization extinction ratio can be defined as the ratio of the transmission of the unwanted component to the wanted component. The polarization extinction ratio can be expressed as a linear ratio $$\left(\text{e.g.,}\ \frac{T_2}{T_1}\right),$$

a percentage $$\left(\text{e.g.,}\ \left(\frac{T_2}{T_1}\right)*100\right),$$

or as a function in decibel (dB)

$$\left(\text{e.g.,}\ 10*\log\left(\frac{T_2}{T_1}\right)\right).$$

Here, $T_2$ can be the transmittance (e.g., power) of the unwanted component (e.g., undesired polarization) and $T_1$ can be the transmittance (e.g., power) of the wanted component (e.g., the desired polarization.) The polarization extinction ratio is a property that depends on the wavelength of the radiation beam. As one example, an unpolarized radiation beam can be split, by a polarizing beam splitter (PBS), into a sub-beam with P polarization orientation and another sub-beam with S polarization orientation. The P-polarized sub-beam can transmit through the PBS and the S-polarized sub-beam can reflect from the PBS. The polarization extinction ratio for the S-polarized sub-beam can be defined as the ratio of the unwanted part of the radiation beam reflected by the PBS to the wanted S-polarized sub-beam reflected by the PBS.

Figure 7A:
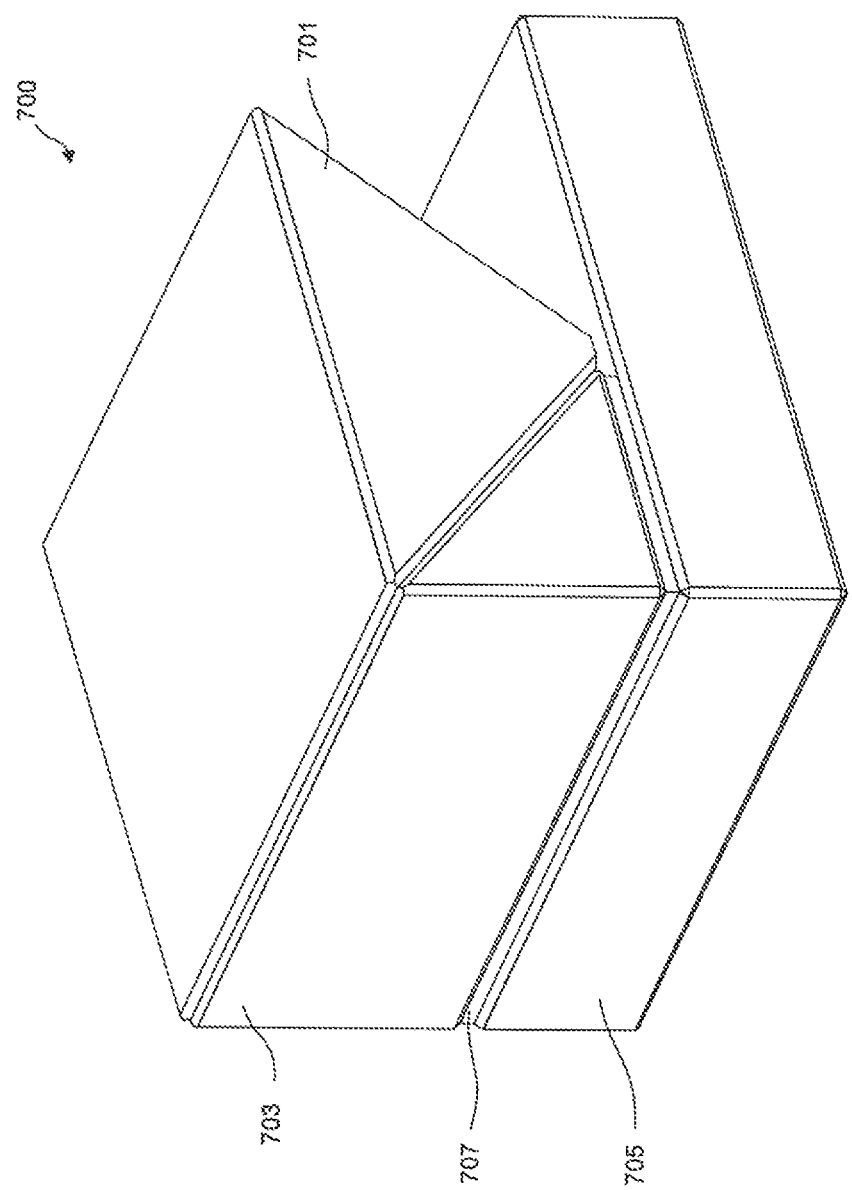
FIG. 7A illustrate an exemplary prism system, according to an exemplary embodiment.

FIG. 7A illustrates an exemplary prism system, according to some embodiments of this disclosure. According to some examples, prism system 700 can include four adjoined optical elements 701, 703, 705, and 707.

According to some embodiments, prism system 600 of FIG. 6 can include prism system 700 of FIG. 7A. Prism system 700 can be located near detector 4 of FIG. 4, and/or detector 18 of FIG. 5 and/or FIG. 6, and can be configured to receive the reference radiation beam and/or the scattered and/or reflected radiation beam, as discussed above with respect to FIGS. 4-6. However, prism system 700 can be located in any location of a lithographic apparatus, a metrology apparatus, etc.

Prism system 700 can be configured to receive an incoming radiation beam and separate the radiation beam into two separate horizontal (H) and vertical (V) polarized radiation beams, in some embodiments. The resulting H and V polarized radiation beams can leave prism system 700 adjacent to each other and travel the same or substantially the same direction, e.g., perpendicular to the orientation of the input radiation beam, according to some embodiments. Also, the two output H and V polarized radiation beams can travel the same or substantially the same optical path distances within prism system 700. In other word, the optical paths for the two output H and V polarized radiation beams within prism system 700 have the same or substantially the same length. This can be accomplished using a polarizing beam splitter, a quarter wave plate (QWP), and a mirror surface, as discussed in more detail below. According to some examples, if a converging radiation beam is input to prism system 700, the two output H and V polarized radiation beams can focus on a common plane.

According to some examples, optical elements 701 and 703 can include a prism and optical element 705 can include a mirror. Optical elements 701 and 703 can be made from glass. However, other suitable materials as known to a person of ordinary skill in the art can also be used for making optical elements 701 and 703. Optical element 707 can include a quarter-wave plate (QWP), according to some examples. For example, QWP 707 can include a QWP polymer stack.

Figure 7B:
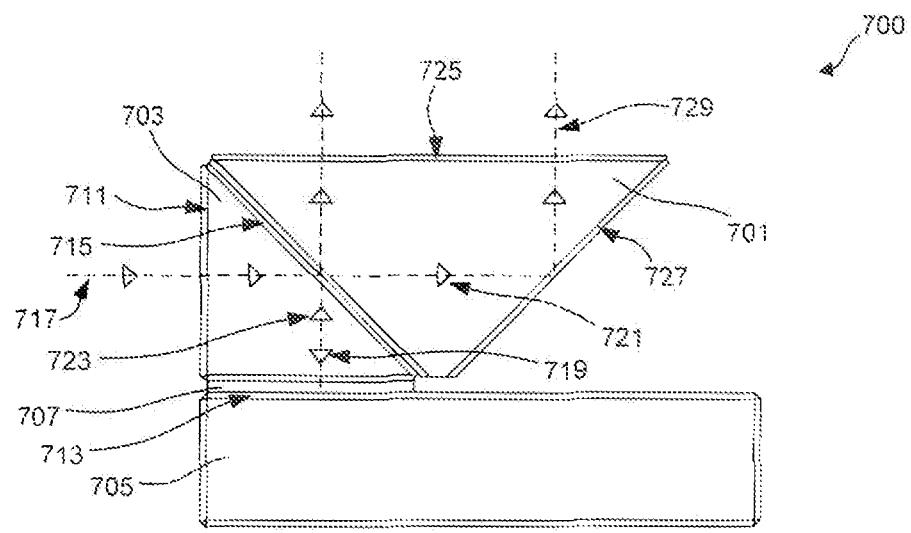
FIG. 7B illustrates an exemplary prism system and paths of radiation beams, according to an exemplary embodiment.

FIG. 7B illustrates a side-view of the prism system and paths of radiation beams, according to an embodiment of this disclosure. As discussed above, prism system 700 can include four adjoined optical elements 701, 703, 705, and 707.

Radiation beam 717 enters the optical element 703 through input surface 711. Optical element 703 can have a polarizing beam splitter surface 715. Polarizing beam splitter surface 715 can divide incident radiation beam 717 into sub-beams 719 and 721.

According to some examples radiation beam 717 can be a non-polarized radiation beam. Additionally or alternatively, radiation beam 717 can include different polarization information. Sub-beam 719, which is reflected from polarizing beam splitter surface 715, can have vertical (V) polarization information and S polarization orientation at polarizing beam splitter surface 715, according to some examples. Sub-beam 721, which is passed through polarizing beam splitter surface 715, can have horizontal (H) polarization information and P polarization orientation at polarizing beam splitter surface 715, according to some examples.

According to some examples, prism system 700 includes QWP 707 and optical element 705. Optical element 705 includes a mirror substrate with a reflecting surface (e.g., a mirror surface), according to some examples. Sub-beam 719 enters QWP 707 and is reflected by a surface of optical element 705. In other words, sub-beam 719 passes through QWP 707 and is reflected from the mirror surface of optical element 705 (e.g., mirror surface 713) into sub-beam 723. By passing twice through QWP 707, the polarization of sub-beam 719 changes from S polarization orientation to P polarization orientation at polarizing beam splitter surface 715. In other words, sub-beam 723 can have vertical (V) polarization information and P polarization orientation at polarizing beam splitter surface 715, according to some examples. Sub-beam 723 passes through polarizing beam splitter surface 715, through optical element 701 and exits output surface 725 of optical element 701. In some example, by passing through polarizing beam splitter surface 715, sub-beam 723 can achieve a predetermined polarization extinction ratio. In this example, sub-beam 723 has been reflected from (as sub-beam 719) and transmitted through polarizing beam splitter surface 715 to achieve a predetermined polarization extinction ratio.

It is noted that although FIG. 7B illustrates that sub-beams 719 and 723 coincide, the embodiments of this disclosure are not limited to this example. In other words, prism system 700 can be designed such that sub-beams 719 and 723 do not coincide. For example, surfaces 715 and 713 of prism system 700 can be designed using different angles such that sub-beams 719 and 723 do not coincide. According to some example where sub-beams 719 and 723 do not coincide, the optical elements of prism system 700 (for example, optical elements 701 and/or 703) can be designed such that the optical path length for beams 717, 719, 723 and the optical path length for beams 717, 721, 729 are the same or substantially the same.

Sub-beam 721 is created using polarized beam splitter surface 715 from radiation beam 717. As discussed above, sub-beam 721 can have horizontal (H) polarization information and P polarization orientation at polarizing beam splitter surface 715. Sub-beam 721 is reflected from surface 727 of optical element 701. According to one example, surface 727 can be an uncoated surface used for total internal reflection (TIR). However, surface 727 can include other optical devices and/or material, such as a reflecting coating, to reflect sub-beam 721. Reflected sub-beam 729 can exit optical element 701 through output surface 725.

Output sub-beams 723 and 729 can both be P polarized beams. However, sub-beam 723 has a vertical polarization information and sub-beam 729 has a horizontal polarization information, according to some embodiments.

According to some examples, prism system 700 can act as a flat plate (as opposed to, for example, a wedged plate, which can result in unacceptable levels of chromatic aberration) for both output sub-beams 723 and 729. Prism system 700 can flip the orientation of one of the beams relative to the other beam. For example, prism system 700 reflects one path (717, 719, 723) an even amount of times and the other path (717, 721, and 729) an odd amount of time. But if prism system 700 is unfolded, prism system 700 can look like a parallel plate window normal to the beam 717. Therefore, there can be chromatic image shifts along the directions of the beams that enter prism system 700, but there would be no angular deviation of the beams. For example, no angular deviation as a function of wavelength would occur for a wavelength range of interest. Therefore, there would be no lateral or angular chromatic aberration and the colors would follow the same optical path.

Prism systems of the embodiments of this disclosure can be configured to separate the H and V polarizations of an unpolarized beam and image both H and V polarized beams onto a single detector (e.g., a sensor) at a common focal plane. Additionally or alternatively, the prism systems of the embodiments of this disclosure can minimize chromatic aberration (e.g., lateral chromatic aberration) by making the prism system to function as a flat plate in both H and V polarization beams lightpaths.

Figure 7C:
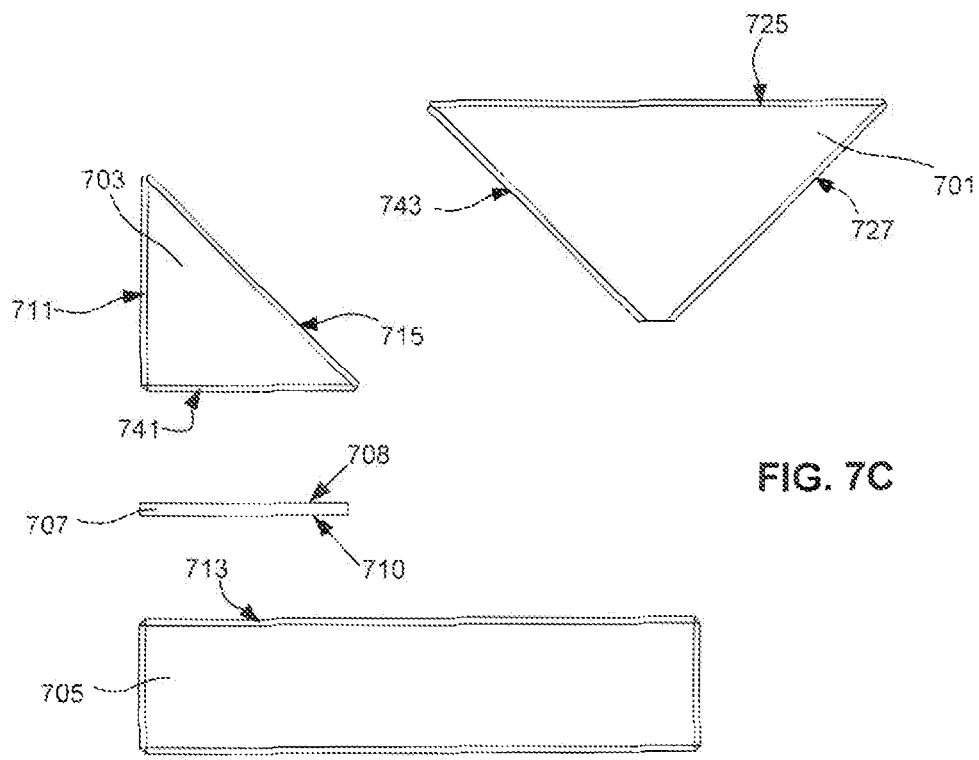
FIG. 7C illustrates an exemplary exploded view of the separate optical elements of an exemplary prism system, according to an exemplary embodiment.

FIG. 7C illustrates an expanded view of prism system 700, according to an embodiment of this disclosure. According to some embodiments, prism system 700 includes four adjoined optical elements 701, 703, 705, and 707.

According to some examples, optical element 701 can include surfaces 725, 727, and 743. Output surface 725 can include an anti-reflective (AR) coating for radiation beams at a wavelength range of about 410 nm to about 900 nm. Surface 727 of optical element 701 can be uncoated and can be used for TIR. Similarly, surface 743 of optical element 701 can be an uncoated surface. According to some examples, an angle between surfaces 727 and 743 is about 90° and an angle between surfaces 725 and 743 is about 45°. It is noted that the embodiments of this disclosure are not limited to these examples and other coating, optical devices, and/or angles can be used for surfaces of optical element 701.

According to some examples, optical element 703 can include surfaces 711, 715, and 741. According to some examples, input surface 711 can include an anti-reflective (AR) coating for radiation beams at a wavelength range of about 410 nm to about 900 nm. Surface 741 of optical element 703 can include an uncoated surface, according to some embodiments. Surface 715 of optical element 703 can include a polarizing beam splitter (PBS) coating, according to some embodiments. For example, surface 715 of optical element 703 can include a PBS coating for radiation beams at a wavelength range of about 410 nm to about 900 nm. According to some examples, an angle between surfaces 711 and 741 is about 90° and an angle between surfaces 715 and 741 is about 45°. It is noted that the embodiments of this disclosure are not limited to these examples and other coating, optical devices, and angles can be used for surfaces of optical element 703. For example, surface 715 of prism 703 can be uncoated and surface 743 of prism 701 have polarizing beam splitting coating.

According to some examples, surface 715 of optical element 703 can be coupled to surface 743 of optical element 701. In one example, surface 715 of optical element 703 can be coupled to surface 743 of optical element 701 using, for example, an adhesive (e.g., an optical cement.) For example, an adhesive bonded surface can be placed between surfaces 715 and 743 to couple optical elements 703 and 701. Additionally or alternatively, surface 715 of optical element 703 can be optically coupled and/or contacted to surface 743 of optical element 701 (for example using an optically contacted surface.)

According to some embodiments, optical element 707 can include QWP having surfaces 708 and 710. According to one example, the QWP can include a quarter-wave polymer stack. However, the embodiments of this disclosure are not limited to quarter-wave polymer and any quarter-wave retarder can be used. In one example, surface 708 of optical element 707 can be coupled to surface 741 of optical element 703 using, for example, an adhesive (e.g., an optical cement.) For example, an adhesive bonded surface can be placed between surfaces 708 and 741 to couple optical elements 707 and 703. Additionally or alternatively, surface 708 of optical element 707 can be optically coupled and/or contacted to surface 741 of optical element 703 (for example using an optically contacted surface.)

According to some examples, optical element 705 (e.g., a mirror substrate) can include a surface 713. Surface 713 can include a mirror surface, according to some embodiments. Surface 713 of optical element 705 can be coupled to surface 710 of optical element 707. In one example, surface 713 of optical element 705 can be coupled to surface 710 of optical element 707 using, for example, an adhesive (e.g., an optical cement.) For example, an adhesive bonded surface can be placed between surfaces 713 and 710 to couple optical elements 705 and 707. Additionally or alternatively, surface 713 of optical element 705 can be optically coupled and/or contacted to surface 710 of optical element 707 (for example using an optically contacted surface.)

Figure 8A:
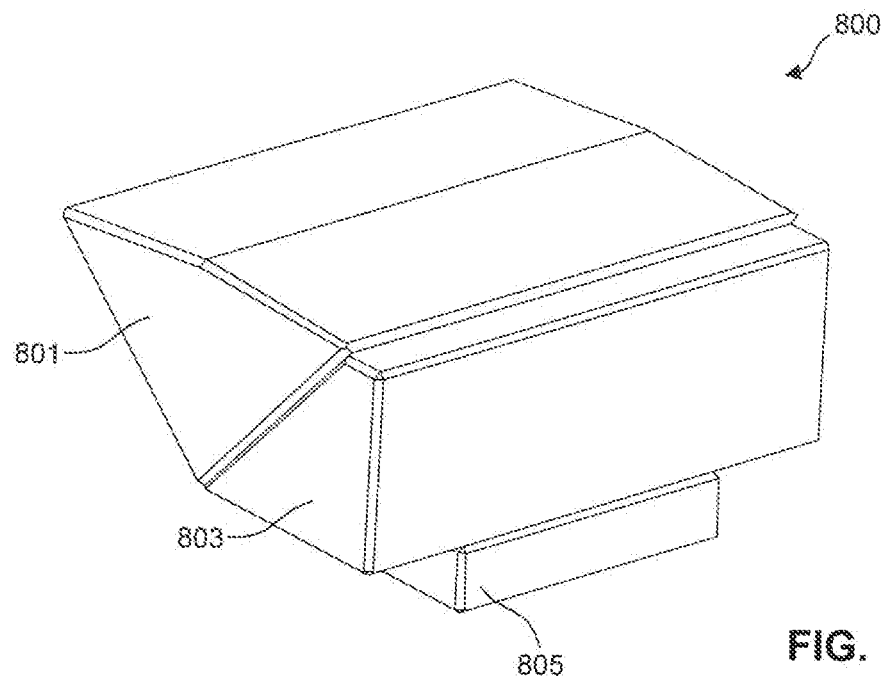
FIGS. 8A and 8B illustrate an exemplary prism system, according to various exemplary embodiments.
Figure 8B:
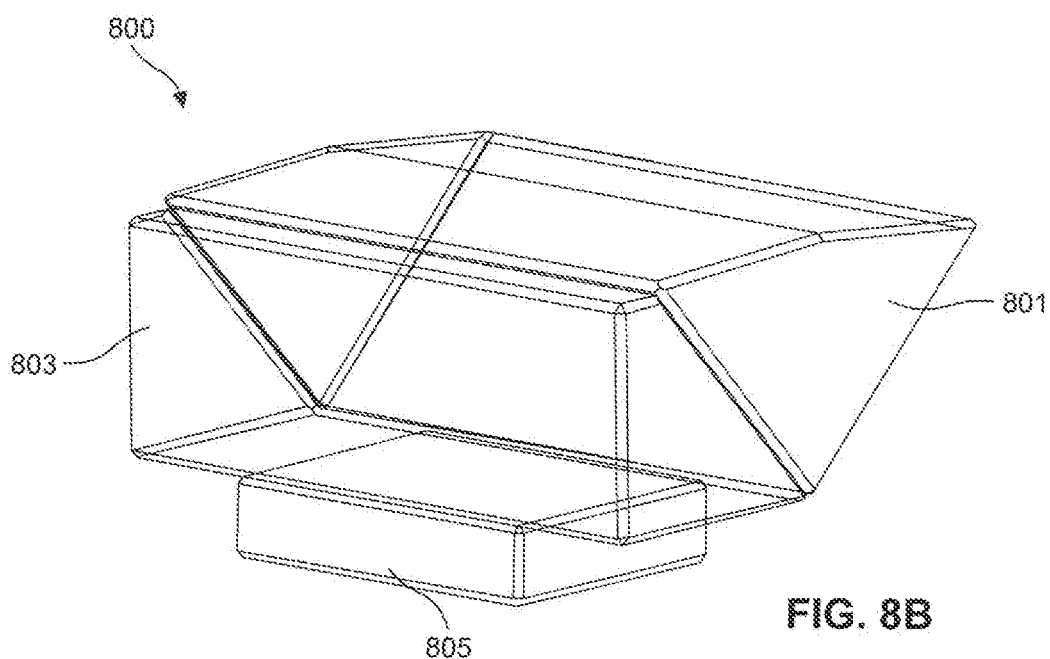

FIGS. 8A-8D illustrate another exemplary prism system, according to some embodiments of this disclosure. FIGS. 8A and 8B illustrate prism system 800 from different side views. According to some examples, prism system 800 can include three adjoined optical elements 801, 803, and 805.

According to some embodiments, prism system 600 of FIG. 6 can include prism system 800 of FIGS. 8A-8D. Prism system 800 can be located near detector 4 of FIG. 4, and/or detector 18 of FIG. 5 and/or FIG. 6, and can be configured to receive the reference radiation beam and/or the scattered and/or reflected radiation beam, as discussed above with respect to FIGS. 4-6. However, prism system 800 can be located in any location of a lithographic apparatus, a metrology apparatus, etc.

Prism system 800 can be configured to receive an incoming radiation beam and separate the radiation beam into two separate horizontal (H) and vertical (V) polarized radiation beams, in some embodiments. The resulting H and V polarized radiation beams can leave prism system 800 adjacent to each other and travel the same or substantially the same direction, e.g., perpendicular to the orientation of the input radiation beam. Also, the two output H and V polarized radiation beams can travel the same or substantially the same optical path distances within prism system 800. This can be accomplished using a polarizing beam splitter, a quarter wave plate, and a mirror surface, as discussed in more detail below. According to some examples, if a converging radiation beam is input to prism system 800, the two output H and V polarized radiation beams can focus on a common plane.

According to some examples, optical elements 801 and 803 can include a prism and optical element 805 can include a mirror. Optical elements 801 and 803 can be made from glass. However, other suitable materials as known to a person of ordinary skill in the art can also be used for making optical elements 801 and 803.

Figure 8C:
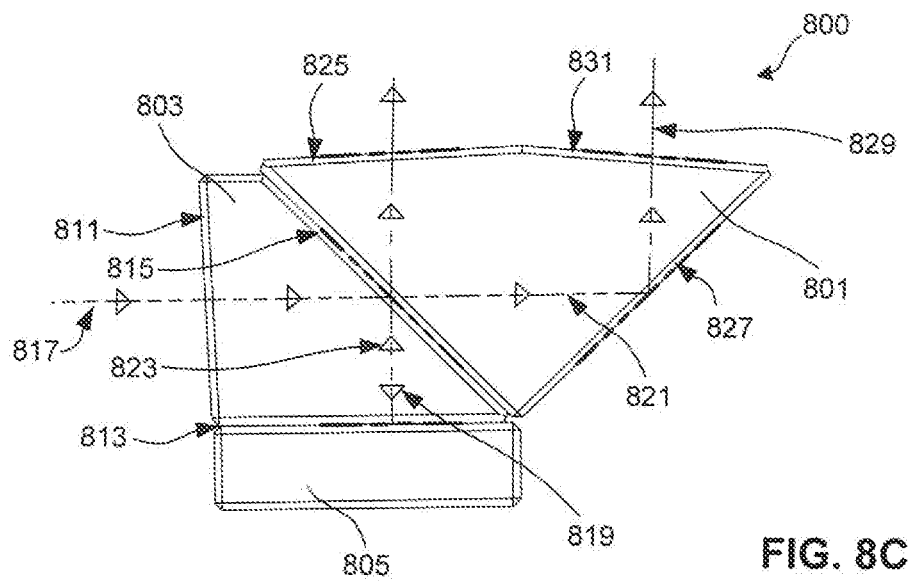
FIG. 8C illustrates an exemplary prism system and paths of radiation beams, according to an exemplary embodiment.

FIG. 8C illustrates a side-view of the prism system and paths of radiation beams, according to an embodiment of this disclosure. A radiation beam 817 enters the optical element 803 through input surface 811. According to some examples, input surface 811 of optical element 803 is a tilted surface. In this example, the tilt of tilted surface 811 can be defined by a tilt angle as an angle between the normal to surface 811 and radiation beam 817. Optical element 803 can have a polarizing beam splitter surface 815. Polarizing beam splitter surface 815 can divide incident radiation beam 817 into sub-beams 819 and 821.

According to some examples radiation beam 817 can be a non-polarized radiation beam. Additionally or alternatively, radiation beam 817 can include different polarization information. Sub-beam 819, which is reflected from polarizing beam splitter surface 815, can have vertical (V) polarization information and S polarization orientation at polarizing beam splitter surface 815, according to some examples. Sub-beam 821, which is passed through polarizing beam splitter surface 815, can have horizontal (H) polarization information and P polarization orientation at polarizing beam splitter surface 815, according to some examples.

According to some examples, optical element 805 can include a surface 813. Surface 813 can include a reflecting surface (e.g., a mirror surface) with quarter-wave plate (QWP) such as QWP coating applied to the mirror surface. Sub-beam 819 enters and is reflected by surface 813. In other words, sub-beam 819 passes through the QWP and is reflected from the mirror surface to sub-beam 823. By passing twice through QWP, the polarization of sub-beam 819 changes from S polarization orientation to P polarization orientation at polarizing beam splitter surface 815. In other words, sub-beam 823 can have vertical (V) polarization information and P polarization orientation at polarizing beam splitter surface 815, according to some examples. Sub-beam 823 passes through polarizing beam splitter surface 815, through optical element 801 and exits output surface 825 of optical element 801. According to some examples, output surface 825 of optical element 801 is also tilted. In some example, by passing through polarizing beam splitter surface 815, sub-beam 823 can achieve a predetermined polarization extinction ratio. In this example, sub-beam 823 has been reflected from (as sub-beam 819) and transmitted through polarizing beam splitter surface 815 to achieve a predetermined polarization extinction ratio.

It is noted that although FIG. 8C illustrates that sub-beams 819 and 823 coincide, the embodiments of this disclosure are not limited to this example. In other words, prism system 800 can be designed such that sub-beams 819 and 823 do not coincide. For example, surfaces 815 and 813 of prism system 800 can be designed using different angles such that sub-beams 819 and 823 do not coincide. According to some example where sub-beams 819 and 823 do not coincide, the optical elements of prism system 800 (for example, optical elements 801 and/or 803) can be designed such that the optical path length for beams 817, 819, 823 and the optical path length for beams 817, 821, 829 are the same to substantially the same.

Sub-beam 821 is created using polarized beam splitter surface 815 from radiation beam 817. As discussed above, sub-beam 821 can have horizontal (H) polarization information and P polarization orientation at polarizing beam splitter surface 815. Sub-beam 821 is reflected from surface 827 of optical element 801. According to one example, surface 827 can be an uncoated surface used for total internal reflection (TIR). However, surface 827 can include other optical devices and/or material, such as a reflecting coating, to reflect sub-beam 821. Reflected sub-beam 829 can exit optical element 801 through output surface 831. According to some examples, output surface 831 is also a tilted surface. In these examples, output surfaces 825 and 831 are tilted in opposite directions. In this example, the tilt of tilted surface 825 can be defined by a tilt angle as an angle between the normal to surface 825 and sub-beam 823. Also, in this example, the tilt of tilted surface 831 can be defined by a tilt angle as an angle between the normal to surface 831 and sub-beam 829.

As discussed in more detail below, these tilts can minimize "ghost" reflections off of these surfaces from overlapping with primary beams on a detector, according to some examples. According to some examples, the amount of tilt of surfaces 825 and 831 can be related to a distance between prism system 800 and the detector (e.g., detector 4 of FIG. 4 and/or detector 18 of FIGS. 5 and 6.) For example, the amount of tilt of surfaces 825 and 831 can scale inversely with the distance between prism system 800 and the detector. According to some examples, the design of prism system 800 is compact to maximize the distance between prism system 800 and the detector in order to minimize the amount of the tilt of surfaces 825 and 831, and therefore, to minimize chromatic aberration at detector plane.

Output sub-beams 823 and 829 can both be P polarized beam. However, sub-beam 823 has a vertical polarization information and sub-beam 829 has a horizontal polarization information.

According to some examples, the tilt angle of input surface 811 with respect to input radiation beam 817 and tilt angles of output surface 825 (and/or output surface 831) with respect to output sub-beam 823 (and/or output sub-beam 829) are designed such that prism system 800 can act as a tilted plano-parallel plate. For example, input surface 811 is tilted with respect to input radiation beam 817 the same or substantially the same amount as output surface 825 (and/or output surface 831) is tilted with respect to output sub-beam 823 (and/or output sub-beam 829.) Then, prism system 800 can act as a tilted plano-parallel plate (as opposed to, for example, a wedged plate, which can result in unacceptable levels of chromatic aberration) for both output sub-beams 823 and 829. Prism system 800 can flip the orientation of one of the beams relative to the other beam.

For example, prism system 800 reflects one path (817, 819, 823) an even amount of times and the other path (817, 821, and 829) an odd amount of time.

However, if prism system 800 is unfolded, prism system 800 can look like a parallel plate window for each path. Therefore, there can be a transverse and longitudinal chromatic image shift for the radiation beams that enter prism system 800, but there would be no angular deviation of the beams. For example, no angular deviation as a function of wavelength would occur for a wavelength range of interest.

Prism systems of the embodiments of this disclosure can be configured to separate the H and V polarizations of an unpolarized beam and image both H and V polarized beams onto a single detector (e.g., a sensor) at a common focal plane. Additionally or alternatively, the prism systems of the embodiments of this disclosure can mitigate, e.g., prevent or minimize, "ghost" reflections from reaching the detector, which can be close to the prism system. Also, tilted surfaces of the prism systems of the embodiments of this disclosure can minimize chromatic aberration (e.g., lateral chromatic aberration) by making the prism system to function as a plano-parallel plate in both H and V polarization beams lightpaths.

Figure 8D:
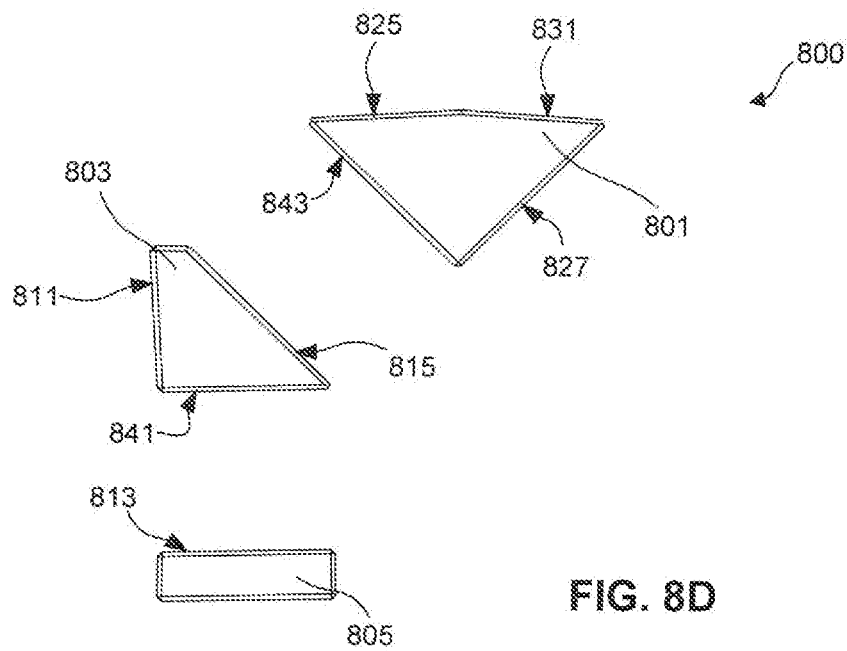
FIG. 8D illustrates an exemplary exploded view of the separate optical elements of an exemplary prism system, according to an exemplary embodiment.

FIG. 8D illustrates an expanded view of prism system 800, according to an embodiment of this disclosure. According to some examples, optical element 801 can include tilted surfaces 825 and 831, and surfaces 827 and 843. Tilted surfaces 825 and 831 can include an anti-reflective (AR) coating for radiation beams at a wavelength range of about 410 nm to about 900 nm. Surface 827 of optical element 801 can be uncoated and can be used for TIR. Similarly, surface 843 of optical element 801 can be an uncoated surface. It is noted that the embodiments of this disclosure are not limited to these examples and other coating and/or optical devices can be used for surfaces of optical element 801.

According to some examples, optical element 803 can include surfaces 811, 815, and 841. As discussed above, surface 811 is a tilted surface. According to some examples, surface 811 can include an anti-reflective (AR) coating for radiation beams at a wavelength range of about 410 nm to about 900 nm. Surface 841 of optical element 803 can include an uncoated surface, according to some embodiments. Surface 815 of optical element 803 can include a polarizing beam splitter (PBS) coating, according to some embodiments. For example, surface 815 of optical element 803 can include a PBS coating for radiation beams at a wavelength range of about 410 nm to about 900 nm. It is noted that the embodiments of this disclosure are not limited to these examples and other coating and/or optical devices can be used for surfaces of optical element 803.

According to some examples, surface 815 of optical element 803 can be coupled to surface 843 of optical element 801. In one example, surface 815 of optical element 803 can be coupled to surface 843 of optical element 801 using, for example, an adhesive (e.g., an optical cement.) For example, an adhesive bonded surface can be placed between surfaces 815 and 843 to couple optical elements 803 and 801. Additionally or alternatively, surface 815 of optical element 803 can be optically coupled and/or contacted to surface 843 of optical element 801 (for example using an optically contacted surface.)

According to some examples, optical element 805 can include a surface 813. Surface 813 can include a mirror with a QWP applied to the surface of the mirror, according to some embodiments. According to one example, the QWP can include a quarter-wave polymer. However, the embodiments of this disclosure are not limited to quarter-wave polymer and any quarter-wave retarder can be used. Surface 813 of optical element 805 can be coupled to surface 841 of optical element 803. In one example, surface 813 of optical element 805 can be coupled to surface 841 of optical element 803 using, for example, an adhesive (e.g., an optical cement.) For example, an adhesive bonded surface can be placed between surfaces 813 and 841 to couple optical elements 805 and 803. Additionally or alternatively, surface 813 of optical element 905 can be optically coupled and/or contacted to surface 841 of optical element 803 (for example using an optically contacted surface.)

Figure 9A:
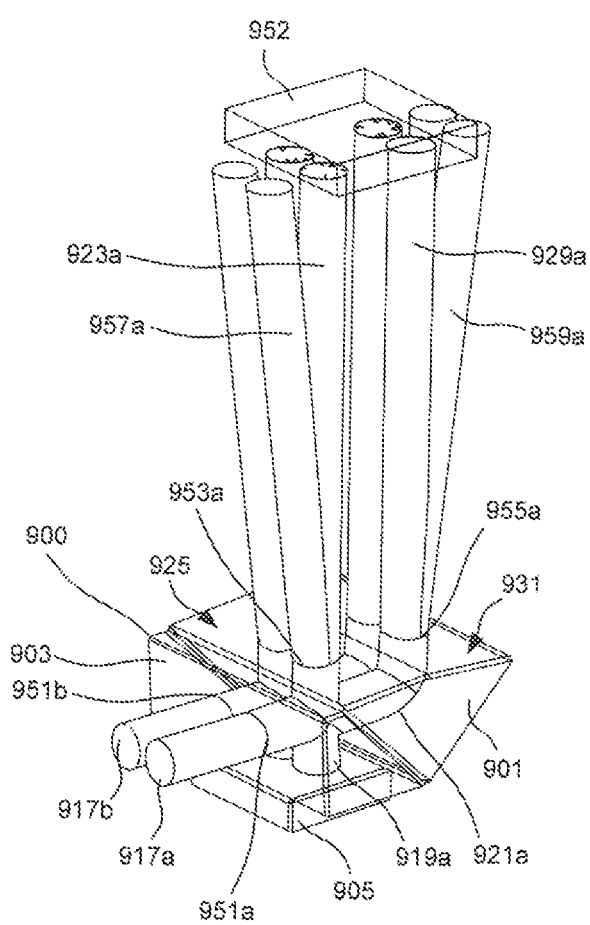
FIGS. 9A and 9B illustrate an exemplary prism system and paths of radiation beams, according to various exemplary embodiments.
Figure 9B:
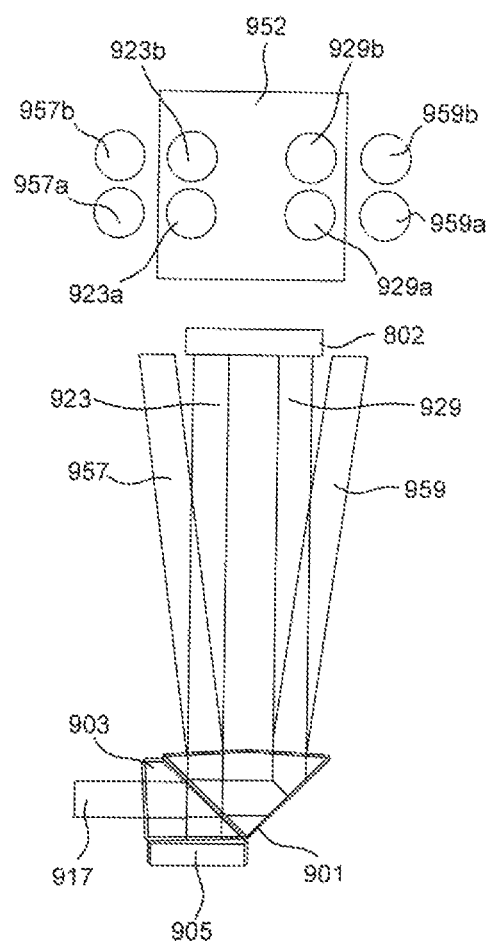

FIGS. 9A and 9B illustrate the prism system and a detector, according to some embodiments of this disclosure. FIGS. 9A and 9B illustrate how tilted output surfaces of the prism systems can minimize "ghost" reflections. As illustrated, prism system 900 is configured to receive one or more radiation beams and output two radiation beams for each input radiation beam.

For example, prism system 900 is configured to receive radiation beams 917a and 917b. In one example, radiation beam 917a can be a reflected and/or scattered radiation beam reflected and/or scattered from a wafer, as discussed above, for example, with respect to FIGS. 4-6. Radiation beam 917b can include a reference radiation beam as discussed above, for example, with respect to FIGS. 4-6. However, the embodiments of this disclosure are not limited to two input radiation beams and the prism systems of this disclosure can be configured to receive any number of radiation beams (one or more radiation beams.)

According to one example, radiation beam 917a enters optical element 903 at 951a. In this example, radiation beam 917b can enter optical element 903 at 951b. It is noted the embodiments of FIGS. 9A and 9B are discussed herein with respect to radiation beam 917a. Similar discussions are applicable to radiation beam 917b.

After entering optical element 903, radiation beam 917a is split into two sub-beams 919a and 921a using the PBS surface of optical element 903. Sub-beam 919a passes through and is reflected from mirror with QWP of optical element 905 as sub-beam 923a. Sub-beam 923a passes through and outputs optical element 901 at 953a. Sub-beam 923a is detected by detector 952. In some embodiment, detector 952 includes detector 4 of FIG. 4, and/or detector 18 of FIG. 5 and/or FIG. 6.

Sub-beam 921a is transmitted through PBS surface of optical element 903, is reflected within optical element 901 as sub-beam 929a, and outputs optical element 901 at 955a. Sub-beam 929a is detected by detector 952. In one example, detector 952 can be a single detector on which sub-beams 923a, 923b, 929a, and 929b are imaged.

According to some embodiments, a portion of sub-beam 923a and/or a portion of sub-beam 929a can be reflected from detector 952. The reflected portions of sub-beams 923a and 929a can travel to prism system 900 at the same or substantially the same trace as sub-beams 923a and 929a. The reflected portions of sub-beams 923a and 929a can further be reflected from output surfaces 925 and 931, respectively, of optical element 901. Since surfaces 925 and 931 of optical element 901 are tilted, the reflected beams 957a and 959a can diverge from sub-beams 923a and 929a. Therefore, detector 952 will not detect the reflected beams 957a and 959a. As discussed above, the tilt of surfaces 925 and 931 of optical element 901 can be designed based on, for example, the distance between prism system 900 and detector 952 such that detector 952 will not detect the reflected beams 957a and 959a.

In addition to the tilted output surfaces 925 and 931, the tilted input surface of optical element 901 can diverge any beam that is reflected from detector 952 and is passed through prism system 900. According to some examples, the reflected portions of sub-beams 923a and 929a can travel to prism system 900 at the same or substantially the same trace as sub-beams 923a and 929a and enter prism system 900. These reflected portions of sub-beams 923a and 929a can then be reflected from tilted surface 811 (as illustrated in FIGS. 8A-8D) of optical element 903. Since the surface 811 (as illustrated in FIGS. 8A-8D) of optical element 803 is also tilted, when the reflected portions of sub-beams 923a and 929a reflect from surface 811, they will follow a different path than sub-beams 923a and 929a and will not be detected by detector 952.

FIGS. 10-37 illustrate exemplary prism systems, according to some embodiments of this disclosure. According to some embodiments, prism system 600 of FIG. 6 can include prism systems of FIGS. 10-37. The prism systems of the embodiments of this disclosure can be used with other optical systems, such as, but not limited to, lithographic apparatus 100 and/or 100', lithocell 300, scatterometer SM1, scatterometer SM2, and/or other optical systems. Prism systems of FIGS. 10-37 can be located near detector 4 of FIG. 4, and/or detector 18 of FIG. 5 and/or FIG. 6, and can be configured to receive the reference radiation beam and/or the scattered and/or reflected radiation beam, as discussed above with respect to FIGS. 4-6. However, prism systems of FIGS. 10-37 can be located in any location of a lithographic apparatus, a metrology apparatus, etc.

It is noted that although the input and output surfaces of some of the prism systems of the embodiments of this disclosure are not illustrated as tilted surfaces, the input and output surfaces of the prism systems of this disclosure can be tilted as discussed above with respect to, for example, FIGS. 8A-8D and 9A-9B to accomplish some "ghost" mitigation.

Figure 10A:
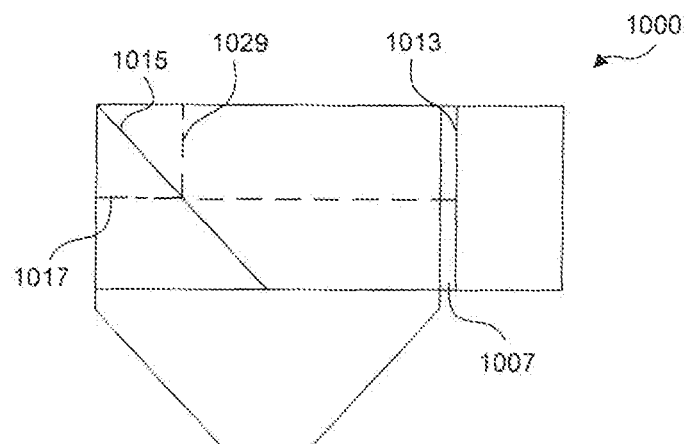
Figure 10B:
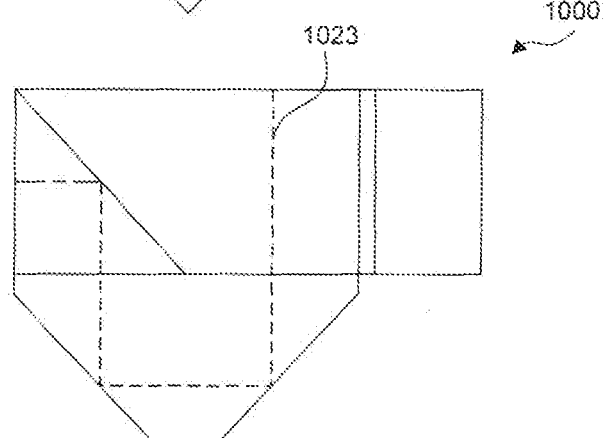
Figure 10C:
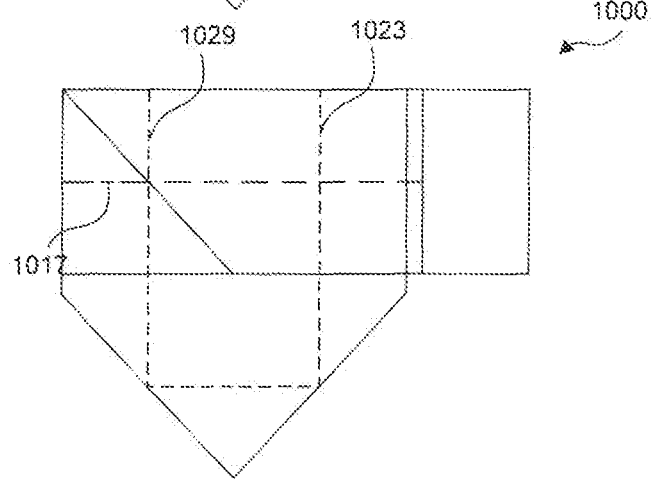

FIGS. 10A-10C illustrate prism system 1000, according to some embodiments of this disclosure. Prism system 1000 includes a plurality of optical elements including polarizing beam splitter surface 1015, QWP 1007, and mirror surface 1013. FIG. 10A illustrates the input radiation beam 1017 and the optical path of sub-beam 1029 that passes through polarizing beam splitter surface 1015, is reflected by mirror surface 1013, passes through QWP 1007 twice, and is reflected by polarizing beam splitter surface 1015 to output from prism system 1000. According to one example, sub-beam 1029 has P polarization orientation at PBS surface 1015 before passing through QWP 1007 twice. Sub-beam 1029 at output of prism system 1000 has S polarization orientation at PBS surface 1015. FIG. 10B illustrates the optical path of sub-beam 1023, which is reflected by polarizing beam splitter surface 1015 and is reflected through an optical element of prism system 1000 using, for example, TIR to output from prism system 1000. According to one example, sub-beam 1023 has S polarization orientation at PBS surface 1015. FIG. 10C illustrates the optical paths for both sub-beams 1023 and 1029.

According to some examples, prism system 1000 can be designed with tilted input surface and/or roof-shaped output surfaces (two tilted output surfaces) to mitigate "ghost" reflections. Additionally or alternatively, prism system 1000 can achieve a predetermined polarization extinction ratio. Also, sub-beams 1023 and 1029 can travel the same or substantially the same optical path distances within prism system 1000.

Figure 11A:
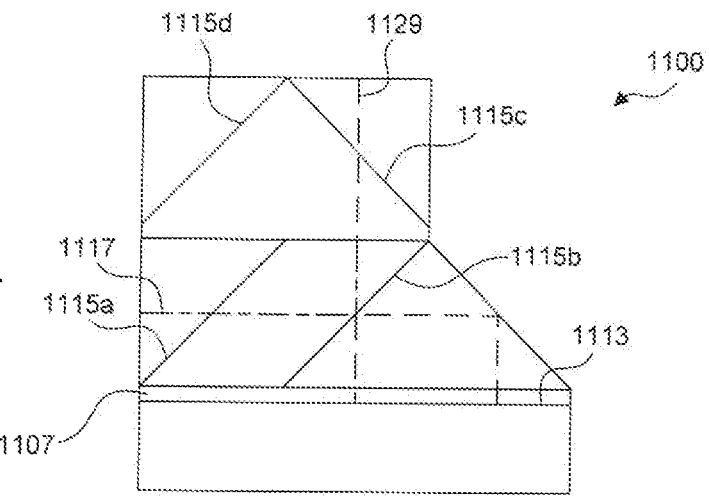
Figure 11B:
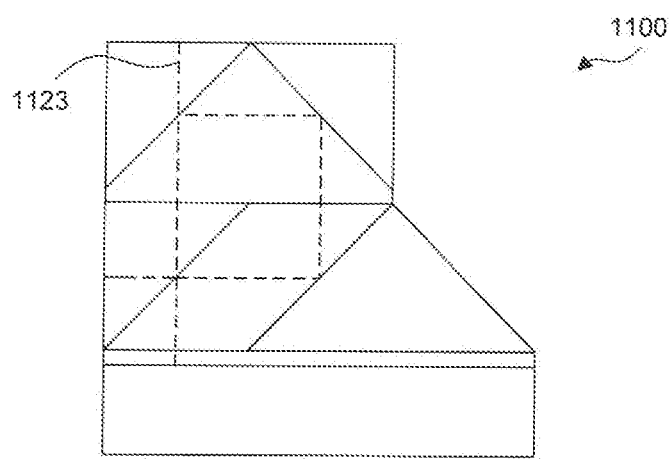
Figure 11C:
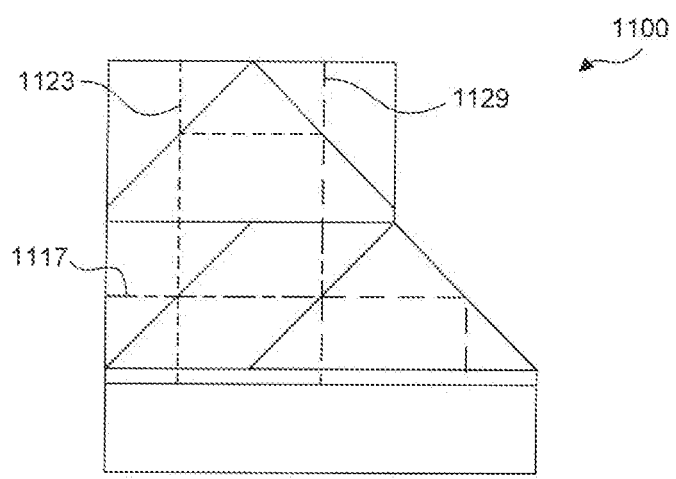

FIGS. 11A-11C illustrate prism system 1100, according to some embodiments of this disclosure. Prism system 1100 includes a plurality of optical elements including polarizing beam splitter surfaces 1115a-1115d, QWP 1107, and mirror surface 1113. FIG. 11A illustrates the input radiation beam 1117 and the optical path of sub-beam 1129 that passes through polarizing beam splitter surfaces 1115a and 1115b, is reflected by mirror surface 1113, passes through QWP 1107 two times, is reflected from PBS surface 1115b, is reflected from mirror surface 1113, transmitted through QWP 1107 two times again, and is transmitted through polarizing beam splitter surfaces 1115b and 1115c to output from prism system 1100. According to one example, sub-beam 1129 has P polarization orientation at PBS surfaces 1115a, 1115b and 1115c when is transmitted through them. Sub-beam 1129 has S polarization orientation at PBS surface 1115b when is reflected by it. FIG. 11B illustrates the optical path of sub-beam 1123, which is reflected by polarizing beam splitter surfaces 1115a, 1115d, 1115c, 1115b and then 1115a again to direct it at mirror surface 1113. This sub-beam then is transmitted through PBS surfaces 1115a and 1115d after passing twice through QWP 1107. FIG. 11C illustrates the optical paths for both sub-beams 1123 and 1129.

According to some examples, prism system 1100 can be designed with tilted input surface and/or roof-shaped output surfaces (two tilted output surfaces) to mitigate "ghost" reflections. Additionally or alternatively, prism system 1100 can achieve a predetermined polarization extinction ratio. Also, sub-beams 1123 and 1129 can travel the same or substantially the same optical path distances within prism system 1100.

Figure 12A:
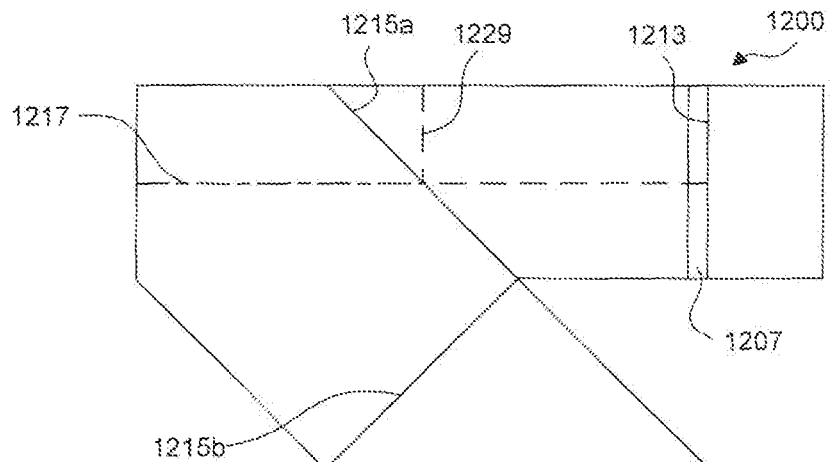
Figure 12B:
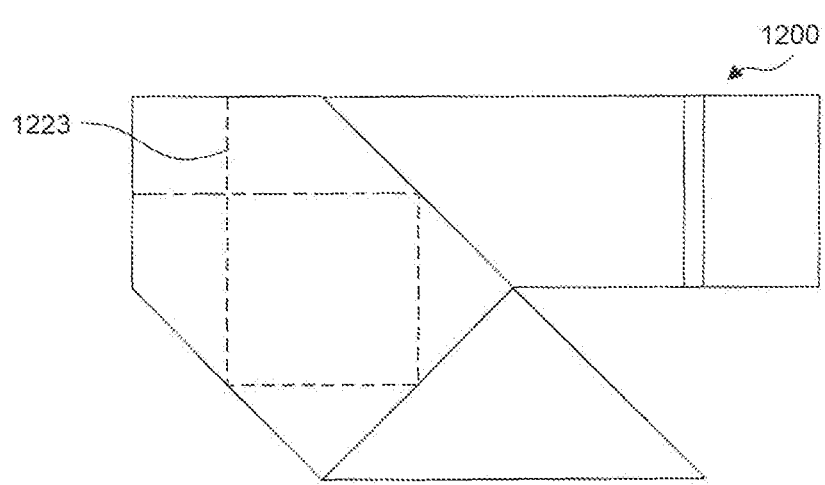
Figure 12C:
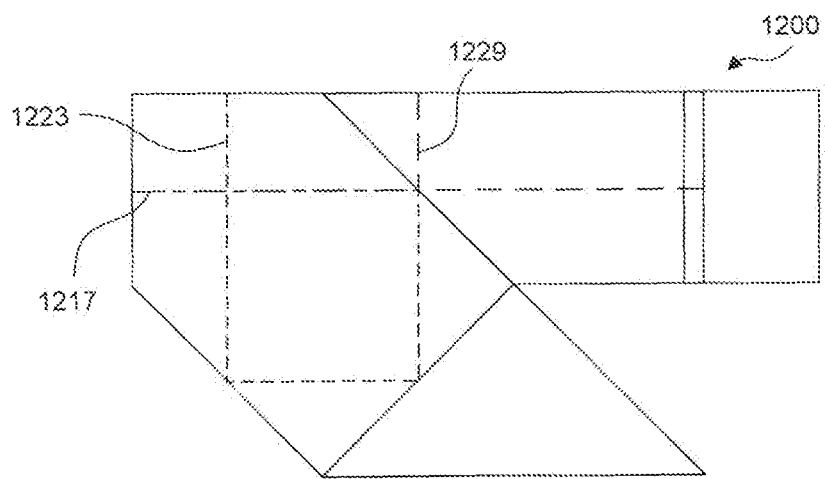

FIGS. 12A-12C illustrate prism system 1200, according to some embodiments of this disclosure. Prism system 1200 includes a plurality of optical elements including polarizing beam splitter surfaces 1215a and 1215b, QWP 1207, and mirror surface 1213. FIG. 12A illustrates the input radiation beam 1217 and the optical path of sub-beam 1229 that passes through polarizing beam splitter surface 1215a, is reflected by mirror surface 1213, passes through QWP 1207 twice, and is reflected by polarizing beam splitter surface 1215a to output from prism system 1200. According to one example, sub-beam 1229 has P polarization orientation at surface 1215a before passing through QWP 1207 twice. Sub-beam 1229 has S polarization orientation when it reflects from surface 1215a. FIG. 12B illustrates the optical path of sub-beam 1223, which is reflected by polarizing beam splitter surfaces 1215a and 1215b and is reflected through an optical element of prism system 1200 using, for example, TIR to output from prism system 1200. According to one example, sub-beam 1223 has S polarization orientation at surfaces 1215a and 1215b. FIG. 12C illustrates the optical paths for both sub-beams 1223 and 1229.

According to some examples, prism system 1200 can be designed with tilted input surface and/or roof-shaped output surfaces (two tilted output surfaces) to mitigate "ghost" reflections. Additionally or alternatively, prism system 1200 can achieve a predetermined polarization extinction ratio. Also, sub-beams 1223 and 1229 can travel the same or substantially the same optical path distances within prism system 1200.

Figure 13A:
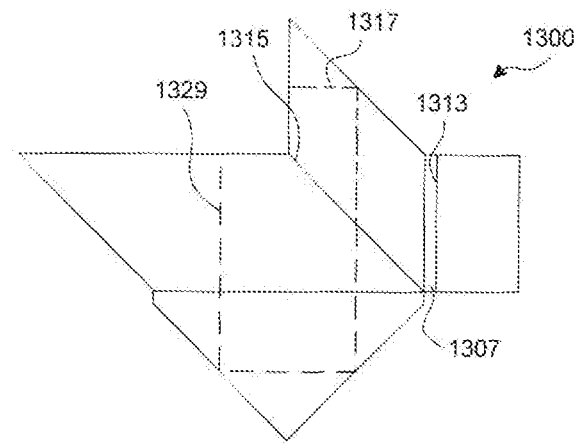
Figure 13B:
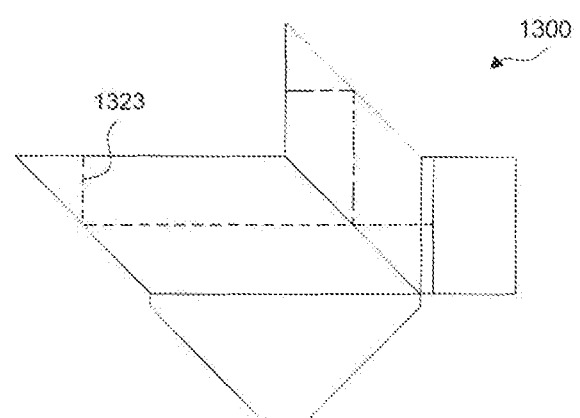
Figure 13C:
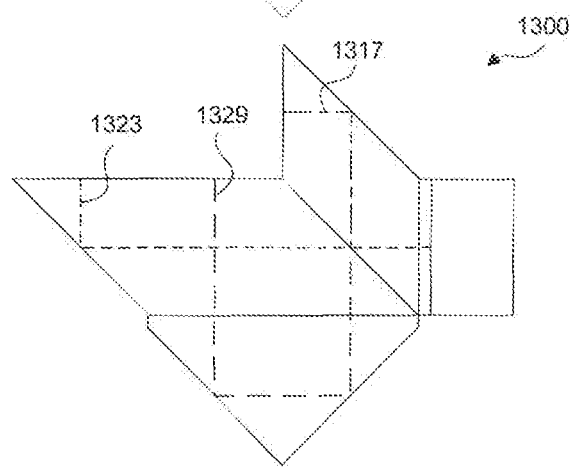

FIGS. 13A-13C illustrate prism system 1300, according to some embodiments of this disclosure. Prism system 1300 includes a plurality of optical elements including polarizing beam splitter surface 1315, QWP 1307, and mirror surface 1313. FIG. 13A illustrates the input radiation beam 1317 and the optical path of sub-beam 1329, which is transmitted through polarizing beam splitter surface 1315 and is reflected through an optical element of prism system 1300 using, for example, TIR to output from prism system 1300. According to one example, sub-beam 1329 has P polarization orientation at PBS surface 1315. FIG. 13B illustrates the optical path of sub-beam 1323 that is reflected by polarizing beam splitter surface 1315, is reflected by mirror surface 1313, passes through QWP 1307 twice to output from prism system 1300. According to one example, sub-beam 1323 has S polarization orientation at PBS surface 1315 before passing through QWP 1307 twice. Sub-beam 1323 at output of prism system 1300 has the same polarization orientation as that of the beam 1329. FIG. 13C illustrates the optical paths for both sub-beams 1323 and 1329.

According to some examples, prism system 1300 can be designed with tilted input surface and/or roof-shaped output surfaces (two tilted output surfaces) to mitigate "ghost" reflections. Additionally or alternatively, prism system 1300 can achieve a predetermined polarization extinction ratio. Also, sub-beams 1323 and 1329 can travel the same or substantially the same optical path distances within prism system 1300.

Figure 14A:
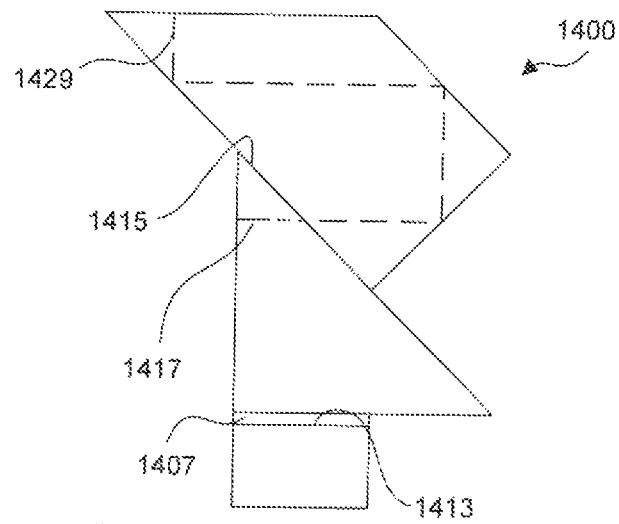
Figure 14B:
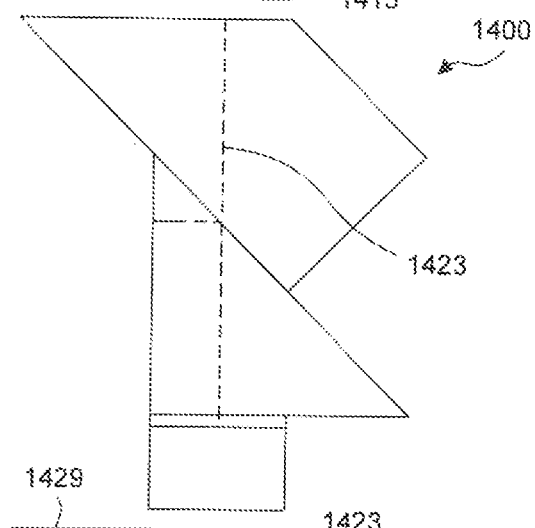
Figure 14C:
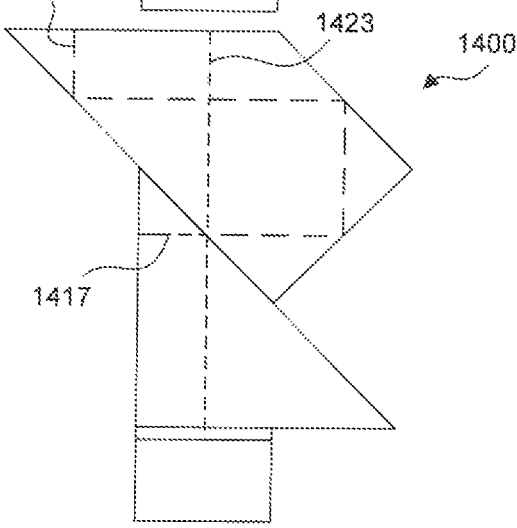

FIGS. 14A-14C illustrate prism system 1400, according to some embodiments of this disclosure. Prism system 1400 includes a plurality of optical elements including polarizing beam splitter surface 1415, QWP 1407, and mirror surface 1413. FIG. 14A illustrates the input radiation beam 1417 and the optical path of sub-beam 1429, which is transmitted through polarizing beam splitter surface 1415 and is reflected through an optical element of prism system 1400 using, for example, TIR to output from prism system 1400. According to one example, sub-beam 1429 has P polarization orientation at PBS surface 1415. FIG. 14B illustrates the optical path of sub-beam 1423 that is reflected by polarizing beam splitter surface 1415, is reflected by mirror surface 1413, passes through QWP 1407 twice to output from prism system 1400. According to one example, sub-beam 1423 has S polarization orientation at PBS surface 1415 before passing through QWP 1407 twice. Sub-beam 1423 at output of prism system 1400 has the same polarization orientation as that of the beam 1429. FIG. 14C illustrates the optical paths for both sub-beams 1423 and 1429.

According to some examples, prism system 1400 can be designed with tilted input surface and/or roof-shaped output surfaces (two tilted output surfaces) to mitigate "ghost" reflections. Additionally or alternatively, prism system 1400 can achieve a predetermined polarization extinction ratio. Also, sub-beams 1423 and 1429 can travel the same or substantially the same optical path distances within prism system 1400.

Figure 15A:
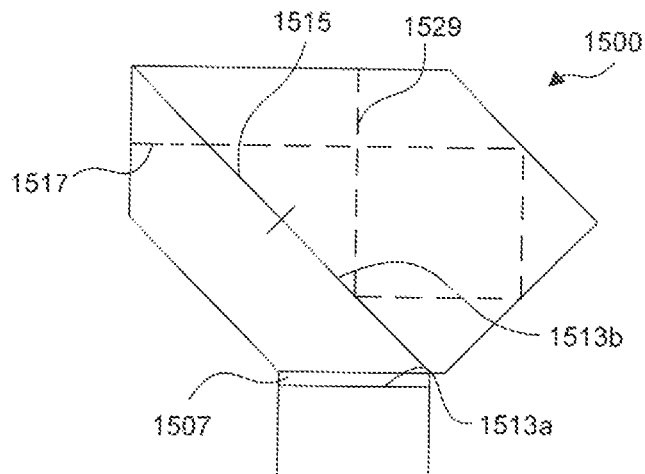
Figure 15B:
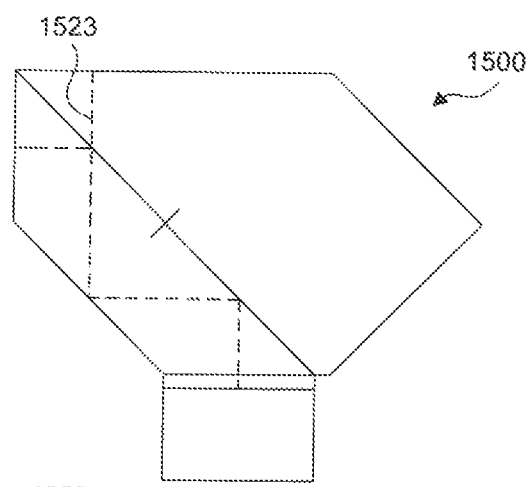
Figure 15C:
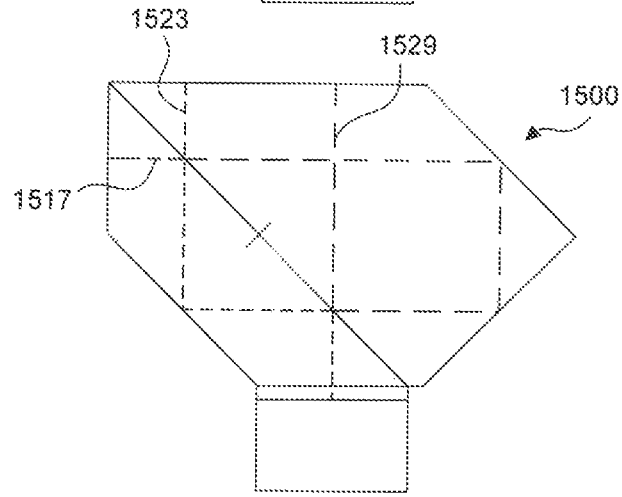

FIGS. 15A-15C illustrate prism system 1500, according to some embodiments of this disclosure. Prism system 1500 includes a plurality of optical elements including polarizing beam splitter surface 1515, QWP 1507, and mirror surfaces 1513a and 1513b. FIG. 15A illustrates the input radiation beam 1517 and the optical path of sub-beam 1529, which is transmitted through polarizing beam splitter surface 1515, is reflected through an optical element of prism system 1500 using, for example, TIR, and is reflected by mirror surface 1513b to output from prism system 1500. According to one example, sub-beam 1529 has P polarization orientation at PBS surface 1515. FIG. 15B illustrates the optical path of sub-beam 1523 that is reflected by polarizing beam splitter surface 1515, is reflected by mirror surfaces 1513b and 1513a, passes through QWP 1507 twice to output from prism system 1500. According to one example, sub-beam 1523 has S polarization orientation at PBS surface 1515 before passing through QWP 1507 twice. Sub-beam 1523 at output of prism system 1500 has the same polarization orientation as that of the beam 1529. FIG. 15C illustrates the optical paths for both sub-beams 1523 and 1529.

According to some examples, prism system 1500 can be designed with tilted input surface and/or roof-shaped output surfaces (two tilted output surfaces) to mitigate "ghost" reflections. Additionally or alternatively, prism system 1500 can achieve a predetermined polarization extinction ratio. Also, sub-beams 1523 and 1529 can travel the same or substantially the same optical path distances within prism system 1500.

Figure 16A:
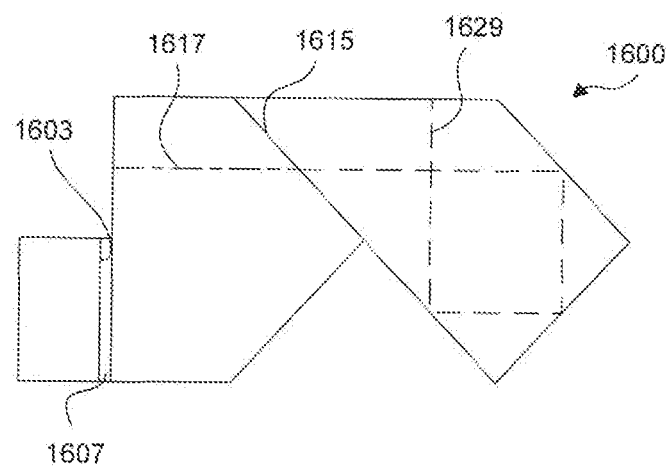
Figure 16B:
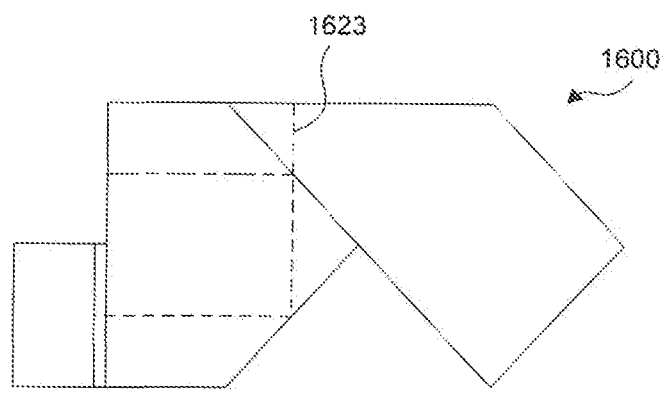
Figure 16C:
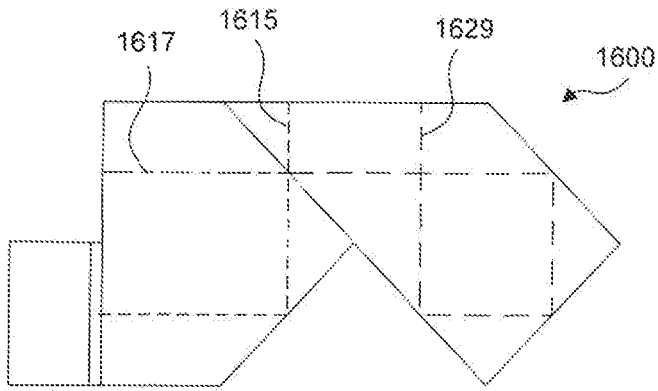

FIGS. 16A-16C illustrate prism system 1600, according to some embodiments of this disclosure. Prism system 1600 includes a plurality of optical elements including polarizing beam splitter surface 1615, QWP 1707, and mirror surface 1613. FIG. 16A illustrates the input radiation beam 1617 and the optical path of sub-beam 1629, which is transmitted through polarizing beam splitter surface 1615 and is reflected through an optical element of prism system 1600 using, for example, TIR to output from prism system 1600. According to one example, sub-beam 1629 has P polarization orientation at PBS surface 1615. FIG. 16B illustrates the optical path of sub-beam 1623 that is reflected by polarizing beam splitter surface 1615, is reflected through an optical element of prism system 1600 using, for example, TIR, is reflected by mirror surface 1613, passes through QWP 1607 twice to output from prism system 1600. According to one example, sub-beam 1623 has S polarization orientation at PBS surface 1615 before passing through QWP 1607 twice. Sub-beam 1623 at output of prism system 1600 has the same polarization orientation as that of the beam 1629. FIG. 16C illustrates the optical paths for both sub-beams 1623 and 1629.

According to some examples, prism system 1600 can be designed with tilted input surface and/or roof-shaped output surfaces (two tilted output surfaces) to mitigate "ghost" reflections. Additionally or alternatively, prism system 1600 can achieve a predetermined polarization extinction ratio. Also, sub-beams 1623 and 1629 can travel the same or substantially the same optical path distances within prism system 1600.

Figure 17A:
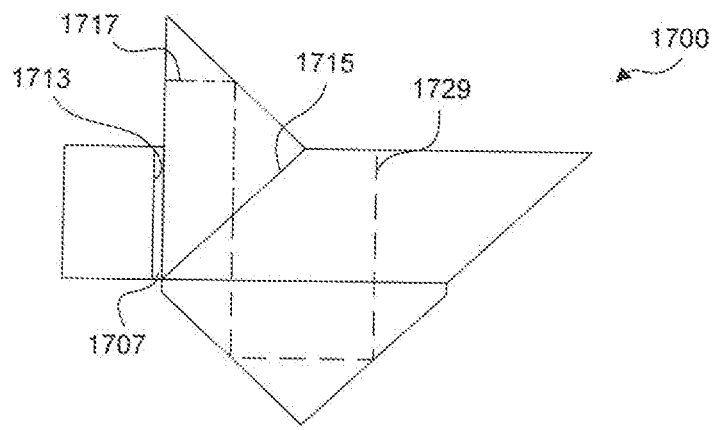
Figure 17B:
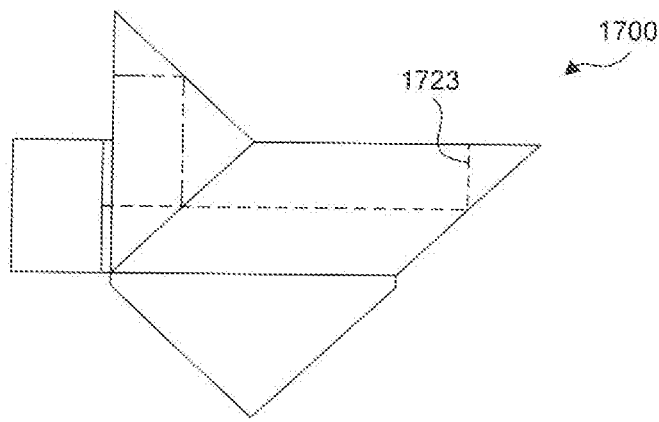
Figure 17C:
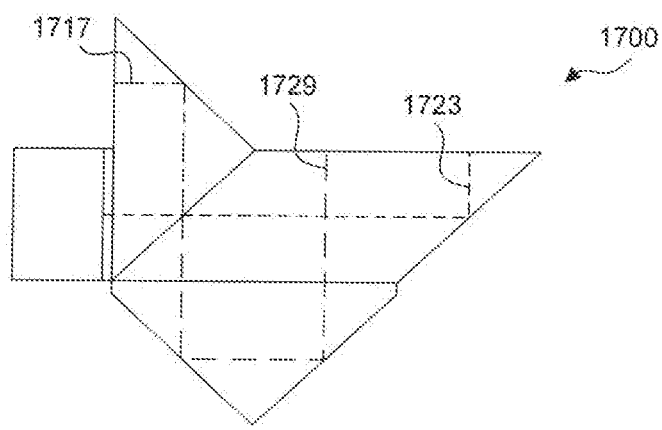

FIGS. 17A-17C illustrate prism system 1700, according to some embodiments of this disclosure. Prism system 1700 includes a plurality of optical elements including polarizing beam splitter surface 1715, QWP 1707, and mirror surface 1713. FIG. 17A illustrates the input radiation beam 1717 and the optical path of sub-beam 1729, which is transmitted through polarizing beam splitter surface 1715 and is reflected through an optical element of prism system 1700 using, for example, TIR to output from prism system 1700. According to one example, sub-beam 1729 has P polarization orientation at PBS surface 1715. FIG. 17B illustrates the optical path of sub-beam 1723 that is reflected by polarizing beam splitter surface 1715, is reflected by mirror surface 1713, passes through QWP 1707 twice, is reflected through an optical element of prism system 1700 using, for example, TIR, to output from prism system 1700. According to one example, sub-beam 1723 has S polarization orientation at PBS surface 1715 before passing through QWP 1707 twice. Sub-beam 1723 at output of prism system 1700 has the same polarization orientation as that of the beam 1729. FIG. 17C illustrates the optical paths for both sub-beams 1723 and 1729.

According to some examples, prism system 1700 can be designed with tilted input surface and/or roof-shaped output surfaces (two tilted output surfaces) to mitigate "ghost" reflections. Additionally or alternatively, prism system 1700 can achieve a predetermined polarization extinction ratio. Also, sub-beams 1723 and 1729 can travel the same or substantially the same optical path distances within prism system 1700.

Figure 18A:
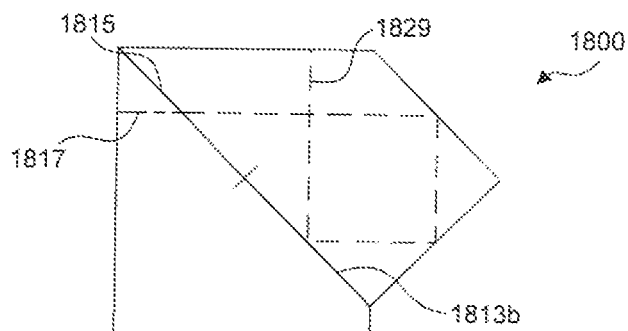
Figure 18B:
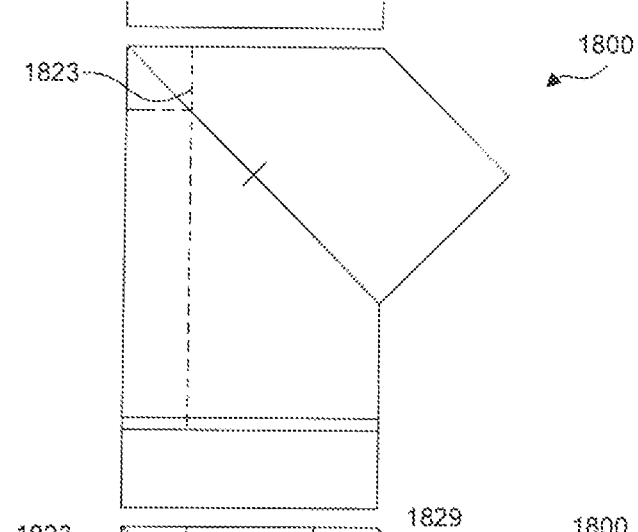
Figure 18C:
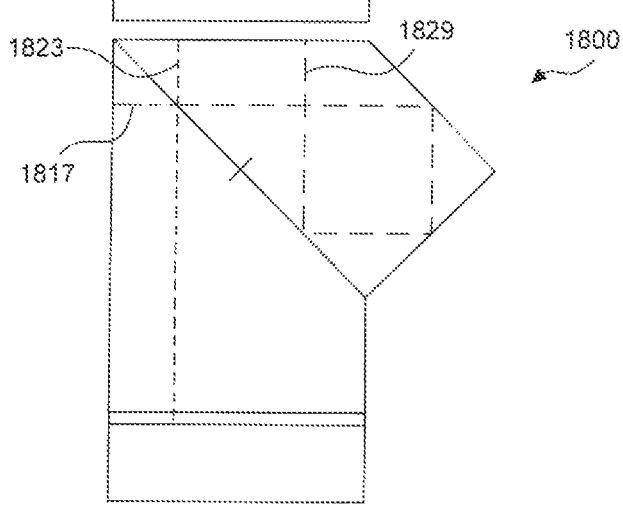

FIGS. 18A-18C illustrate prism system 1800, according to some embodiments of this disclosure. Prism system 1800 includes a plurality of optical elements including polarizing beam splitter surface 1815, QWP 1807, and mirror surfaces 1813a and 1813b. FIG. 18A illustrates the input radiation beam 1817 and the optical path of sub-beam 1829, which is transmitted through polarizing beam splitter surface 1815 and is reflected through an optical element of prism system 1800 using, for example, TIR, and is reflected by mirror surface 1813b to output from prism system 1800. According to one example, sub-beam 1829 has P polarization orientation at PBS surface 1815. FIG. 18B illustrates the optical path of sub-beam 1823 that is reflected by polarizing beam splitter surface 1815, is reflected by mirror surface 1813a, passes through QWP 1807 twice to output from prism system 1800. According to one example, sub-beam 1823 has S polarization orientation at PBS surface 1815 before passing through QWP 1807 twice. Sub-beam 1823 at output of prism system 1800 has the same polarization orientation as that of the beam 1829. FIG. 18C illustrates the optical paths for both sub-beams 1823 and 1829.

According to some examples, prism system 1800 can be designed with tilted input surface and/or roof-shaped output surfaces (two tilted output surfaces) to mitigate "ghost" reflections. Additionally or alternatively, prism system 1800 can achieve a predetermined polarization extinction ratio. Also, sub-beams 1823 and 1829 can travel the same or substantially the same optical path distances within prism system 1800.

Figure 19A:
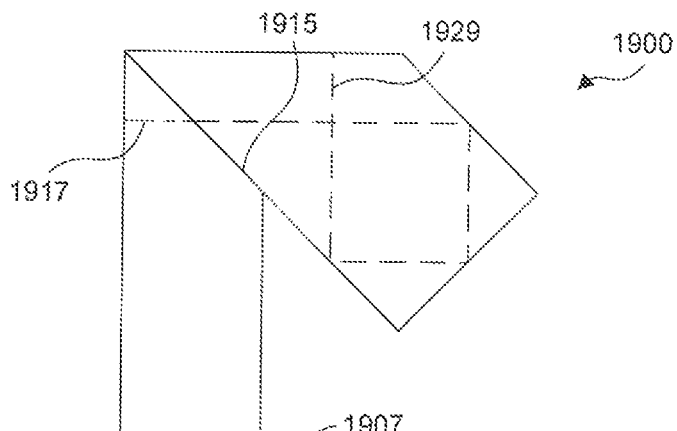
Figure 19B:
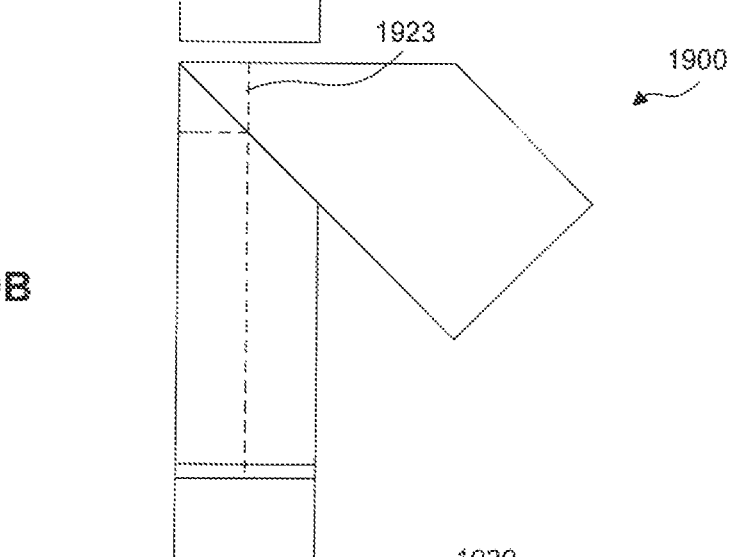
Figure 19C:
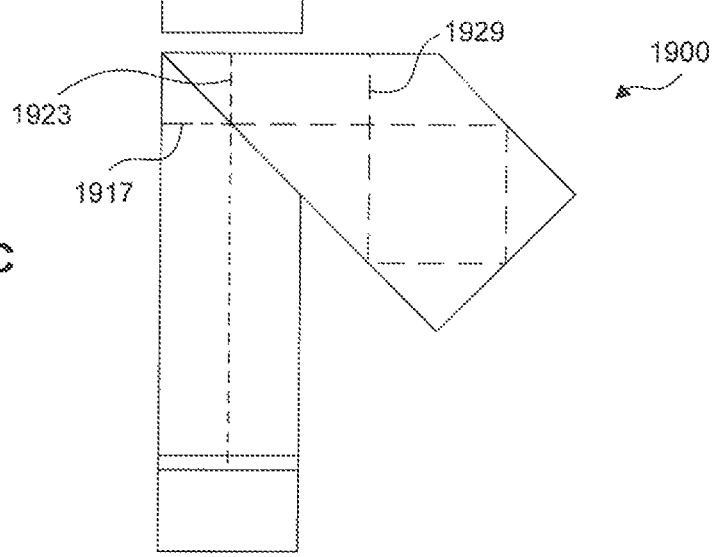

FIGS. 19A-19C illustrate prism system 1900, according to some embodiments of this disclosure. Prism system 1900 includes a plurality of optical elements including polarizing beam splitter surface 1915, QWP 1907, and mirror surface 1913. FIG. 19A illustrates the input radiation beam 1917 and the optical path of sub-beam 1929, which is transmitted through polarizing beam splitter surface 1915 and is reflected through an optical element of prism system 1900 using, for example, TIR. According to one example, sub-beam 1929 has P polarization orientation at PBS surface 1915. FIG. 19B illustrates the optical path of sub-beam 1923 that is reflected by polarizing beam splitter surface 1915, is reflected by mirror surface 1913, passes through QWP 1907 twice to output from prism system 1900. According to one example, sub-beam 1923 has S polarization orientation at PBS surface 1915 before passing through QWP 1907 twice. Sub-beam 1923 at output of prism system 1900 has the same polarization orientation as that of the beam 1929. FIG. 19C illustrates the optical paths for both sub-beams 1923 and 1929.

According to some examples, prism system 1900 can be designed with tilted input surface and/or roof-shaped output surfaces (two tilted output surfaces) to mitigate "ghost" reflections. Additionally or alternatively, prism system 1900 can achieve a predetermined polarization extinction ratio. Also, sub-beams 1923 and 1929 can travel the same or substantially the same optical path distances within prism system 1900.

Figure 20A:
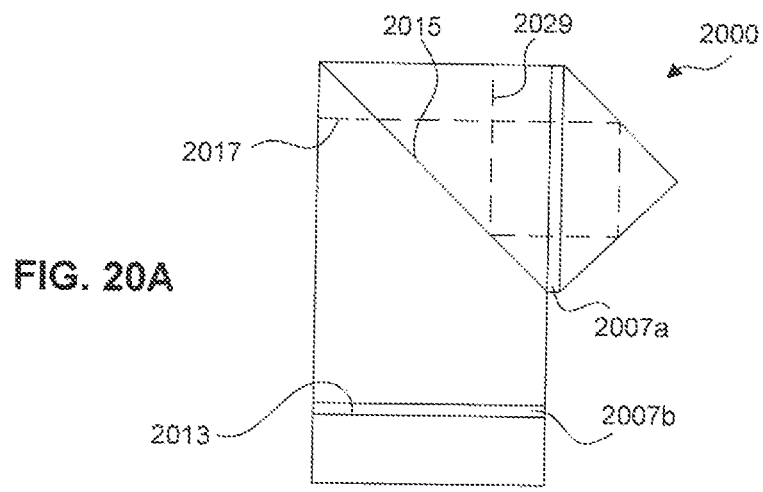
Figure 20B:
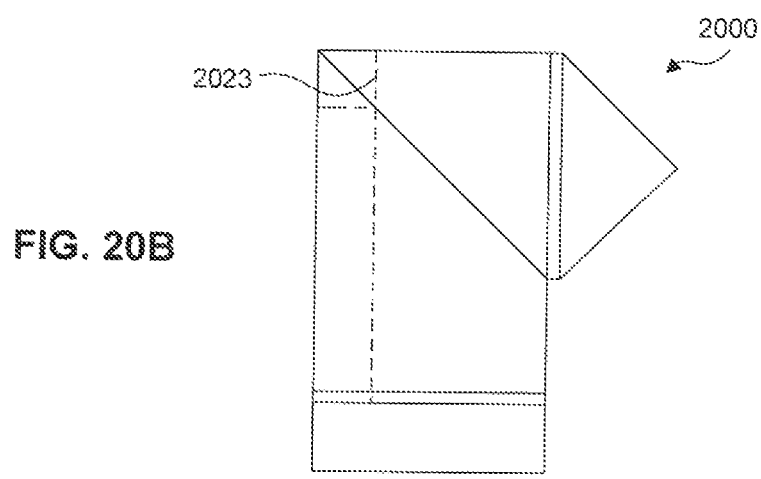
Figure 20C:
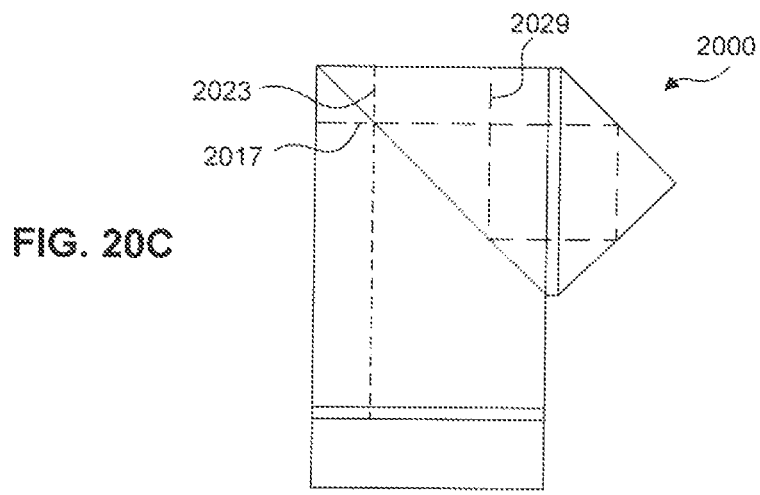

FIGS. 20A-20C illustrate prism system 2000, according to some embodiments of this disclosure. Prism system 2000 includes a plurality of optical elements including polarizing beam splitter surface 2015, QWPs 2007a and 2007b, and mirror surface 2013. FIG. 20A illustrates the input radiation beam 2017 and the optical path of sub-beam 2029, which is transmitted through polarizing beam splitter surface 2015, is passed through QWP 2007a, is reflected through an optical element of prism system 2000 using, for example, TIR, and is passed through QWP 2007a again. According to one example, sub-beam 2029 has S polarization orientation at PBS surface 2015 when it is reflected by PBS surface 2015. FIG. 20B illustrates the optical path of sub-beam 2023 that is reflected by polarizing beam splitter surface 2015, is reflected by mirror surface 2013, passes through QWP 2007b twice to output from prism system 2000. According to one example, sub-beam 2023 has S polarization orientation at PBS surface 2015 before passing through QWP 2007b twice. Sub-beam 2023 has P polarization orientation at PBS surface 2015 when passing through it. FIG. 20C illustrates the optical paths for both sub-beams 2023 and 2029.

According to some examples, prism system 2000 can be designed with tilted input surface and/or roof-shaped output surfaces (two tilted output surfaces) to mitigate "ghost" reflections. Additionally or alternatively, prism system 2000 can achieve a predetermined polarization extinction ratio. Also, sub-beams 2023 and 2029 can travel the same or substantially the same optical path distances within prism system 2000.

Figure 21A:
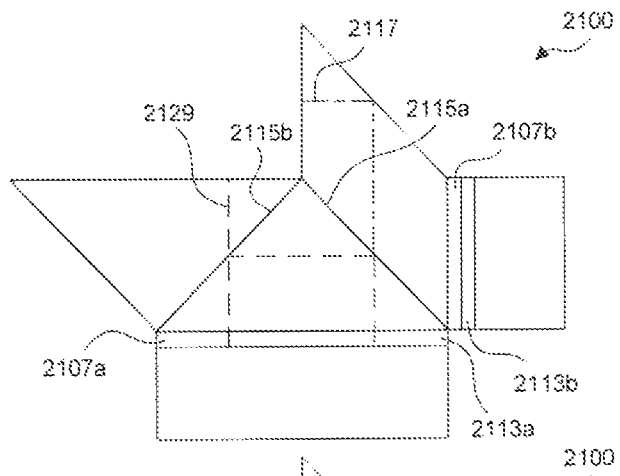
Figure 21B:
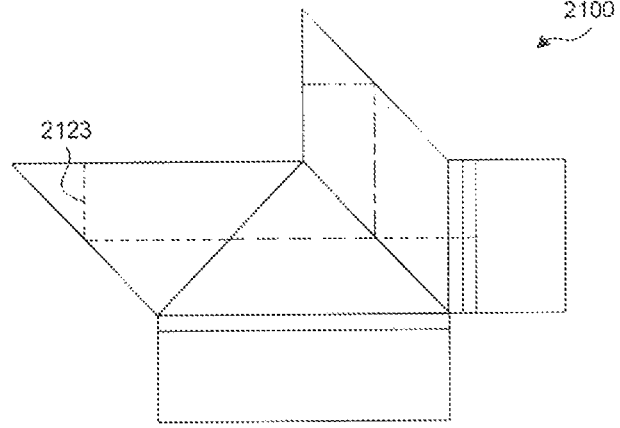
Figure 21C:
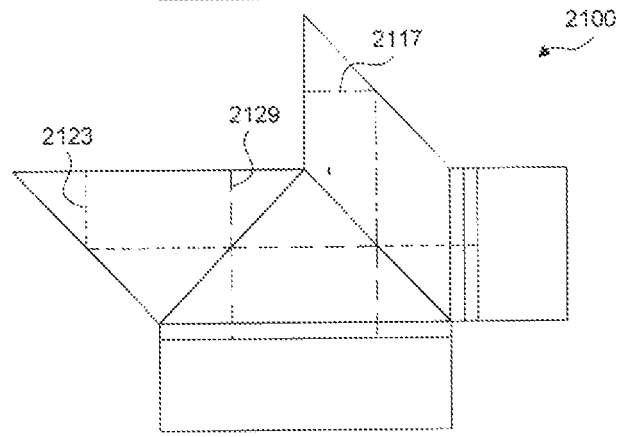

FIGS. 21A-21C illustrate prism system 2100, according to some embodiments of this disclosure. Prism system 2100 includes a plurality of optical elements including polarizing beam splitter surfaces 2115a and 2115b, QWPs 2107a and 2107b, and mirror surfaces 2113a and 2113b. FIG. 21A illustrates the input radiation beam 2117 and the optical path of sub-beam 2129, which is transmitted through polarizing beam splitter surface 2115a, is reflected by mirror surface 2113a, is passed through QWP 2107a twice, and is passed through PBS surface 2115b. According to one example, sub-beam 2129 has P polarization orientation at PBS surface 2115b when it propagates through PBS surface 2115b. FIG. 21B illustrates the optical path of sub-beam 2123 that is reflected by polarizing beam splitter surface 2115a, is reflected by mirror surface 2113b, passes through QWP 2107b twice, is passed through PBS surfaces 2115a and 2115b, and is reflected through an optical element of prism system 2100 using, for example, TIR to output from prism system 2100. According to one example, sub-beam 2123 has S polarization orientation at PBS surface 2115a before passing through QWP 2107b twice. Sub-beam 2123 at output of prism system 2100 has the same polarization orientation as that of the beam 2129. FIG. 21C illustrates the optical paths for both sub-beams 2123 and 2129.

According to some examples, prism system 2100 can be designed with tilted input surface and/or roof-shaped output surfaces (two tilted output surfaces) to mitigate "ghost" reflections. Additionally or alternatively, prism system 2100 can achieve a predetermined polarization extinction ratio. Also, sub-beams 2123 and 2129 can travel the same or substantially the same optical path distances within prism system 2100.

Figure 22A:
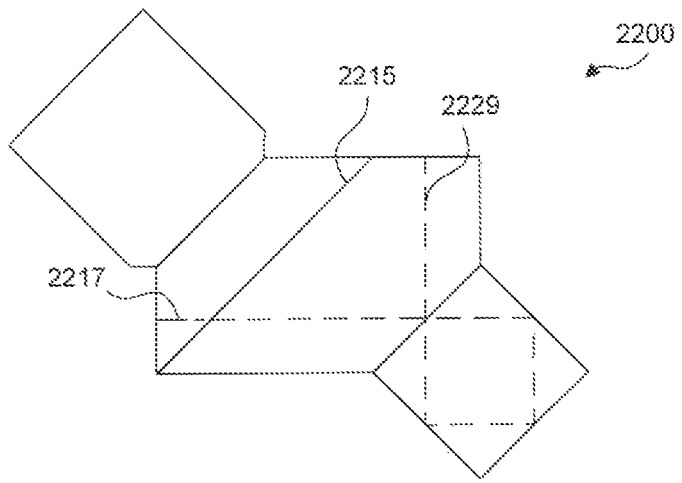
Figure 22B:
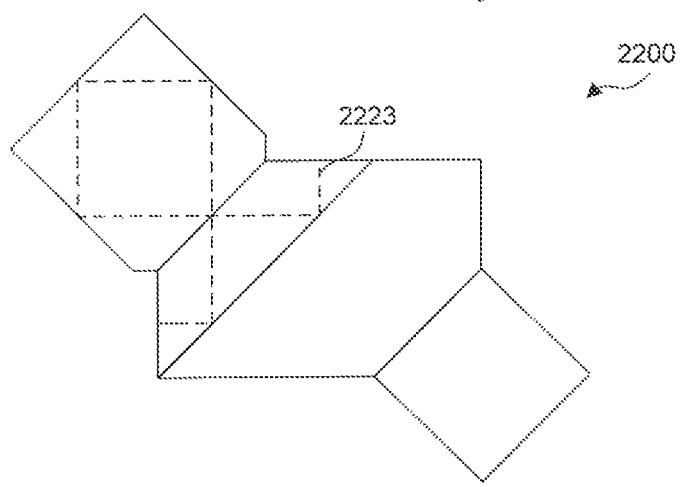
Figure 22C:
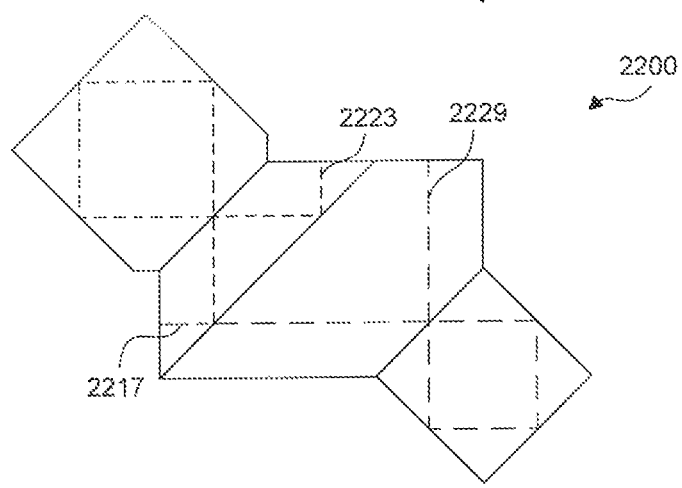

FIGS. 22A-22C illustrate prism system 2200, according to some embodiments of this disclosure. Prism system 2200 includes a plurality of optical elements including polarizing beam splitter surface 2215. FIG. 22A illustrates the input radiation beam 2217 and the optical path of sub-beam 2229, which is transmitted through polarizing beam splitter surface 2215, is reflected through an optical element of prism system 2200 using, for example, TIR. According to one example, sub-beam 2229 has P polarization orientation at PBS surface 2215 when it is transmitted through PBS surface 2215. FIG. 22B illustrates the optical path of sub-beam 2223 that is reflected by polarizing beam splitter surface 2215, is reflected through an optical element of prism system 2200 using, for example, TIR, and is reflected by PBS surface 2215 to output from prism system 2200. According to one example, sub-beam 2223 has S polarization orientation at PBS surface 2215. FIG. 22C illustrates the optical paths for both sub-beams 2223 and 2229.

According to some examples, prism system 2200 can achieve a predetermined polarization extinction ratio. Also, sub-beams 2223 and 2229 can travel the same or substantially the same optical path distances within prism system 2200.

Figure 23A:
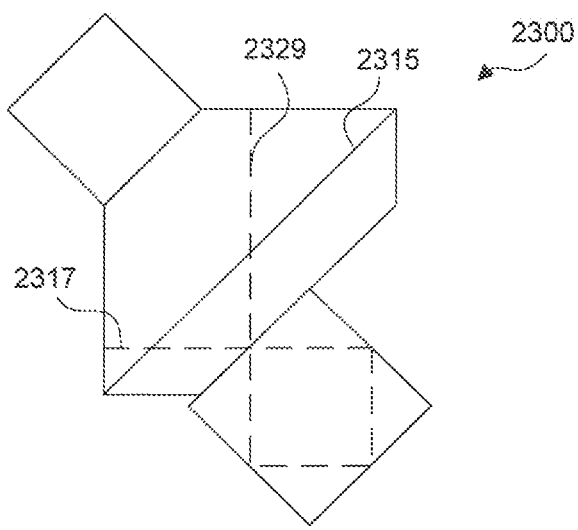
Figure 23B:
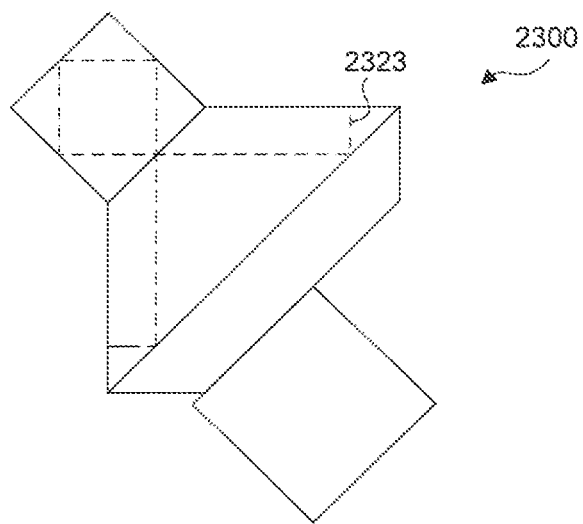
Figure 23C:
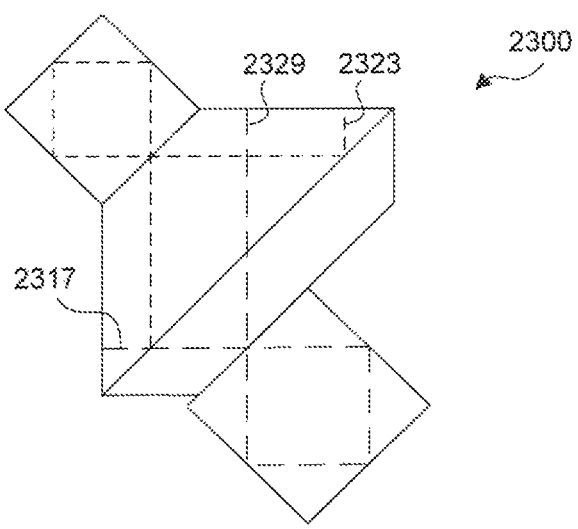

FIGS. 23A-23C illustrate prism system 2300, according to some embodiments of this disclosure. Prism system 2300 includes a plurality of optical elements including polarizing beam splitter surface 2315. FIG. 23A illustrates the input radiation beam 2317 and the optical path of sub-beam 2329, which is transmitted through polarizing beam splitter surface 2315, is reflected through an optical element of prism system 2300 using, for example, TIR. According to one example, sub-beam 2329 has P polarization orientation at PBS surface 2315 when it is transmitted through PBS surface 2315. FIG. 23B illustrates the optical path of sub-beam 2323 that is reflected by polarizing beam splitter surface 2315, is reflected through an optical element of prism system 2300 using, for example, TIR, and is reflected by PBS surface 2315 to output from prism system 2300. According to one example, sub-beam 2323 has S polarization orientation at PBS surface 2315. FIG. 23C illustrates the optical paths for both sub-beams 2323 and 2329.

According to some examples, prism system 2300 can achieve a predetermined polarization extinction ratio. Also, sub-beams 2323 and 2329 can travel the same or substantially the same optical path distances within prism system 2300.

Figure 24A:
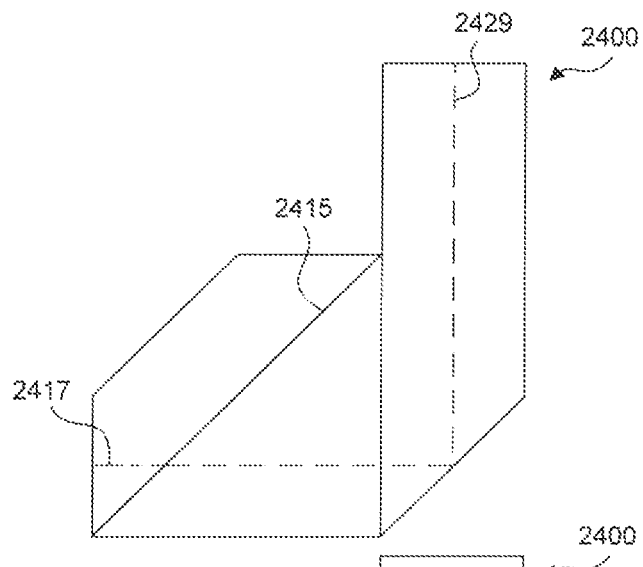
Figure 24B:
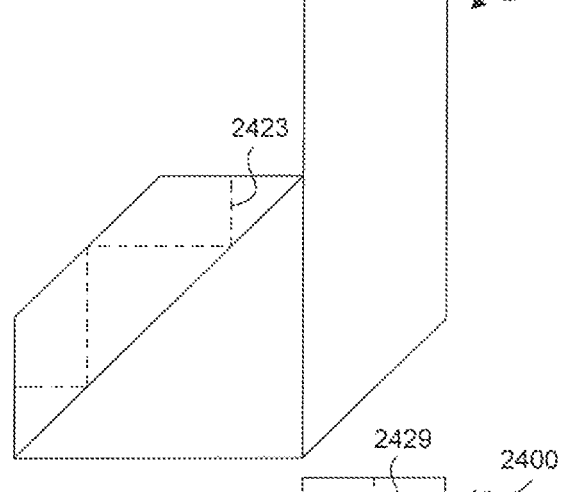
Figure 24C:
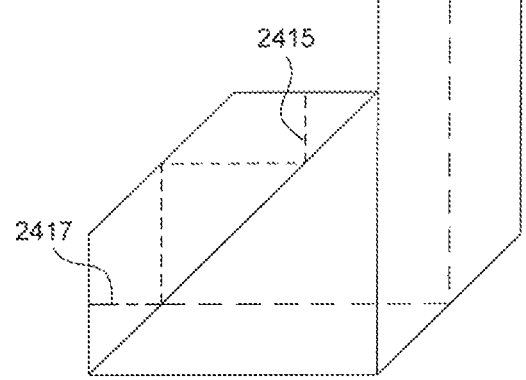

FIGS. 24A-24C illustrate prism system 2400, according to some embodiments of this disclosure. Prism system 2400 includes a plurality of optical elements including polarizing beam splitter surface 2415. FIG. 24A illustrates the input radiation beam 2417 and the optical path of sub-beam 2429, which is transmitted through polarizing beam splitter surface 2415, is reflected through an optical element of prism system 2400 using, for example, TIR. According to one example, sub-beam 2429 has P polarization orientation at PBS surface 2415 when it is transmitted through PBS surface 2415. FIG. 24B illustrates the optical path of sub-beam 2423 that is reflected by polarizing beam splitter surface 2415, is reflected through an optical element of prism system 2400 using, for example, TIR, and is reflected again by PBS surface 2415 to output from prism system 2400. According to one example, sub-beam 2423 has S polarization orientation at PBS surface 2415. FIG. 24C illustrates the optical paths for both sub-beams 2423 and 2429. According to some examples, prism system 2400 can achieve a predetermined polarization extinction ratio.

Figure 25A:
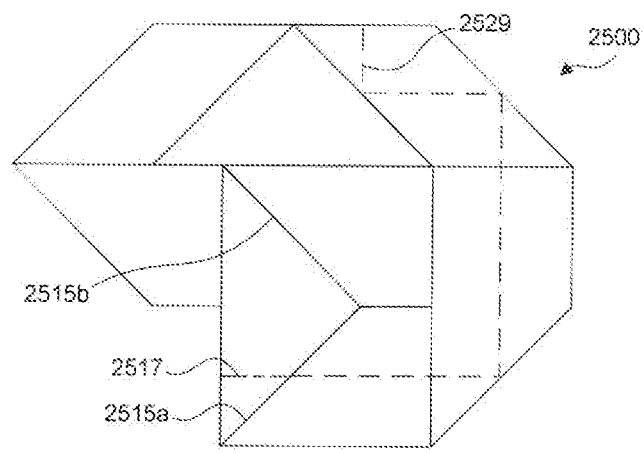
Figure 25B:
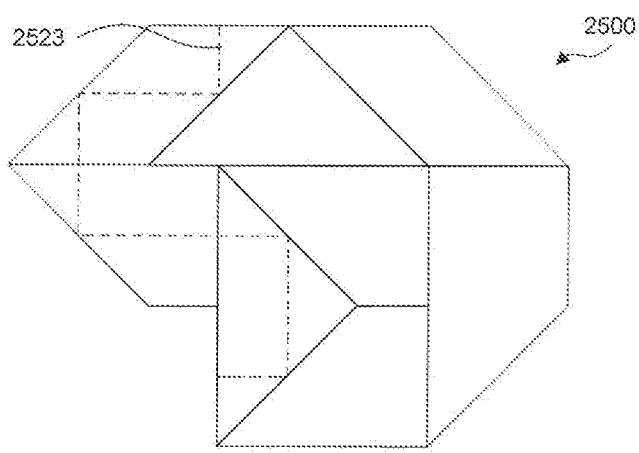
Figure 25C:
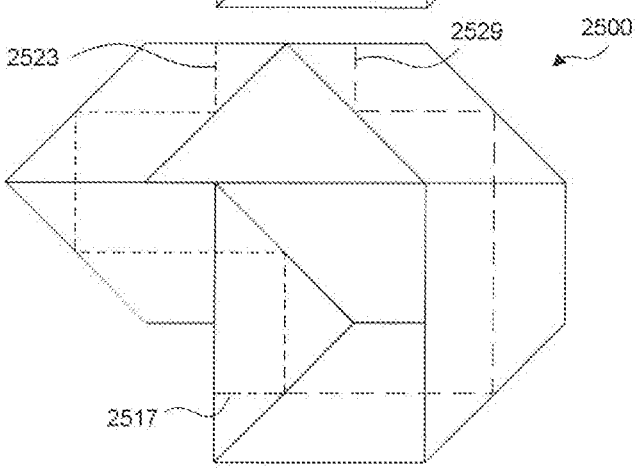

FIGS. 25A-25C illustrate prism system 2500, according to some embodiments of this disclosure. Prism system 2500 includes a plurality of optical elements including polarizing beam splitter surfaces 2515a and 2515b. FIG. 25A illustrates the input radiation beam 2517 and the optical path of sub-beam 2529, which is transmitted through polarizing beam splitter surface 2515a, is reflected through one or more optical elements of prism system 2500 using, for example, TIR. According to one example, sub-beam 2529 has P polarization orientation at PBS surface 2515a when it is transmitted through PBS surface 2515a. FIG. 25B illustrates the optical path of sub-beam 2523 that is reflected by polarizing beam splitter surfaces 2515*a* and 2515*b*, is reflected through one or more optical elements of prism system 2500 using, for example, TIR to output from prism system 2500. According to one example, sub-beam 2523 has S polarization orientation at PBS surface 2515*a*. FIG. 25C illustrates the optical paths for both sub-beams 2523 and 2529.

According to some examples, prism system 2500 can achieve a predetermined polarization extinction ratio. Also, sub-beams 2523 and 2539 can travel the same or substantially the same optical path distances within prism system 2500.

Figure 26A:
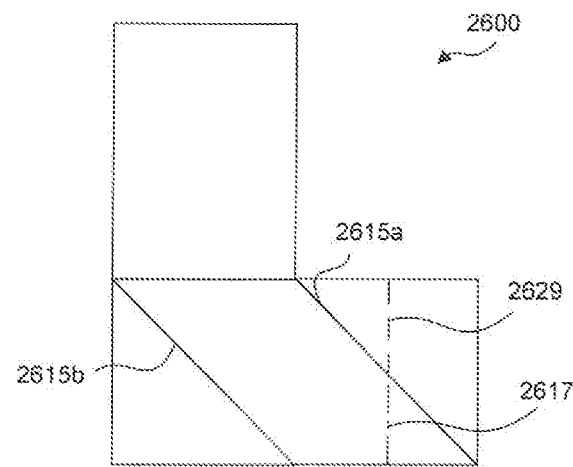
Figure 26B:
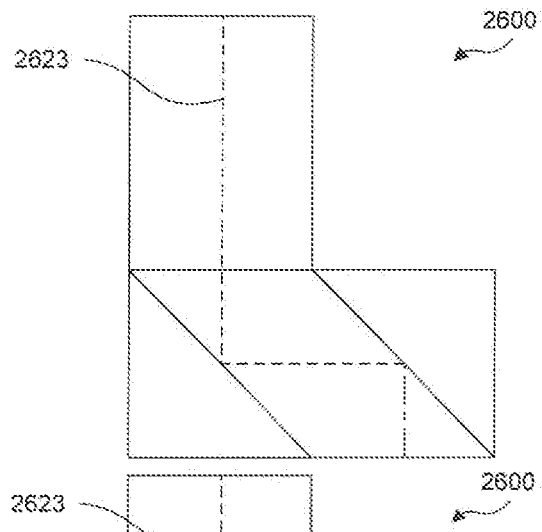
Figure 26C:
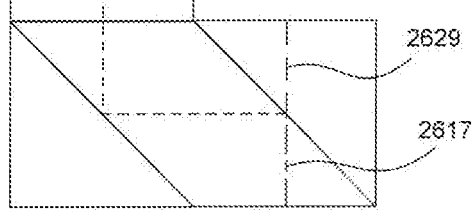

FIGS. 26A-26C illustrate prism system 2600, according to some embodiments of this disclosure. Prism system 2600 includes a plurality of optical elements including polarizing beam splitter surfaces 2615*a* and 2615*b*. FIG. 26A illustrates the input radiation beam 2617 and the optical path of sub-beam 2629, which is transmitted through polarizing beam splitter surface 2615*a*. According to one example, sub-beam 2629 has P polarization orientation at PBS surface 2615*a*. FIG. 26B illustrates the optical path of sub-beam 2623 that is reflected by polarizing beam splitter surfaces 2615*a* and 2615*b* to output from prism system 2600. According to one example, sub-beam 2623 has S polarization orientation at both PBS surfaces 2615*a* and 2615*b*. FIG. 26C illustrates the optical paths for both sub-beams 2623 and 2629. According to some examples, prism system 2600 can achieve a predetermined polarization extinction ratio.

Figure 27A:
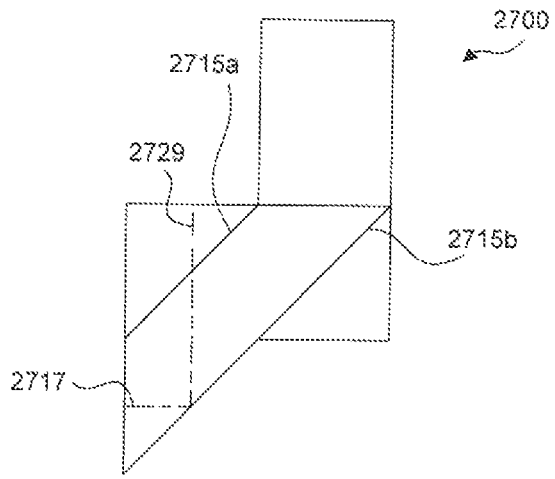
Figure 27B:
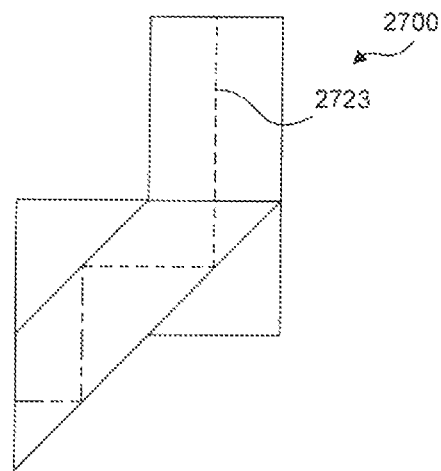
Figure 27C:
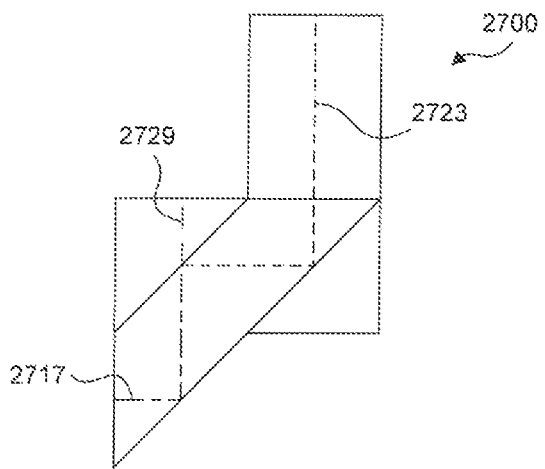

FIGS. 27A-27C illustrate prism system 2700, according to some embodiments of this disclosure. Prism system 2700 includes a plurality of optical elements including polarizing beam splitter surfaces 2715*a* and 2715*b*. FIG. 27A illustrates the input radiation beam 2717 and the optical path of sub-beam 2729, which is transmitted through polarizing beam splitter surface 2715*a*. According to one example, sub-beam 2729 has P polarization orientation at PBS surface 2715*a*. FIG. 27B illustrates the optical path of sub-beam 2723 that is reflected by polarizing beam splitter surfaces 2715*a* and 2715*b* to output from prism system 2700. According to one example, sub-beam 2723 has S polarization orientation at both PBS surfaces 2715*a* and 2715*b*. FIG. 27C illustrates the optical paths for both sub-beams 2723 and 2729. According to some examples, prism system 2700 can achieve a predetermined polarization extinction ratio.

Figure 28A:
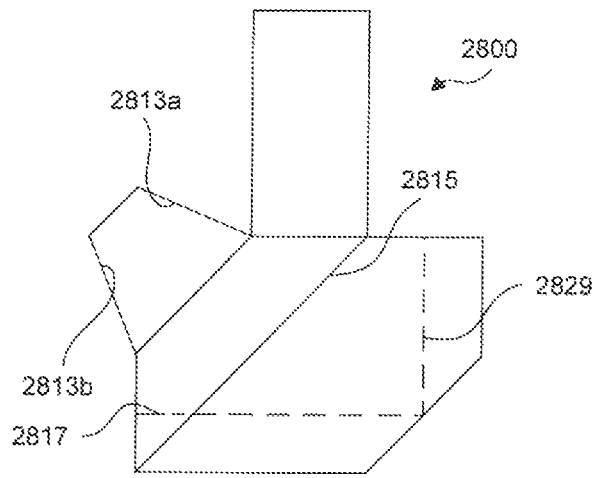
Figure 28B:
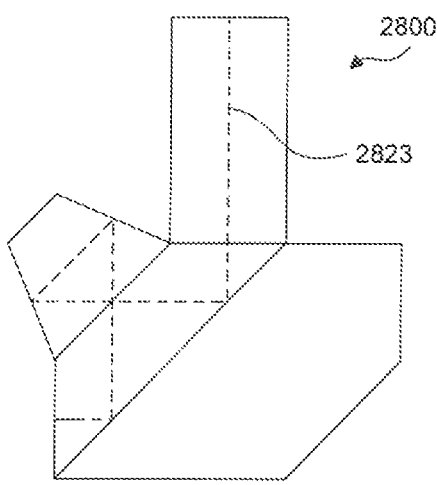
Figure 28C:
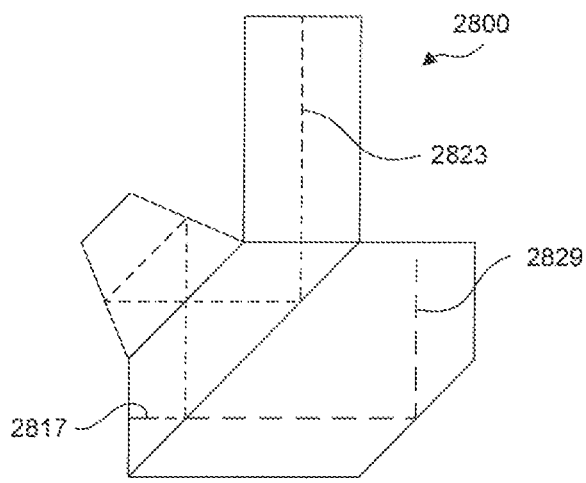

FIGS. 28A-28C illustrate prism system 2800, according to some embodiments of this disclosure. Prism system 2800 includes a plurality of optical elements including polarizing beam splitter surface 2815 and mirror surfaces 2813*a* and 2813*b*. FIG. 28A illustrates the input radiation beam 2817 and the optical path of sub-beam 2829, which is transmitted through polarizing beam splitter surface 2815, is reflected through an optical element of prism system 2800 using, for example, TIR to output from prism system 2800. According to one example, sub-beam 2829 has P polarization orientation at PBS surface 2815. FIG. 28B illustrates the optical path of sub-beam 2823 that is reflected by polarizing beam splitter surface 2815, is reflected by mirror surfaces 2813*a* and 2813*b*, is reflected by PBS surface 2815 to output from prism system 2800. According to one example, sub-beam 2823 at output of prism system 2800 has S polarization orientation at PBS surface 2815. FIG. 28C illustrates the optical paths for both sub-beams 2823 and 2829.

According to some examples, prism system 2800 can be designed with tilted input surface and/or roof-shaped output surfaces (two tilted output surfaces) to mitigate "ghost" reflections. Additionally or alternatively, prism system 2800 can achieve a predetermined polarization extinction ratio.

Figure 29A:
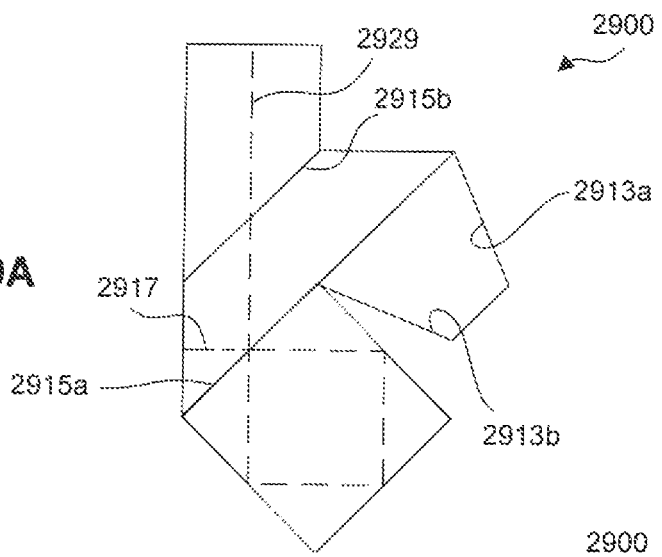
Figure 29B:
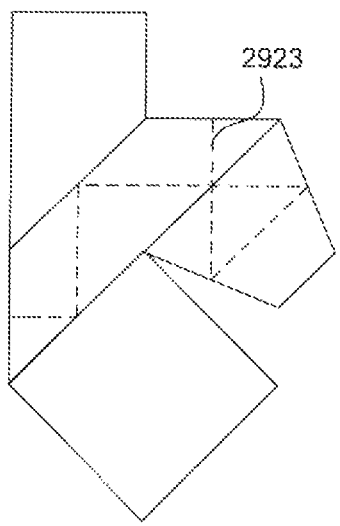
Figure 29C:
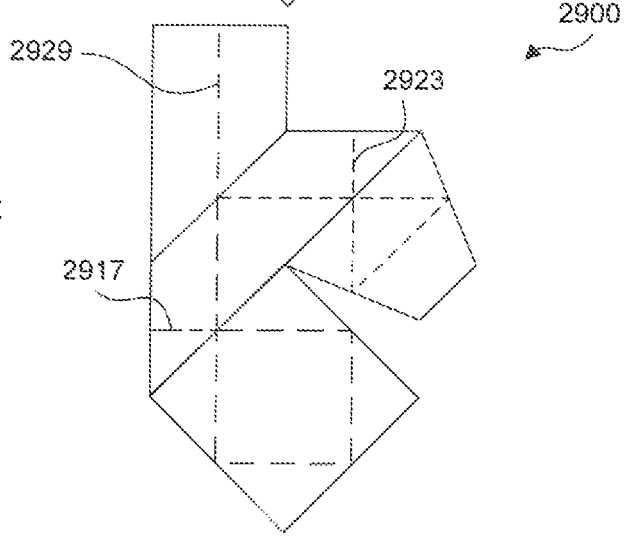

FIGS. 29A-29C illustrate prism system 2900, according to some embodiments of this disclosure. Prism system 2900 includes a plurality of optical elements including polarizing beam splitter surfaces 2915*a* and 2915*b* and mirror surfaces 2913*a* and 2913*b*. FIG. 29A illustrates the input radiation beam 2917 and the optical path of sub-beam 2929, which is transmitted through polarizing beam splitter surface 2915*a*, is reflected through an optical element of prism system 2900 using, for example, TIR, is passed through polarizing beam splitter surfaces 2915*a* and 2915*b* to output from prism system 2900. According to one example, sub-beam 2929 has P polarization orientation at PBS surfaces 2915*a* and 2915*b*. FIG. 29B illustrates the optical path of sub-beam 2923 that is reflected by polarizing beam splitter surfaces 2915*a* and 2915*b*, is reflected by mirror surfaces 2913*a* and 2913*b* to output from prism system 2900. According to one example, sub-beam 2923 has S polarization orientation at PBS surfaces 2915*a* and 2915*b*. FIG. 29C illustrates the optical paths for both sub-beams 2923 and 2929.

According to some examples, prism system 2900 can be designed with tilted input surface and/or roof-shaped output surfaces (two tilted output surfaces) to mitigate "ghost" reflections. Additionally or alternatively, prism system 2900 can achieve a predetermined polarization extinction ratio.

Figure 30A:
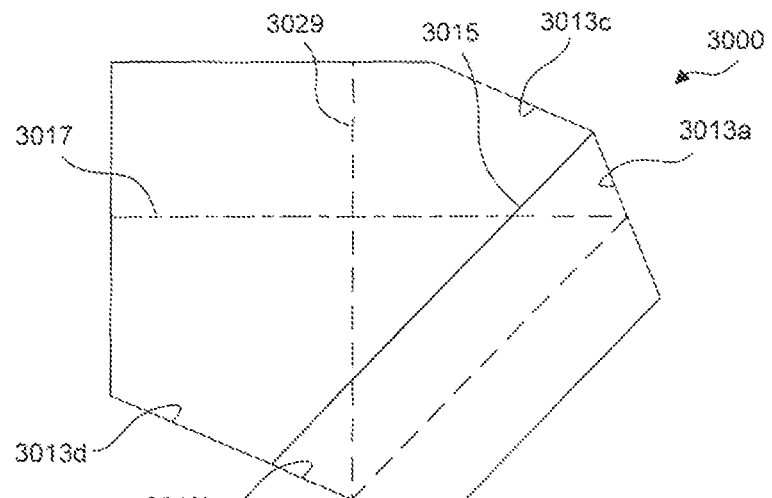
Figure 30B:
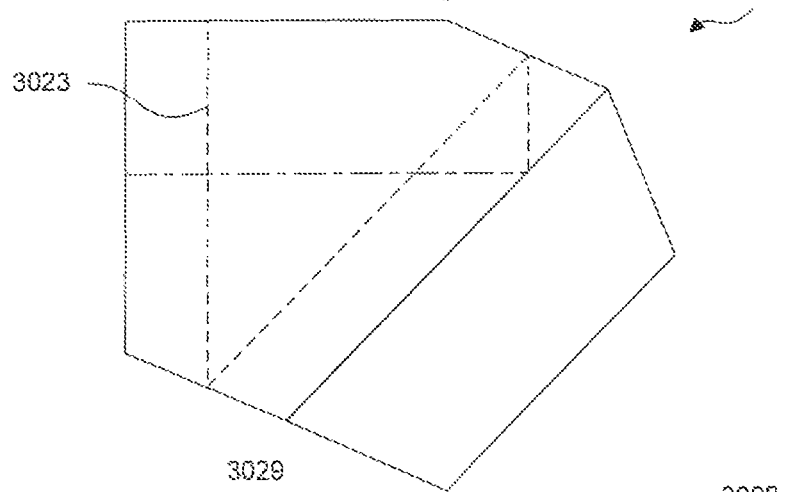
Figure 30C:
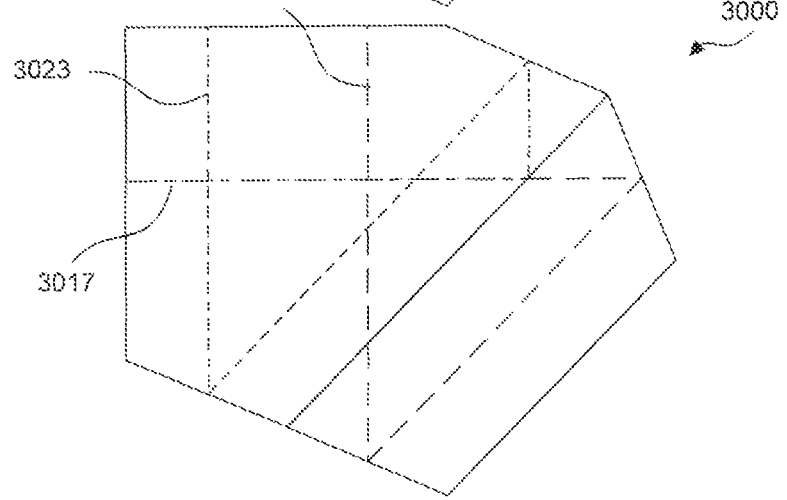

FIGS. 30A-30C illustrate prism system 3000, according to some embodiments of this disclosure. Prism system 3000 includes a plurality of optical elements including polarizing beam splitter surface 3015 and mirror surfaces 3013*a*-3013*d*. FIG. 30A illustrates the input radiation beam 3017 and the optical path of sub-beam 3029, which is transmitted through polarizing beam splitter surface 3015, is reflected by mirror surfaces 3013*a* and 3013*b*, is passed through polarizing beam splitter surface 3015 to output from prism system 3000. According to one example, sub-beam 3029 has P polarization orientation at PBS surface 3015. FIG. 30B illustrates the optical path of sub-beam 3023 that is reflected by polarizing beam splitter surface 3015 and by mirror surfaces 3013*c* and 3013*d* to output from prism system 3000. According to one example, sub-beam 3023 has S polarization orientation at PBS surface 3015. FIG. 30C illustrates the optical paths for both sub-beams 3023 and 3029.

According to some examples, prism system 3000 can be designed with tilted input surface and/or roof-shaped output surfaces (two tilted output surfaces) to mitigate "ghost" reflections. Also, sub-beams 3023 and 3029 can travel the same or substantially the same optical path distances within prism system 3000.

FIGS. 31A-31C illustrate prism system 3100, according to some embodiments of this disclosure. Prism system 3100 includes a plurality of optical elements including polarizing beam splitter surface 3115 and mirror surfaces 3013*a*-3013*c*. FIG. 31A illustrates the input radiation beam 3117 and the optical path of sub-beam 3129, which is transmitted through polarizing beam splitter surface 3115, is reflected by mirror surface 3113*b* to output from prism system 3100. According to one example, sub-beam 3129 has P polarization orientation at PBS surface 3115. FIG. 31B illustrates the optical path of sub-beam 3123 that is reflected by polarizing beam splitter surface 3115 and by mirror surface 3113*c* to output from prism system 3100. According to one example, sub-beam 3123 has S polarization orientation at PBS surface 3115. FIG. 31C illustrates the optical paths for both sub-beams 3123 and 3129.

According to some examples, prism system 3100 can be designed with tilted input surface and/or roof-shaped output surfaces (two tilted output surfaces) to mitigate "ghost" reflections. Also, sub-beams 3123 and 3129 can travel the same or substantially the same optical path distances within prism system 3100.

Figure 32A:
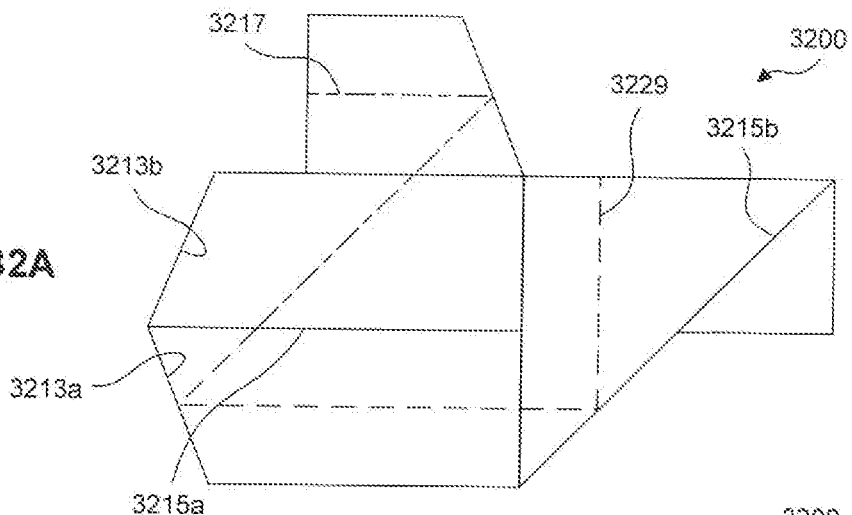
Figure 32B:
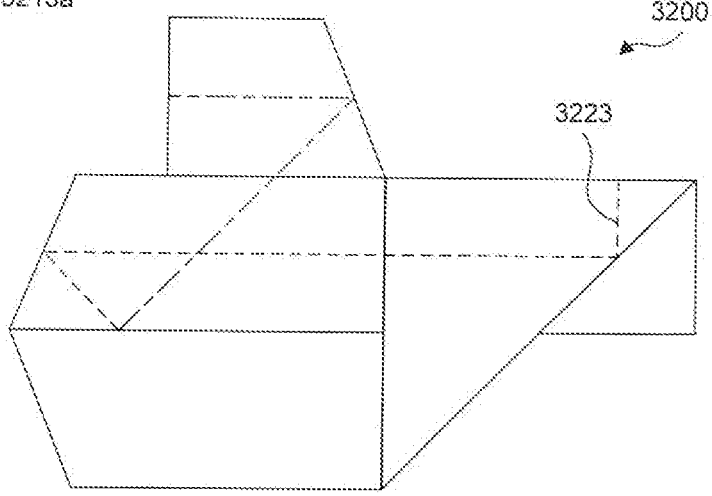
Figure 32C:
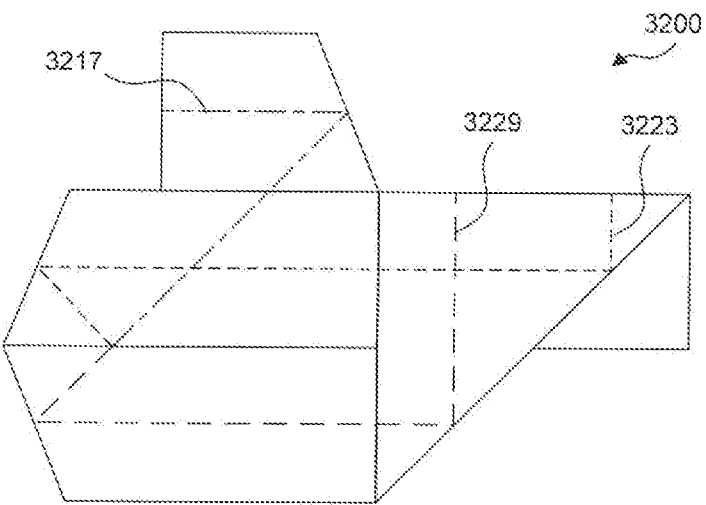

FIGS. 32A-32C illustrate prism system 3200, according to some embodiments of this disclosure. Prism system 3200 includes a plurality of optical elements including polarizing beam splitter surfaces 3215a and 3215b and mirror surfaces 3213a and 3213b. FIG. 32A illustrates the input radiation beam 3217 and the optical path of sub-beam 3229, which is transmitted through polarizing beam splitter surface 3215a, is reflected by mirror surface 3213a, is reflected through an optical element of prism system 3200 using, for example, TIR, to output from prism system 3200. According to one example, sub-beam 3229 has P polarization orientation at PBS surfaces 3215a and 3215b. FIG. 32B illustrates the optical path of sub-beam 3223 that is reflected by polarizing beam splitter surface 3215a, is reflected by mirror surface 3213b, is reflected by PBS 3215b to output from prism system 3200. According to one example, sub-beam 3223 has S polarization orientation at PBS surface 3215a. FIG. 32C illustrates the optical paths for both sub-beams 3223 and 3229.

According to some examples, prism system 3200 can be designed with tilted input surface and/or roof-shaped output surfaces (two tilted output surfaces) to mitigate "ghost" reflections. Additionally or alternatively, prism system 3200 can achieve a predetermined polarization extinction ratio. Also, sub-beams 3223 and 3229 can travel the same or substantially the same optical path distances within prism system 3200.

Figure 33A:
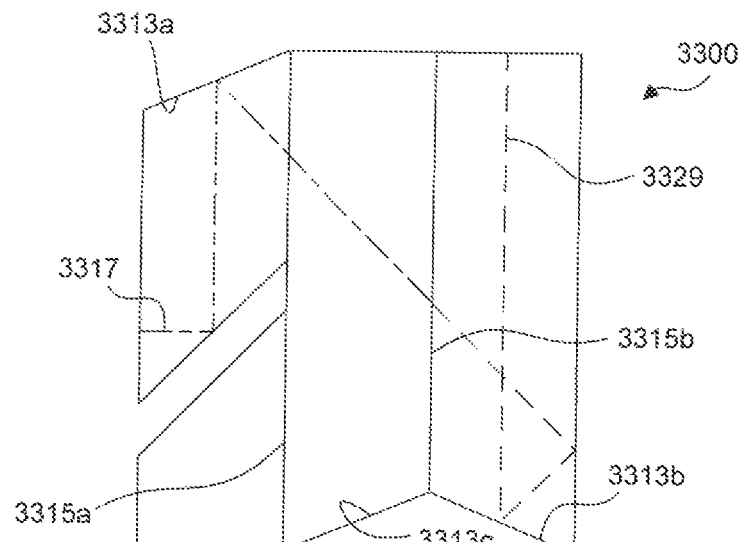
Figure 33B:
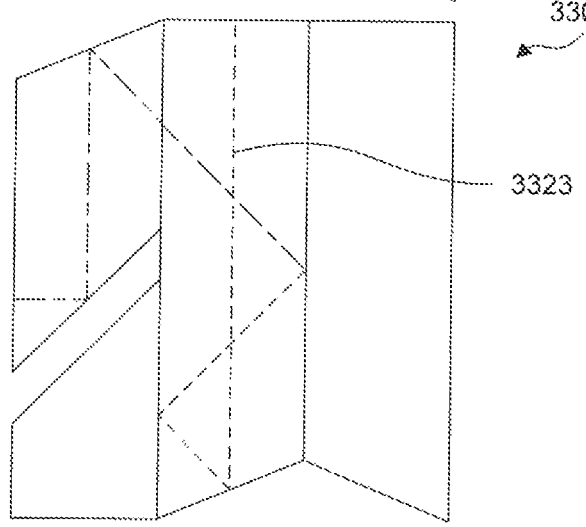
Figure 33C:
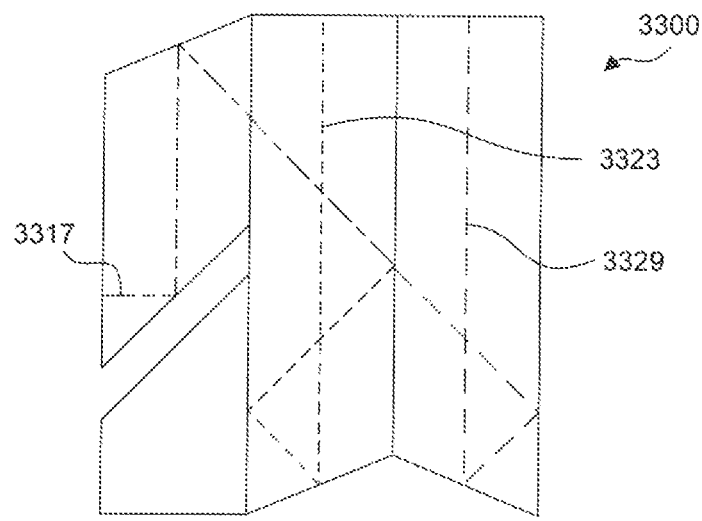

FIGS. 33A-33C illustrate prism system 3300, according to some embodiments of this disclosure. Prism system 3300 includes a plurality of optical elements including polarizing beam splitter surfaces 3315a and 3315b and mirror surfaces 3313a-3313c. FIG. 33A illustrates the input radiation beam 3317 and the optical path of sub-beam 3329, which is transmitted through polarizing beam splitter surface 3315b, is reflected through an optical element of prism system 3300 using, for example, TIR, is reflected by mirror surface 3313b to output from prism system 3300. According to one example, sub-beam 3329 has P polarization orientation at PBS surface 3315b. FIG. 33B illustrates the optical path of sub-beam 3323 that is reflected by polarizing beam splitter surfaces 3315b and then 3315a, is reflected by mirror surface 3213c to output from prism system 3300. According to one example, sub-beam 3323 has S polarization orientation at PBS surfaces 3315b and 3315a. FIG. 33C illustrates the optical paths for both sub-beams 3323 and 3329.

According to some examples, prism system 3300 can be designed with tilted input surface and/or roof-shaped output surfaces (two tilted output surfaces) to mitigate "ghost" reflections. Additionally or alternatively, prism system 3300 can achieve a predetermined polarization extinction ratio. Also, sub-beams 3323 and 3329 can travel the same or substantially the same optical path distances within prism system 3300.

Figure 34A:
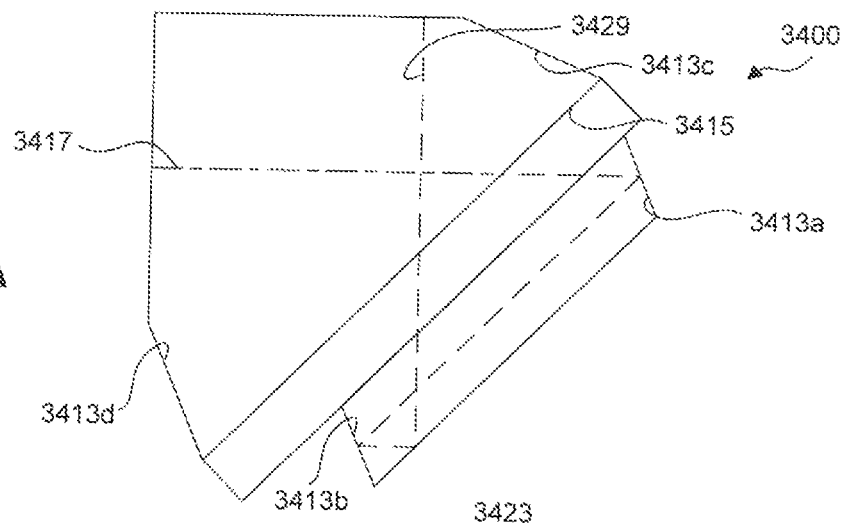
Figure 34B:
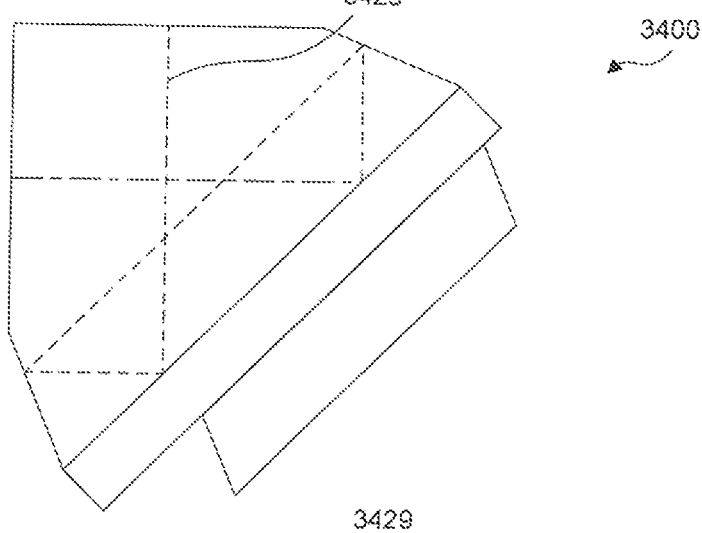
Figure 34C:
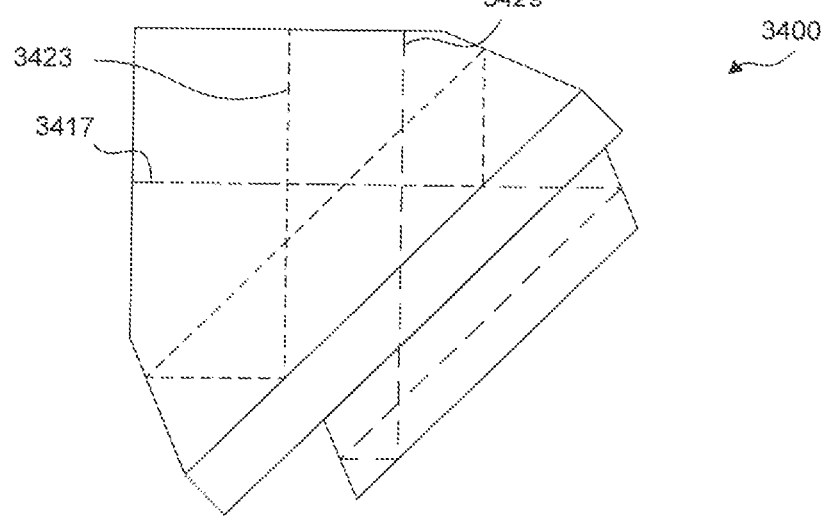

FIGS. 34A-34C illustrate prism system 3400, according to some embodiments of this disclosure. Prism system 3400 includes a plurality of optical elements including polarizing beam splitter surface 3415 and mirror surfaces 3413a-3413d. FIG. 34A illustrates the input radiation beam 3417 and the optical path of sub-beam 3429, which is transmitted through polarizing beam splitter surface 3415, is reflected by mirror surfaces 3413a and 3413b, is reflected through an optical element of prism system 3400 using, for example, TIR, passes through PBS surface 3415 another time to output from prism system 3400. According to one example, sub-beam 3429 has P polarization orientation at PBS surface 3415. FIG. 34B illustrates the optical path of sub-beam 3423 that is reflected by polarizing beam splitter surfaces 3415, mirror surfaces 3413c and 3413d, and then PBS surface 3415 to output from prism system 3400. According to one example, sub-beam 3423 has S polarization orientation at PBS surface 3415. FIG. 34C illustrates the optical paths for both sub-beams 3423 and 3429.

According to some examples, prism system 3400 can be designed with tilted input surface and/or roof-shaped output surfaces (two tilted output surfaces) to mitigate "ghost" reflections. Additionally or alternatively, prism system 3400 can achieve a predetermined polarization extinction ratio. Also, sub-beams 3423 and 3429 can travel the same or substantially the same optical path distances within prism system 3400.

FIGS. 35A-35C illustrate prism system 3500, according to some embodiments of this disclosure. Prism system 3500 includes a plurality of optical elements including polarizing beam splitter surface 3515 and mirror surfaces 3513a-3513d. FIG. 35A illustrates the input radiation beam 3517 and the optical path of sub-beam 3529, which is transmitted through polarizing beam splitter surface 3515, is reflected by mirror surfaces 3513a and 3513b, passes through PBS surface 3515 another time to output from prism system 3500. According to one example, sub-beam 3529 has P polarization orientation at PBS surface 3515. FIG. 35B illustrates the optical path of sub-beam 3523 that is reflected by polarizing beam splitter surfaces 3515, mirror surfaces 3513c and 3513d, and then PBS surface 3515 to output from prism system 3500. According to one example, sub-beam 3523 has S polarization orientation at PBS surface 3515. FIG. 35C illustrates the optical paths for both sub-beams 3523 and 3529.

According to some examples, prism system 3500 can achieve a predetermined polarization extinction ratio. Also, sub-beams 3523 and 3529 can travel the same or substantially the same optical path distances within prism system 3500.

Figure 36A:
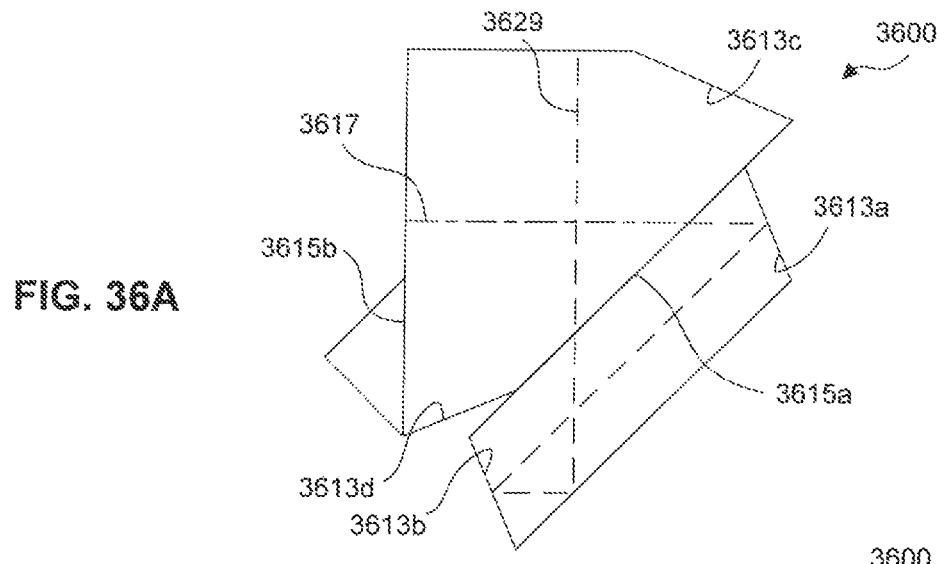
Figure 36B:
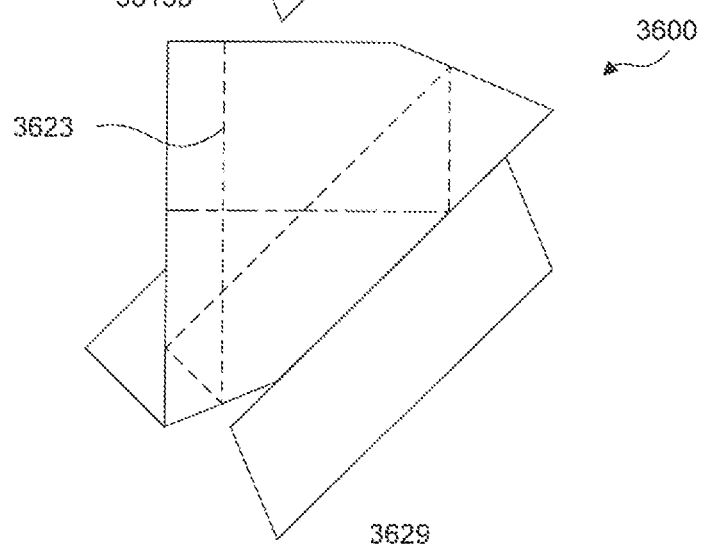
Figure 36C:
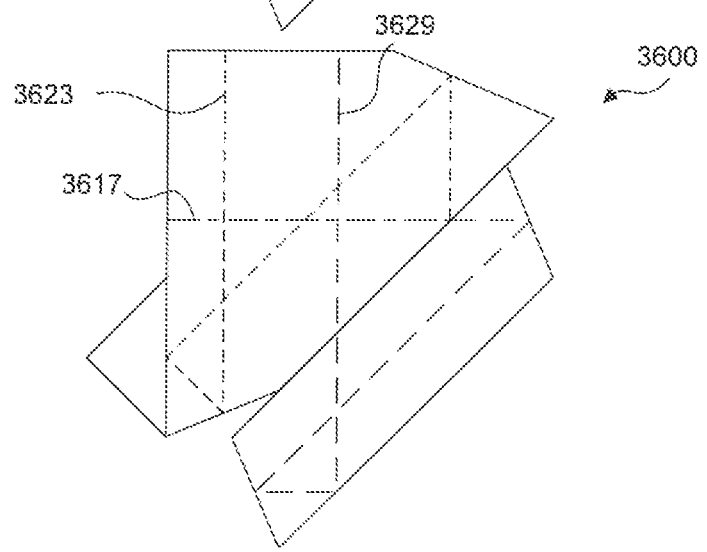

FIGS. 36A-36C illustrate prism system 3600, according to some embodiments of this disclosure. Prism system 3600 includes a plurality of optical elements including polarizing beam splitter surfaces 3615a and 3615b and mirror surfaces 3613a-3613d. FIG. 36A illustrates the input radiation beam 3617 and the optical path of sub-beam 3629, which is transmitted through polarizing beam splitter surface 3615a, is reflected by mirror surfaces 3613a and 3613b, is reflected through an optical element of prism system 3600 using, for example, TIR, passes through PBS surface 3615a another time to output from prism system 3600. According to one example, sub-beam 3629 has P polarization orientation at PBS surface 3615a. FIG. 36B illustrates the optical path of sub-beam 3623 that is reflected by polarizing beam splitter surfaces 3615a, mirror surface 3613c, PBS surface 3615b, and mirror surface 3613d to output from prism system 3600. According to one example, sub-beam 3623 has S polarization orientation at PBS surfaces 3615a and 3615b. FIG. 36C illustrates the optical paths for both sub-beams 3623 and 3629.

According to some examples, prism system 3600 can be designed with tilted input surface and/or roof-shaped output surfaces (two tilted output surfaces) to mitigate "ghost" reflections. Additionally or alternatively, prism system 3600 can achieve a predetermined polarization extinction ratio.

Also, sub-beams 3623 and 3629 can travel the same or substantially the same optical path distances within prism system 3600.

Figure 37A:
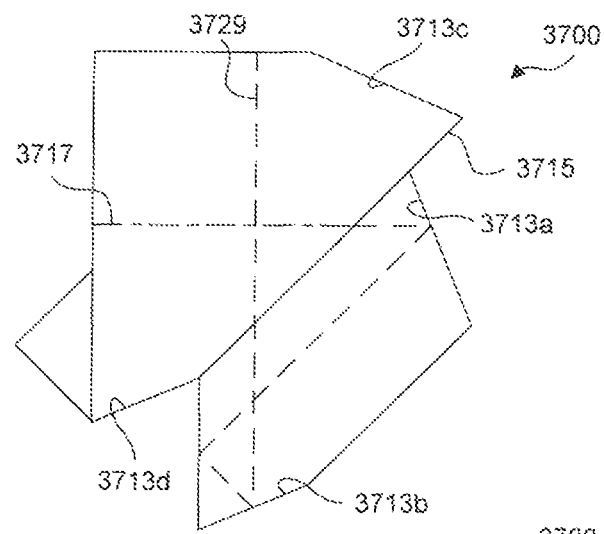
Figure 37B:
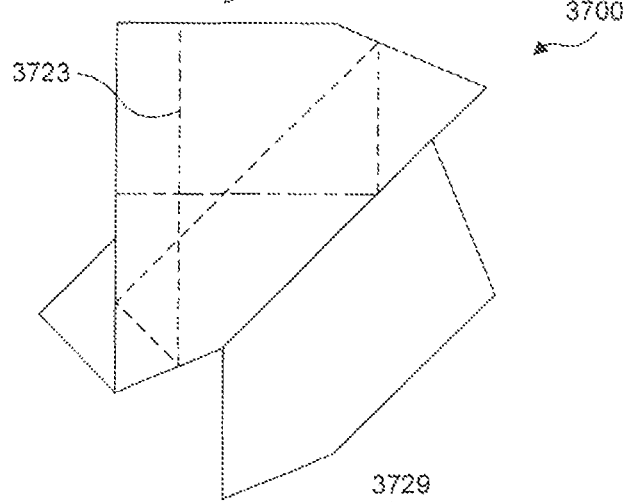
Figure 37C:
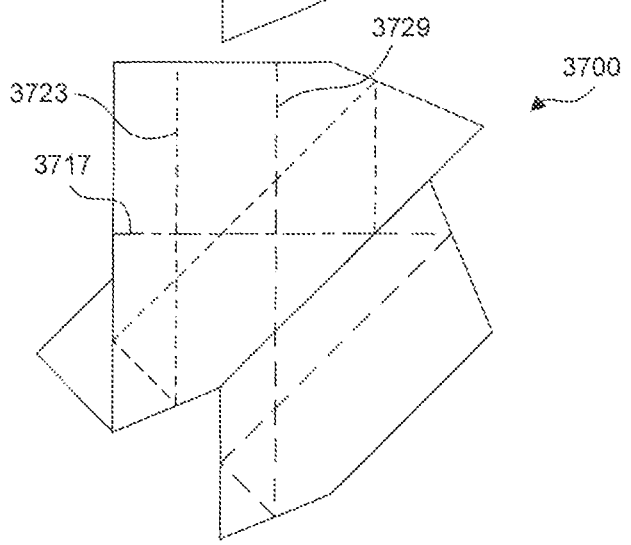

FIGS. 37A-37C illustrate prism system 3700, according to some embodiments of this disclosure. Prism system 3700 includes a plurality of optical elements including polarizing beam splitter surface 3715 and mirror surfaces 3713*a*-3713*d*. FIG. 37A illustrates the input radiation beam 3717 and the optical path of sub-beam 3729, which is transmitted through polarizing beam splitter surface 3715, is reflected by mirror surface 3713*a*, is reflected through an optical element of prism system 3700 using, for example, TIR, is reflected by mirror surface 3713*b*, passes through PBS surface 3715 another time to output from prism system 3700. According to one example, sub-beam 3729 has P polarization orientation at PBS surface 3715. FIG. 37B illustrates the optical path of sub-beam 3723 that is reflected by polarizing beam splitter surfaces 3715, mirror surface 3713*c*, an optical element of prism system 3700 using, for example, TIR, and mirror surface 3713*d* to output from prism system 3700. According to one example, sub-beam 3723 has S polarization orientation at PBS surface 3715. FIG. 37C illustrates the optical paths for both sub-beams 3723 and 3729.

According to some examples, prism system 3700 can be designed with tilted input surface and/or roof-shaped output surfaces (two tilted output surfaces) to mitigate "ghost" reflections. Additionally or alternatively, prism system 3700 can achieve a predetermined polarization extinction ratio. Also, sub-beams 3723 and 3729 can travel the same or substantially the same optical path distances within prism system 3700.

The embodiments may further be described using the following clauses:

1. An apparatus, comprising:
a prism system comprising a polarizing beam splitter (PBS) surface,
wherein the PBS surface is configured to generate first and second sub-beams having corresponding first and second polarization information from a received beam, the second polarization information being different than the first polarization information, and
wherein a first optical path of the first sub-beam within the prism system has substantially same length as a second optical path of the second sub-beam within the prism system, or
the first sub-beam achieves a predetermined polarization extinction ratio.

2. The apparatus of clause 1, wherein the prism system further comprises a prism and a mirror substrate.

3. The apparatus of clause 2, wherein the prism system further comprises a quarter-wave plate (QWP) coupled to the mirror substrate.

4. The apparatus of clause 1, further comprising a detector, wherein the first and second sub-beams are imaged on the detector.

5. The apparatus of clause 4, wherein the prism system is configured to receive at least a portion of a radiation beam reflected from the detector and to reflect the at least a portion of a radiation beam away from the detector.

6. The apparatus of clause 4, wherein the first and second sub-beams are imaged on the detector on a common focal plane.

7. The apparatus of clause 1, wherein the first sub-beam transmits through and reflects from the PBS surface to achieve the predetermined polarization extinction ratio within the prism system.

8. The apparatus of clause 1, wherein the first polarization information comprises vertical (V) polarization information and the second polarization information comprises horizontal (H) polarization information.

9. A lithographic apparatus comprising:
a first illumination optical system configured to illuminate a pattern;
a projection optical system configured to project an image of the pattern onto a substrate; and
a scatterometer configured to determine a parameter of the lithographic apparatus, the scatterometer comprising:
a second illumination optical system configured to deliver at least one beam of radiation;
an objective optical system configured to focus the at least one beam of radiation onto the substrate;
a detector configured to detect a reflected radiation beam from the substrate; and
an apparatus, comprising:
a prism system comprising a polarizing beam splitter (PBS) surface,
wherein the PBS surface is configured generate first sub-beam and second sub-beams having corresponding first and second polarization information from received the at least one beam of radiation or the reflected radiation beam, the second polarization information being different than the first polarization information, and
wherein a first optical path of the first sub-beam within the prism system has substantially same length as a second optical path of the second sub-beam within the prism system, or
the first sub-beam achieves a predetermined polarization extinction ratio.

10. The lithographic apparatus of clause 9, wherein the prism system further comprises a prism and a mirror substrate.

11. The lithographic apparatus of clause 10, wherein the prism system further comprises a quarter-wave plate (QWP) coupled to the mirror substrate.

12. The lithographic apparatus of clause 9, wherein the first and second sub-beams are imaged on the detector.

13. The lithographic apparatus of clause 12, wherein the prism system is configured to receive at least a portion of a radiation beam reflected from the detector and to reflect the at least a portion of a radiation beam away from the detector.

14. The lithographic apparatus of clause 12, wherein the first and second sub-beams are imaged on the detector on a common focal plane.

15. The lithographic apparatus of clause 9, wherein the first sub-beam transmits through and reflects from the PBS surface to achieve the predetermined extinction ratio within the prism system.

16. The lithographic apparatus of clause 9, wherein the first polarization information comprises a vertical (V) polarization information and the second polarization information comprises a horizontal (H) polarization information.

17. A method, comprising:
receiving, by a prism system comprising a polarizing beam splitter (PBS) surface, a radiation beam; and
generating first and second sub-beams having corresponding first and second polarization information from the received radiation beam, the second polarization information being different than the first polarization information,
wherein a first optical path of the first sub-beam within the prism system has substantially same length as a second optical path of the second sub-beam within the prism system, or the first sub-beam achieves a predetermined polarization extinction ratio.

18. The method of clause 17, further comprising:
imaging the first and second sub-beams on a detector.

19. The method of clause 18, further comprising:
receiving at least a portion of a radiation beam reflected from the detector; and
reflecting the at least a portion of a radiation beam away from the detector.

20. The method of clause 17, wherein the first sub-beam transmits through and reflects from the PBS surface to achieve the predetermined extinction ratio within the prism system.

21. A prism system, comprising:
a first optical element comprising first, second, and third surfaces, the second surface of the first optical element comprising a polarizing beam splitter surface;
a second optical element coupled to the first optical element; and
a third optical element coupled to the first optical element, the third optical element comprising a quarter-wave plate (QWP).

22. The prism system of clause 21, wherein:
the second surface of the first optical element is coupled to a first surface of the second optical element; and
the third surface of the first optical element is coupled to the third optical element.

23. The prism system of clause 21, wherein the QWP comprises a QWP polymer stack and the prism system further comprises:
a fourth optical element comprising a mirror substrate coupled to the QWP polymer stack.

24. The prism system of clause 21, wherein the QWP comprises a QWP coating and the third optical element comprises a first surface, the first surface of the third optical element comprising a reflecting surface with the QWP coating over the reflecting surface.

25. The prism system of clause 21, wherein:
the first surface of the first optical element is a tilted surface; and
a first surface and a second surface of the second optical element are tilted surfaces.

26. The prism system of clause 25, wherein a tilt angle of the first surface of the first optical element is substantially same as a tilt angle of the first surface of the second optical element and a tilt angle of the second surface of the second optical element.

27. The prism system of clause 21, wherein:
the first surface of the first optical element is configured to receive a radiation beam; and
two sub-beams generated from the radiation beam are configured to leave the prism system from a first surface and a second surface of the second optical element.

28. The prism system of clause 27, wherein the two sub-beams have different polarization information.

29. The prism system of clause 27, wherein the two sub-beams are imaged on a detector.

30. The prism system of clause 29, wherein the prism system is configured to receive at least a portion of radiation beams reflected from the detector and to reflect the received at least a portion of radiation beams away from the detector.

31. The prism system of clause 29, wherein a tilt angle of a first surface of the second optical element and a tilt angle of a second surface of the second optical element is determined based on a distance between the prism system and the detector.

32. The prism system of clause 27, wherein the two sub-beams have substantially same optical path lengths within the prism system.

33. A lithographic apparatus, comprising:
a first illumination optical system configured to illuminate a pattern;
a projection optical system configured to project an image of the pattern onto a substrate; and
a scatterometer configured to determine a parameter of the lithographic apparatus, the scatterometer comprising:
a second illumination optical system configured to deliver at least one beam of radiation;
an objective optical system configured to focus the at least one beam onto the substrate;
a detector configured to detect a reflected radiation beam from the substrate; and
a prism system, comprising:
a first optical element comprising first, second, and third surfaces, the second surface of the first optical element comprising a polarizing beam splitter surface;
a second optical element coupled to the first optical element; and
a third optical element coupled to the first optical element, the third optical element comprising a quarter-wave plate (QWP).

34. The lithographic apparatus of clause 33, wherein:
the second surface of the first optical element is coupled to a first surface of the second optical element; and
the third surface of the first optical element is coupled to the third optical element.

35. The lithographic apparatus of clause 33, wherein the QWP comprises a QWP polymer stack and the prism system further comprises:
a fourth optical element comprising a mirror substrate coupled to the QWP polymer stack.

36. The lithographic apparatus of clause 33, wherein the QWP comprises a QWP coating and the third optical element comprises a first surface, the first surface of the third optical element comprising a reflecting surface with the QWP coating over the reflecting surface.

37. The lithographic apparatus of clause 33, wherein:
the first surface of the first optical element is a tilted surface; and
a first surface and a second surface of the second optical element are tilted surfaces.

38. The lithographic apparatus of clause 37, wherein a tilt angle of the first surface of the first optical element is substantially same as a tilt angle of the first surface of the second optical element and a tilt angle of the second surface of the second optical element.

39. The lithographic apparatus of clause 33, wherein:
the first surface of the first optical element is configured to receive the at least one beam of radiation or the reflected radiation beam from the substrate; and
two sub-beams generated from the at least one beam of radiation or the reflected radiation beam from the substrate are configured to leave the prism system from a first surface and a second surface of the second optical element.

40. The lithographic apparatus of clause 39, wherein the two sub-beams have different polarization information.

41. The lithographic apparatus of clause 39, wherein the two sub-beams are imaged on the detector.

42. The lithographic apparatus of clause 41, wherein the prism system is configured to receive at least a portion of radiation beams reflected from the detector and to reflect the received at least a portion of radiation beams away from the detector.

43. The lithographic apparatus of clause 41, wherein a tilt angle of a first surface of the second optical element and a tilt angle of a second surface of the second optical element is determined based on a distance between the prism system and the detector.

44. The lithographic apparatus of clause 39, wherein the two sub-beams have substantially same optical path lengths within the prism system.

It is noted that although example designs are discussed in this disclosure, the embodiments of this disclosure are not limited to these examples. For example, the embodiments of this disclosure include any combination of the exemplary designs discussed.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present specification is to be interpreted by those skilled in relevant art(s) in light of the teachings herein.

Further, the terms "radiation" and "beam" used herein encompass all types of electromagnetic radiation, including ultraviolet (UV) radiation (for example, having a wavelength λ of 365, 248, 193, 157 or 126 nm), extreme ultraviolet (EUV or soft X-ray) radiation (for example, having a wavelength in the range of 5-20 nm such as, for example, 13.5 nm), or hard X-ray working at less than 5 nm, as well as particle beams, such as ion beams or electron beams. Generally, radiation having wavelengths between about 400 to about 700 nm is considered visible radiation; radiation having wavelengths between about 780-3000 nm (or larger) is considered IR radiation. UV refers to radiation with wavelengths of approximately 100-400 nm. Within lithography, the term "UV" also applies to the wavelengths that can be produced by a mercury discharge lamp: G-line 436 nm; H-line 405 nm; and/or, I-line 365 nm. Vacuum UV, or VUV (i.e., UV absorbed by gas), refers to radiation having a wavelength of approximately 100-200 nm. Deep UV (DUV) generally refers to radiation having wavelengths ranging from 126 nm to 428 nm, and in an embodiment, an excimer laser can generate DUV radiation used within a lithographic apparatus. It should be appreciated that radiation having a wavelength in the range of, for example, 5-20 nm relates to radiation with a certain wavelength band, of which at least part is in the range of 5-20 nm.

The term "substrate" as used herein generally describes a material onto which subsequent material layers are added. In embodiments, the substrate itself may be patterned and materials added on top of it may also be patterned, or may remain without patterning.

The term "lens", where the context allows, may refer to any one or combination of various types of optical components, including refractive, reflective, magnetic, electromagnetic and electrostatic optical components.

It should be understood that relative spatial descriptions between one or more particular features, structures, or characteristics used herein are for purposes of illustration only, and that practical implementations of the structures described herein may include misalignment tolerances without departing from the spirit and scope of the present disclosure.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The invention claimed is:

1. An apparatus, comprising:
 a prism system comprising:
  a polarizing beam splitter (PBS) surface,
   wherein the PBS surface is configured to generate first and second sub-beams having corresponding first and second polarization information from a received beam, the second polarization information being different than the first polarization information, and
   wherein a length of an optical path of the first sub-beam within the prism system is the same as a length of an optical path of the second sub-beam within the prism system; and
 a detector, wherein the first and second sub-beams are imaged on the detector.

2. The apparatus of claim 1, wherein the prism system further comprises a prism and a mirror substrate.

3. The apparatus of claim 2, wherein the prism system further comprises a quarter-wave plate (QWP) coupled to the mirror substrate.

4. The apparatus of claim 1, wherein the prism system is configured to receive at least a portion of a radiation beam reflected from the detector and to reflect the at least a portion of a radiation beam away from the detector.

5. The apparatus of claim 1, wherein the first and second sub-beams are imaged on the detector on a common focal plane.

6. The apparatus of claim 1, wherein the first sub-beam transmits through and reflects from the PBS surface to achieve a predetermined polarization extinction ratio within the prism system.

7. The apparatus of claim 1, wherein the first polarization information comprises vertical (V) polarization information and the second polarization information comprises horizontal (H) polarization information.

8. A lithographic apparatus comprising:
 a first illumination optical system configured to illuminate a pattern;
 a projection optical system configured to project an image of the pattern onto a substrate; and
 a scatterometer configured to determine a parameter of the lithographic apparatus, the scatterometer comprising:
  a second illumination optical system configured to deliver at least one beam of radiation;
  an objective optical system configured to focus the at least one beam of radiation onto the substrate;
  a detector configured to detect a reflected radiation beam from the substrate; and
  an apparatus, comprising:
   a prism system comprising:
    a polarizing beam splitter (PBS) surface,
     wherein the PBS surface is configured generate first and second sub-beams having corresponding first and second polarization information from received the at least one beam of radiation or the reflected radiation beam, the second polarization information being different than the first polarization information, and
     wherein a length of an optical path of the first sub-beam within the prism system is the same as a length of an optical path of the second sub-beam within the prism system, and
    wherein the first and second sub-beams are imaged on the detector.

9. The lithographic apparatus of claim 8, wherein the prism system further comprises a prism and a mirror substrate.

10. The lithographic apparatus of claim 9, wherein the prism system further comprises a quarter-wave plate (QWP) coupled to the mirror substrate.

11. The lithographic apparatus of claim 8, wherein the prism system is configured to receive at least a portion of a radiation beam reflected from the detector and to reflect the at least a portion of a radiation beam away from the detector.

12. The lithographic apparatus of claim 8, wherein the first and second sub-beams are imaged on the detector on a common focal plane.

13. The lithographic apparatus of claim 8, wherein the first sub-beam transmits through and reflects from the PBS surface to achieve a predetermined extinction ratio within the prism system.

14. The lithographic apparatus of claim 8, wherein the first polarization information comprises vertical (V) polarization information and the second polarization information comprises horizontal (H) polarization information.

15. The apparatus of claim 1, wherein the first sub-beam achieves a predetermined polarization extinction ratio after being transmitted through the PBS twice.

16. A lithographic apparatus comprising the apparatus of claim 1.

* * * * *

UNITED STATES PATENT AND TRADEMARK OFFICE
CERTIFICATE OF CORRECTION

PATENT NO. : 10,747,010 B2
APPLICATION NO. : 16/217424
DATED : August 18, 2020
INVENTOR(S) : Cappelli et al.

Page 1 of 1

It is certified that error appears in the above-identified patent and that said Letters Patent is hereby corrected as shown below:

In the Claims

In Column 40, Line 11, please replace "configured generate" with – configured to generate –.

Signed and Sealed this
Seventeenth Day of November, 2020

Andrei Iancu
*Director of the United States Patent and Trademark Office*